United States Patent [19]

DeJohn et al.

[11] 4,053,752

[45] Oct. 11, 1977

[54] ERROR RECOVERY AND CONTROL IN A MASS STORAGE SYSTEM

[75] Inventors: Patrick Fred DeJohn, Dallas, Tex.; Charles Edwin Hoff, Longmont, Colo.; Robert Douglas Tennison, Boulder, Colo.; James Clair Young, Jr., Broomfield, Colo.

[73] Assignee: International Business Machines Corporation, Armonk, N.Y.

[21] Appl. No.: 613,592

[22] Filed: Sept. 15, 1975

[51] Int. Cl.[2] ........................ G11C 29/00; G06F 11/04

[52] U.S. Cl. .............................. 235/302.1; 235/302.3; 364/200

[58] Field of Search ................ 235/153 AK, 153 AM; 340/172.5, 146.1 A X; 444/1

[56] References Cited

U.S. PATENT DOCUMENTS

| | | | |
|---|---|---|---|
| T429,303 | 12/1973 | Kruskal | 235/153 AM |
| T932,005 | 3/1975 | Kruskal | 235/153 AM |

OTHER PUBLICATIONS

Cloud, S. P. et al., Error Recovery Procedure for Magnetic Tape Transport Failure, in IBM, Tech. Disc. Bull. 18(2): pp. 320–324, July, 1975.

Waddell, J. M. et al., Enhanced Error Recovery in a Virtually Addressed System Employing Implied Reserve of Real Units, in IBM Tech. Disc. Bull. 18(2): pp. 314–315, July, 1975.

Austin, P. C. et al., Error Frequency Warning Detector on Storage with ECC in IBM Tech. Disc. Bull. 12(6): p. 895, Nov. 1969.

*Primary Examiner*—R. Stephen Dildine, Jr.

*Attorney, Agent, or Firm*—Herbert F. Somermeyer

[57] ABSTRACT

A virtually addressed multilevel mass storage system (MSS) has error recovery and definition procedures and apparatus for controlling and enabling recovery from error conditions in an upper storage level. A plurality of possible error conditions in an upper level gives rise to errors in destaging data signals to a lower level, plus possible overwriting good data with data in error. A first such error condition is a data error detected during a destage. A second such error condition is repeated upper-level equipment (not data) errors. Both errors make data integrity of the lower-level suspect. Corrective action for a plurality of errors includes coordination with a host computer, reconfiguration, destaging data in error after precautionary steps, and preserving data in error at the failing upper level unit which is used in virtual mode except for the portion yielding the error condition.

11 Claims, 73 Drawing Figures

ERROR RECOVERY PROCEDURE

QCB CLEANUP

FIG.8 DESTAGE RESTART

FIG. 10 QCB RESTART

QV495

QV496

QV497

QV498

QS978

QV499

QS960

QS963

QS964

QS965

QS968

QS970

QS973

QS975

QS980

QS983

QS985

QS988

QS990

QS993

QS998

QS995

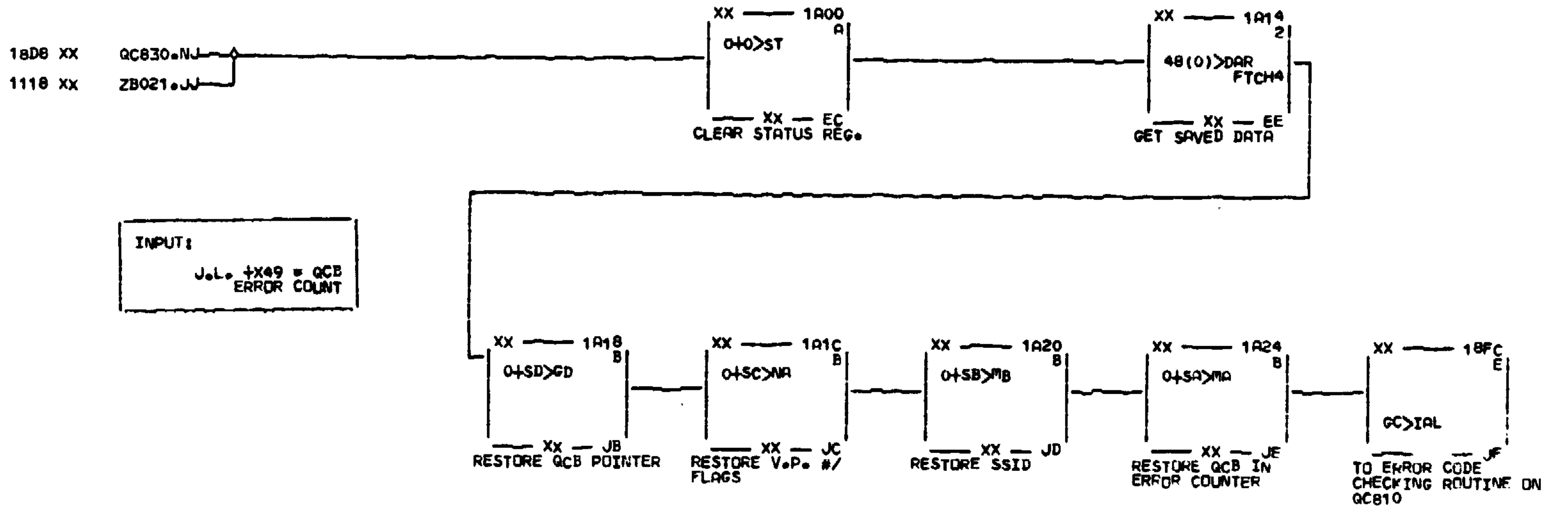

| ENTRY POINT SEQUENCE | | |
|---|---|---|
| DATA CHECK | 1ST. EQU CHECK | 2ND. EQU CHECK |
| 00 READ DSQ | 00 SEE DATA CK | 00 SEE DATA CK |
| 10 ERROR TEST | 10 ' ' ' | 10 ' ' ' |
| 14 RESET WRITN | 14 ' ' ' | 44 MARK PAGE ' |
| 18 ' ' | 18 ' ' ' | 48 RELEASE |
| 20 DATA CK SWIT | 20 MSG 95 | 4C ' |
| 44 MARK PAGE | 24 VARY NEUTRAL | 40 MESSAGE 96 |
| 48 RELEASE | 30 EXIT(*) | 50 QCB RESTART |
| 4C ' | E0 SCAN 2-N | F0 EXIT(*) |
| 40 MESSAGE 96 | | E0 SCAN 2-N |
| 50 QCB RESTART | | |
| F0 EXIT(*) | | |
| E0 SCAN 2-N | | |

(*)-CONTINUE TO NEXT ENTRY ONLY IF ERROR COUNT IS NOT ZERO.

FORMAT OF SAVE AREA AT 4800

| ERROR COUNT | SSID | VIRT PG/ FLAGS | QCB POINTER |
|---|---|---|---|

| ENTRY | PAGE/BLOCK | DESCRIPTION |
|---|---|---|
| 00 | QC820.EB | SCAN FOR & READ ERROR DSQ |
| 10 | QC840.EB | SCAN ERROR DSQ FOR RESTART TYPE- DSTG W/ERR OR MSG ONLY |
| 14 | QC920.LB | DSQ WRITTEN W/CYL MODIFIED SETUP TO RESET WRITTEN (SA1) |
| 18 | QC920.QB | RESET WRITTEN ON SA2 |
| 20 | QC930.LA | BUILD AND WRITE MESSAGE 95 BEGIN DATA CHECK PATH |
| 24 | QC930.EB | CALL VARY OFF NEUTRAL |
| 40 | QC850.CA | BUILD AND WRITE MESSAGE 96 |
| 44 | QC850.AC | CALL MARK PAGE IN ERROR |
| 48 | QC870.GA | RELEASE UNIT IN ERROR ON SA1 |
| 4C | QC870.LA | RELEASE UNIT IN ERROR ON SA2 |
| 50 | QC890.EB | CALL DASD QCB WAKE-UP |
| 30 | QC900.GA | DEC. ERROR COUNT/ EXIT |
| F0 | QC820.CB | BEGIN QCB SCAN 2-N |
| F0 | QC900.EB | DEC. ERROR COUNT/ EXIT |

GENERAL ENTRY POINTS FOR DESTAGE RESTART

ERROR RECOVERY AND CONTROL IN A MASS STORAGE SYSTEM

DOCUMENTS INCORPORATED BY REFERENCE

Burke et al U.S. Pat. No. 2,941,738 is incorporated for it showing of the fundamental concept of an automated record tape storage and retrieval apparatus for attachment to a computer.

Beach et al U.S. Pat. No. 3,831,197 is incorporated for its showing of the enhanced concepts of record media automatic storage and retrieval and particularly the connections in a multicomputer environment.

U.S. Pat. Nos. 3,834,559, 3,833,280, 3,825,208, 3,584,284, 3,626,385, 3,834,559, 3,749,993, 3,854,605, 3,808,045, and 3,845,604 are all cited for preferred implementations of the record media storage and retrieval apparatus shown in U.S. Pat. No. 3,831,197 above.

U.S. Pat. Nos. 3,840,894, 3,900,891, 3,864,739, 3,845,500, 3,122,332, 3,057,569, and 3,850,358 are incorporated to show preferred constructions of a DRD recorder unit referred to herein.

Copending, commonly assigned application U.S. Pat. No. 3,913,068, and U.S. Pat. Nos. 3,641,526, 3,810,111, 3,500,328, 3,475,725, 3,877,027, and 3,864,583 are cited for circuits usable to construct a DRC unit referred to herein.

A DASD (disk) drive or spindle apparatus preferred to be used in practicing the present invention is shown in U.S. Pat. Nos. 3,503,060, 3,534,344, 3,576,454, 3,577,191, 3,579,213, 3,602,828, 3,609,562, 3,610,050, 3,155,949, and 3,356,934.

A DASD controller preferred to be used with the present invention is shown collectively in U.S. Pat. Nos. 3,500,328, 3,303,476, 3,299,410, 3,299,411, 3,408,631, and 3,629,860.

Staging mass memory configurations with which the present invention may be advantageously practiced includes those shown in U.S. Pat. Nos. 3,217,298, 3,218,611, 3,670,307, and 3,670,309. It is preferred that the latter two patents be utilized.

A mass storage control (MSC) can be constructed generally in accordance with U.S. Pat. No. 3,400,372; specific constructional features are set forth in the description.

Glossary

A — A-bus, an input to ALU (supra).
AASM — A-bus assembly circuits for ALU.
A-box — DASD controller 15.
ACR — Address Compare Register.
Active Volume — Mass storage volume stored in MSF and available for mounting.
ADDRO — Address Out.
ADR — Address.
ALU — Arithmetic Logic Unit.
AMR — Address Mask Register.
ASQ — Active Schedule Queue.
B — B-Bus, input to ALU (supra).
BASM — B-Bus Assembly circuits for ALU.
BLK — Block.
BOPAR — Bus Out Parity.
BR — Branch Register in computer 20; contains signals on which conditional branches in microprograms can be based.
BTRDY — Byte Ready.
CA — An instruction word field.
CAR — Cylinder Address Register.
CARRY — Field of microinstruction related to branch on high.
CB — An instruction word field.
CC — Cylinder identification in a disk spindle.
CCHH — Cylinder and head identification in a disk spindle.
CD — An instruction word field.
CE — An instruction word field.
CH — Field of microinstruction related to branch on high.
CHANB — Channel.
CHK — Check.
CHL — Channel.
CHR — Cylinder, Head, Record identification.
CK — Multipurpose field of microinstruction; can be a constant.
CL — Field of microinstruction related to branch on low.
COMMO — Communication.
CPU — Central Processing Unit.
CTOC — Cartridge Table Of Contents.
CS — An instruction word field.
CU — Control Unit.
CUEND — Control Unit End.
CV — An instruction word field.
CW — An instruction word field.
CX — An instruction word field.
CYL — Cylinder; all circular record tracks in a DASD unit having the same radius.
D — D-Bus, output of ALU (supra).
DAR — Data Address Register in computer 20.
DASD — Direct Access Storage Device; a disk storage unit as shown in Goddard et al U.S. Pat. No. 3,503,060.
DASDERASE — An attribute of a mass storage volume that causes binary zeroes to be written on staging drive after data from mass storage volume has been destaged.
Data Cartridge — Storage medium of MSS.
DE — Device End.
DEQ — Dequeue.
DIR — Director.
Director — Direct Access Storage Device DASD control unit in the mass storage system that controls the transfer of data during staging and destaging operations.
DISP — Dispatcher.
DNSTZ1 — Field of microinstruction related to branch on high.
DR — Destage Read; a message from MSC 17 to director 16 to read from a DASD spindle 14.
DRC — Data Recording Control; component of MSF that controls DRD's, encodes and decodes data, and assists with error recovery.
DRD — Data Recording Device; unit in MSF which reads and writes data on the cartridge tape.
DRV — Drive/driver.
DSQ — DASD Schedule Queue; list of pages to be moved from DASD to MSF.
DSTG — Destage; move data from a stage drive to mass storage volume.
DXFER — Data Transfer.
ECB — Event Control Block.
ECC — Error Correction Code.
ENQ — Enqueue.
EO — Emergency Off.
ERP — Error Recovery Procedure.

EXT — External.
FCN — Function.
FF — Maximum two-digit hexadecimal value.
FM — Microprogram instruction word field.
FMT — Format
F/S — Fetch/Store.
FTCH — Fetch.
GA — Microprogram general purpose register.
GB — Microprogram general purpose register.
GC — Microprogram general purpose register.
GD — Microprogram general purpose register.
GE — Microprogram general purpose register.
GF — Microprogram general purpose register.
GP — General Purpose.
Group — Staging drive group.
HDR — Header; a set of control signals.
HI — High
HLTIO — Halt Input Output; command that stops I/O operations.
IAL — Lower-ordered byte portion of IAR.
IAR — Instruction Address Register in computer 20 (two bytes).
ID — Identification.
ILXEQ — In-Line Execute.
IML — Initial Microprogram Load; action of loading a microprogram into control 17 or director 16.
IMPL — Initial Microprogram Load.
INDEX — Offset/pointer.
INLIN — In-Line.
I/O — Input/Output.
IOC — Inout/Output Control — a program.
IORB — Input/Output Request Block.
IORC — Input/Output Return Code.
IOS — Input/Output System — a program.
JL — Job List (intra); part of scheduler which contains ID of all "jobs" or programs to be invoked.
JLS — Job List Scheduler.
Journal Data Set — Mass storage volume control journal data set.
Journaling — Recording transactions against a data set so that the data set can be reconstructed by applying the transactions in the journal against a previous version of the data set.
K — Constant.
KK — Microprogram instruction word field.
LIB — Mass storage facility 10
LRU — Least Recently Used; an algorithm that determines the order in which active stages pages must be destaged. The algorithm makes sure that the staging drive group always has the amount of allocatable space defined by the space manager.
LTR — Logical To Real; a program table.
LUA — Logical Unit Address; an address of a DASD spindle 14 used by host computer 19 which has a virtual address translated by MSS to the actual units.
LXYZ — Address in MSF; L is tape library number, X is horizontal storage cell address, Y is vertical storage cell address, and Z is the storage wall number in a library.
MA — Microprogram general purpose register.
Mass Storage Volume — A direct access storage volume residing on two associated data cartridges of MSF 10.
MB — Microprogram general purpose register.
MC — Microprogram general purpose register.
MD — Microprogram general purpose register.
ME — Microprogramming register.
MF — Microprogram general purpose register.
MH — An instruction word field.
MINI — Miniheader; a set of control signals.
ML — An instruction word field.
MPL — Microprogram Load.
MSC — Mass Storage Control; a microprogrammed portion of the mass storage facility that passes information to the accessor control and controls data and space on staging drives.
MSF — Mass Storage Facility; the component of a mass storage system that contains the storage media and the facilities for accessing it.
MSG — Message.
MSS — Mass Storage System; the name for the entire storage system consisting of the mass storage facility and all devices that are defined to the mass storage control.
MSSC — Mass Storage System Communicator; a program in a CPU that handles communication between system control programs (VS/370) and the mass storage control. The mass storage volume control functions are an integral part of the mass storage system communicator.
MVT — Mount Volume Table; a set of control registers in control 17 identifying volumes logically mounted on DASD.
NA — Microprogram general purpose register.
NB — Microprogram general purpose register.
NC — Microprogram general purpose register.
ND — Microprogram general purpose register.
NL — Instruction word field.
Nonstaging Drive — Real Drive.
OP — Operation code of an instruction word.
OS/VS — Control program in a host that operates in a virtual mode.
Page — Eight radially contiguous DASD cylinders.
PARMS — Parameters.
PASANO — Program module to pass control from service module to service module.
Path — Hardware connection known to the operating system that permits the movement of data signals within the hardware.
PGM — Program.
PH — Primary Host.
PLO — Phase Lock Oscillator.
Primary CPU — The CPU in a multi-CPU system configuration that has the responsibility of processing unsolicited messages from the MSC.
PST — Page Status Table in director 16.
PTR — Pointer; a set of control signals identifying location of signals "pointed to." The pointer may be a memory address, offset of a table in memory, register location, etc.
QCB — Queue Control Block; a set of control signals necessary for storage control 17 to execute a queue of tasks or functions.
RAS — Reliability, Availability, and Serviceability.
Real Drive — A drive attached to director 16.
REG — Register.
REL — Release.
RP — Real Page.
RSG — Real Spindle Group Number; address of DASD controller 15.
R/W — Read/Write.
SA — Depending on context — a microprogram general purpose register or Staging Adapter, a portion of director 16 for automatically and independently moving data signals between DASD units 14 and 15 and DRD's.

SB — Microprogram general purpose register.
S/B — Sense Byte.
SC — Microprogram general purpose register.
SCHED — Scheduler.
SD — Microprogram general purpose register.
SDG — Staging Drive Group; a collection of staging spindles for space management and recovery.
SECTR — Sector.
SELTD — Selected.
SERDES — Serializer-Deserializer.
SNS — Sense.
Solicited Message — A message from the Mass Storage Control to the CPU that is expected by the CPU.
Sp Op — Special Operation.
SSID — Subsystem Identification; identification on each device or unit in the MSS.
ST — Status register in computer 20.
Stage — To move data from a data cartridge to a staging DASD spindle.
Staging Drive — A DASD spindle designated to receive data from a Mass Storage Facility.
Staging Pack — Disk pack that has been initialized to receive data from a Mass Storage Facility.
SUPPO — Suppress Out.
SW — Switch.
SYMP — Sympton; an error definition.
TA — MIcroprogram general purpose register.
TB — Microprogram general purpose register.
TC — Microprogram general purpose register.
TD — Microprogram general purpose register.
TE — Microprogram general purpose register.
TF — Microprogram general purpose register.
TG — Microprogram general purpose register.
Trace — A monitor in the MSC that records data about MSS activity and staging and destaging; the data describes completed MSS functions from the activity schedule queues plus time stamps.
UCB — Unit Control Block.
UDEP — Unsolicited Device End Processor.
Unsolicited — A message from the MSC to the primary CPU that is not requested or expected by the primary CPU.
VFO — Variable Frequency Oscillator.
Virtual Drive — A direct access storage device that does not physically exist; it exists logically on one or more staging drives.
VOLID — Volume Identification.
VP — Virtual Page; also see Page.
VUA — Virtual Unit Address; an address for a virtual drive that consists of the channel address, the Staging Adapter address, and the device address. The virtual unit address can be assigned to any staging drive group. Each staging drive can have more than one virtual unit address, but only one real unit address (RUA).
VV — Virtual Volume; the data from a mass storage volume while it is located on a virtual staging drive.
VVA — Virtual Volume Address.
VVIT — Virtual Volume Identification Table.
WD — Word of four bytes.
XFER — Transfer.
XREF — Cross reference.

BACKGROUND OF THE INVENTION

The invention relates to mass memory apparatus of the staging data type and more particularly to error control apparatus and methods for use therein.

Direct access storage such as disk storage devices (DASD) has many advantages when used in a data processing system. For example, it enables rapid access to a data record as opposed to moving a record tape to scan long sequential files. It is usually on-line when one needs it. It is reliable. But such direct access storage is expensive. Also, the number of disk drives attachable to a host CPU is usually limited. It is also inefficient because the amount of data in use on a single disk device or drive at one time is usually small.

On the other hand, tape storage has many advantages when used in a data processing system. Large quantities of data can be stored in a tape library. It is reliable and relatively inexpensive. But an entire tape file, perhaps of several reels, must be read and rewritten to obtain a few records that are needed for data processing. Processing must be sequential, which requires transaction files to be sorted before updating a master file. Time can be wasted in finding the proper reel to mount. Mounting the wrong reel of a multi-reel tape file causes rerun problems. Also, maintaining a tape library can be expensive.

To enhance data processing, a staging mass storage system (MSS) combines the better features of disk storage with the economy of tape storage. The storage capacity equals that of a large tape library. Data can be processed in a tape-like sequential manner or in the efficient direct access disk manner. Most important in an operating environment, the data is available to the processing system without the delays associated with the finding of the tape reel, mounting it, and returning it to the tape library after use. Addressing such apparatus is in a so-called "virtual direct access storage" mode as described in U.S. Pat. No. 3,670,307 as implemented using the international Business Machines Corporation 3330 disk storage virtual volume addressing scheme. This scheme defines a logical address space as containing 100,000,000 data bytes—the storage capacity of one IBM 3330-type disk pack. Usage of this addressing scheme will become apparent. During the time the data is being processed, it is on-line on 3330 disk drives. When the data is not in use, it is stored on tape in a Mass Storage Facility (MSF).

A MOUNT virtual volume message given to an MSC initiates transfer of data from tape to disk. The MSC searches its tables, finds the location in the MSF where a data cartridge containing that data is stored, finds space on an available disk drive, reads the data from the data cartridge, and writes it on the disk drive.

The disk packs to which the data stored in the data cartridges is written are called "staging packs," and the process of copying the data from the data cartridge onto the disk pack is called "staging." Data must be staged before it can be processed by a host. The data needs only be staged once for multiple concurrent uses.

The process of writing the disk cylinders containing changed data back to the data cartridge is called "destaging." Since all the original data is still on the data cartridge, writing the changed data back results in the data cartridge having a complete updated data set. Data signals stored in disk storage that is not altered are never destaged.

Staging packs are divided into pages of storage. Each page consists of eight cylinders. There are 51 pages of staging space on one staging pack. When data is staged, it is written on whichever pages of space are available at the time. The data from a single data set does not necessarily go on consecutive pages of a staging pack, nor does it necessarily use only pages on a single staging disk drive.

When host computers to the MSS are IBM 370 type, the MSS responds to the program operating system OS/VS of such 370 host machines in the virtual direct access storage mode. That is, MSS locks like a lot of disk drives to the hosts. This means that the known 370 OS/VS programs for operating with the 3330 virtual volumes also operate with MSS. In this mode, OS/VS assigns a disk virtual volume to a system "unit." When a virtual volume is mounted in the MSS, it is also assigned to a unit address. Since, in MSS, a virtual volume can be as small as one page, a complete staging pack could mount 51 virtual volumes and therefore need 51 unit addresses. Because of this, the old idea of the unit address being a combination of channel, control unit, and device is modified. MSS uses a "virtual unit address" to designate the logical address of each virtual volume. Each virtual volume is assigned a virtual unit address to be used by MSS in staging data and in locating it on a staging pack. A group of virtual unit addresses is assigned to each group of real disk drives, termed "staging drive group".

In operation, these virtual unit addresses are varied on-line and off-line just like other system units and real units are varied on and off.

In an MSS destaging operation, data signals read from DASD units go through a buffer in a director 16 into the tape units DRD for a recording or write operation. The format of the data, as recorded on DASD, is imaged on the tape; that is, the data format includes count, key, and data widely used on DASD. If a write occurred on DASD, a host CPU updated the data which means that the count, key, and data are all changed. Further, control signals recorded at the beginning of a cylinder of data are probably also changed. In summary, the entire data format after a recording operation on DASD is entirely different from the data format prior to such writing operation. It is revised or newly formatted data signals which have to be accurately recorded on the tape.

Each DASD cylinder includes a plurality of record tracks, one track on a recording surface. For example, in one DASD unit, 17 tracks constitute a cylinder, all of the tracks being at the same radial position on the respective record surfaces. When transferring data from the DASD cylinder to the tape, an error may occur anywhere within the cylinder. Generally, such errors occur only on one track. At this point in time, the DASD reading operation is aborted using known procedures. As such, the signals recorded on the tape which correspond to the data signals supposedly recorded in the DASD cylinder contain partly the newly formatted data signals, plus a remainder (unknown amount) of the old formatted tape signals. Since the control signals are always recorded a the beginning of the cylinder, the control information defining the signals following the error has already been destroyed; i.e., the data which has been destaged for the DASD read error has overwritten the old formatted data. Hence, on tape at the onset of a DASD read error, the tape has a portion of the newly formatted data plus an unknown portion of the old data which has had its control information completely obliterated. It is extremely important that the destaged data signals be in one format; otherwise, all of the data recorded on the tape in that particular portion becomes substantially meaningless.

The present invention is most advantageously used with apparatus referred to above and as shown in FIG. 1. As MSS apparatus includes an MSF 10 having a tape cartridge store such as shown in Beach et al, supra. MSF 10 also includes a plurality of data recording devices (DRD) 12 (tape recorders) and associated data recording controls (DRC's) 13 (tape recorder controls) all constructed in accordance with the documents incorporated by reference. MSF 10 constitutes the data base memory portion of the MSS.

An intermediate storage level of MSS consists of a plurality of disk storage units (DASD) 14, associated DASD controllers 15, and storage controls or directors 16. Each director 16 includes a staging adapter portion for automatically moving data signals between MSF 10 and DASD 14 and 15. Moving data signals from MSF 10 to DASD 14 and 15 is termed "staging" (data promotion to a higher storage level), while moving data signal from DASD 14 and 15 to MSF 10 is termed "destaging" (data demotion to a lower storage level).

An MSC 17, a programmable computer, supervises and directs operations of MSS as will become more clear.

One programmable host computer is a so-called "primary" host 18. This computer, in a limited manner, supervises operation of MSS on behalf of all other connected host computers 19. Each host computer 19 has at least one channel connection to a storage director 16; such channel connections are in accordance with U.S. Pat. No. 3,400,372. Additionally, primary host 18 has a channel connection to MSC 17 for issuing commands and receiving MSS status signals, as will become more apparent. The MSC 17 acts as a control unit to primary host 18, all in accordance with U.S. Pat. No. 3,400,372. MSC 17 connections to MSF 10 controller 21 and to storage directors 16 are also in accordance with Patent 3,400,372, wherein MSC 17 is a "host" or "CPU" and units 16 and 17 are the control units of U.S. Pat. No. 3,400,372. Controller 21 is as described in Beach et al, supra, and Carter et al T921,023, dated Apr. 16, 1974.

As described above, a problem presented in operating a multi-level or hierarchal MSS during destaging or data demotion from the DASD upper storage level to MSF 10 lower storage level is handling and recovery from DASD read errors. Each host CPU must have an opportunity to take recovery actions before such data is destaged to MSF 10 with an error. Recovery from DASD read errors is 99.5% successful by manually moving a disk pack from one disk drive to another disk drive. That is, 99.5% of the time the second disk drive successfully reads the moved disk pack. In a virtual addressing environment during MSS operations, moving disk packs can destroy addressability—the data cannot be accessed by any host. When moving disk packs from one drive to another, the same channel address can be maintained even though the pack is on a different drive. In this manner, addressability is maintained.

In a real addressed system, storage equipment errors or checks are not readily propagated as data errors to data in other storage equipment at the same storage level. In a virtually addressed MSS, one storage unit may contain data from many diverse sources; hence, one storage unit having error conditions can result in widespread data sets with increased catastrophic effects over real addressed storage. Such a situation should have early detection and correction.

SUMMARY OF THE INVENTION

Accordingly, it is desired to provide apparatus and methods for enabling error recovery in a virtual address MSS.

This invention enables a virtually addressed MSS to recognize DASD (upper level) read errors, reserves the DASD spindle in error to an MSC, notifies the appropriate host of the error, accepts the host action causing the failing destage operation to be restarted, and if still in error to destage the data in error with suitable precautions.

In a best mode of the invention, the procedures of the invention are initiated and monitored by programming in MSC 17 and directors 16.

MSC 17:

1. Determines if the DASD read error is a part of a destage operation and if not continues normal processing; i.e., the invention is not invoked.
2. Converts the cylinder-in-error address to a mini head page list element index, a program tool to initiate procedures of the invention.
3. Determines if this is first or second error on this cylinder and sets flags accordingly.

Then, MSC 17 operates on Queue Control Blocks (QCB):

1. Updates page list entries preceding the failing entry (DASD read error), plus the successful cylinders of the failing entry.
2. Schedules a task Destage Restart for execution; a program will restart the aborted destaging operation.

The Destage Restart function is by a program which:

1. Determines if this is first or second error.
2. If first error, then program issues a status information message to the host processor and then exits.
3. If this is second error, it issues a message to the host processor that a destage with error is occurring.
4. A program step will Mark Page In Error to identify the eight cylinders associated with the DASD read error.
5. Calls DASD QCB Restart; program, see below.
6. Initiates Destage with Error.
7. Releases the reserved disk drives for use by directors 16.

The UDEP (Unsolicited Device End Processor) function is an expected action by the user to move the disk pack to another disk drive. In readying the pack on the new drive, a device end interrupt is presented to the MSC.

Mark Page in Error (used only when a data error occurs) marks the page (eight DASD cylinders) containing the error as not available for use:

1. On recognizing a DASD device end, interrupt calls DASD QCB Restart.

DASD QCB Restart:

1. Searches all QCB's that have been marked in error for DASD and sets those executable that have Staging Drive Group and Unit equal to that presented by UDEP or Destage Restart.
2. On finding a QCB to be reset, it follows all chains and resets all appropriate QCB's.
3. Destaging is reinitiated.

A similar procedure is followed for plural equipment errors even though no data error is detected. Such plural equipment errors indicate onset of possible data errors. Mark page in error is not used.

The foreging and other objects, features, and advantages of the invention will become apparent from the following more particular description of the preferred embodiment of the invention, as illustrated in the accompanying drawing.

THE DRAWING

DETAILED DESCRIPTION

Figure 1:
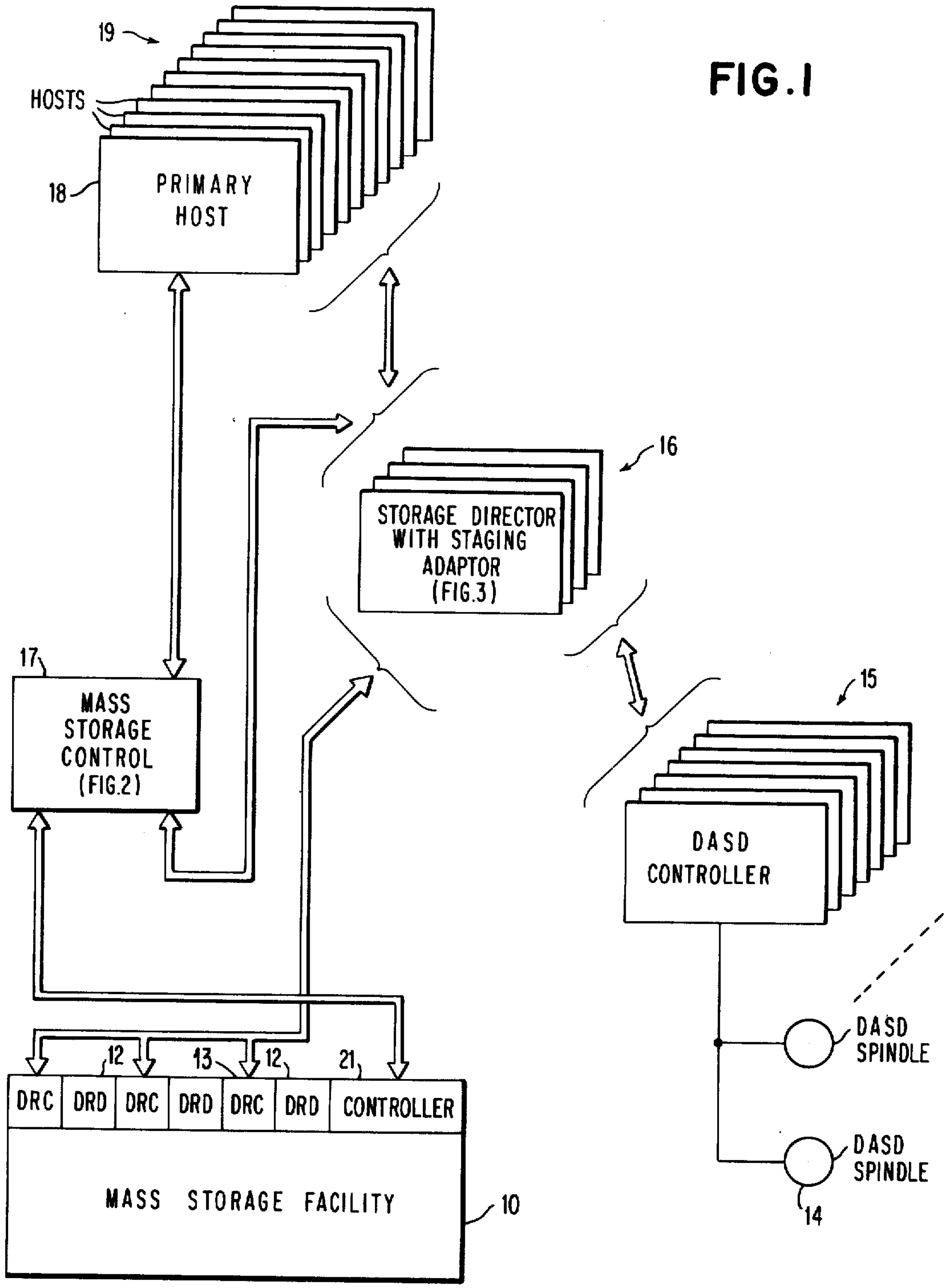
FIG. 1 is a diagrammatic showing of a mass storage system of the single address field dual-level type.

Referring more particularly to the drawing, like numerals indicate like parts and structural features in the various diagrams. The present invention enhances the apparatus described with respect to FIG. 1 in that errors detected in DASD spindles 14 operations are controlled such that the errors are not propagated undetected to MSF 10. Without the present invention, the FIG. 1 illustrated apparatus, during a destaging operation, moves data in error from DASD spindles 14 through DASD controllers 15, thence through the staging adapter portion (later described) of directors 16, thence to the DRC's 13, DRD's 12 of MSF 10.

In accordance with the invention, such an unsupervised operation, that is, primary host 18 and other hosts 19 have no direct intimate control over the operation of the MSS, cannot always control error propragation. Such hosts operate under the assumption that data in MSF 10, DASD spindles 14, and data transmitted therebetween is always correct. Under unusual circumstances, data errors can occur. By controlling the propagation of such errors and appropriately signaling a host 18, 19, error propagation can be controlled with the data in error preserved for later analysis and recovery beyond the scope of the disclosure.

Figure 2:
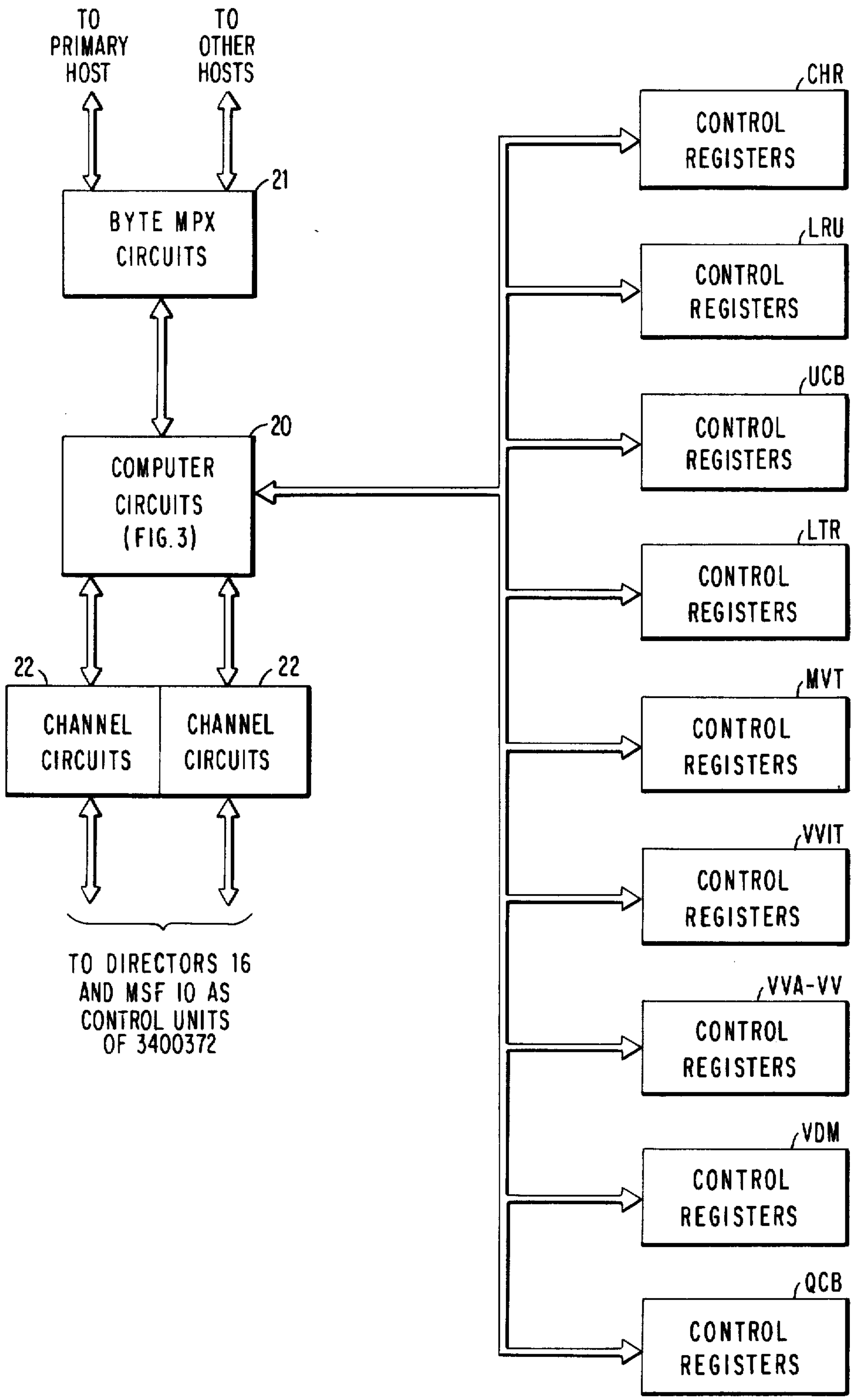
FIG. 2 is a diagrammatic showing of storage director apparatus usable with the FIG. 1 illustrated mass storage system.
Figure 3:
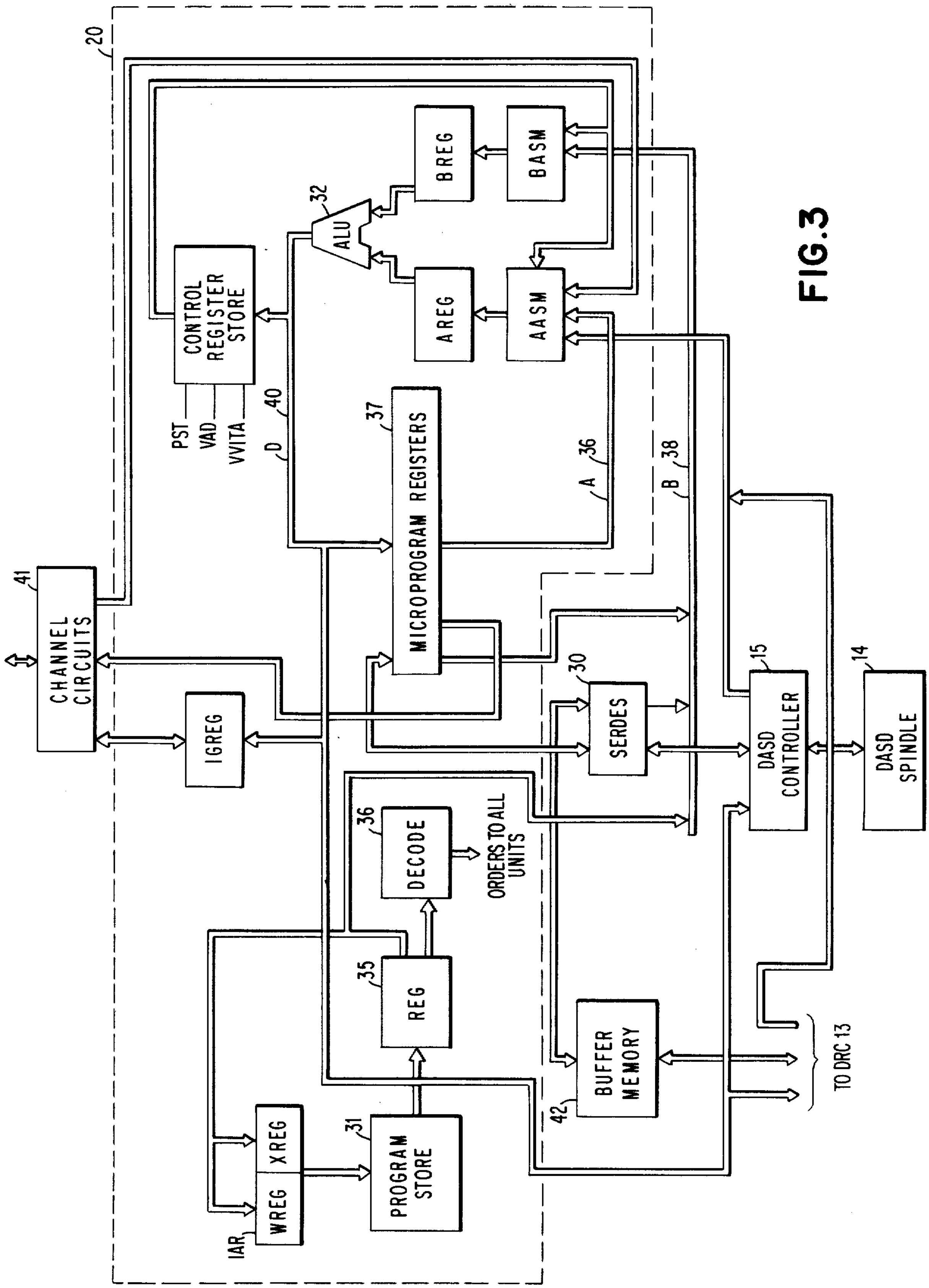
FIG. 3 is a diagrammatic showing of microcodable processor apparatus usable with the FIGS. 1 and 2 illustrated apparatus.

Both MSC 17 and directors 16 are microprogrammable processors with directors 16 additionally having special circuits for exchanging data signals between a host 18, 19 and DASD spindles 14, or between DASD spindles 14 and MSF 10. Since a portion of the invention is initiated under microprogram control, the two microprocessors are described in diagrammatic form. FIG. 2 illustrates the MSC 17, while FIG. 3 illustrates the storage director with staging adapter 16. Intercommunication between processors is in accordance with U.S. Pat. No. 3,400,372. That is, primary hosts and other hosts 19 communicate with MSC 17 wherein MSC 17 is a control unit of the I/0 descriptive portion of 3,400,372. Similarly, directors 16 are also control units as described in that patent. Additionally, MSC 17 acts as a host computer with the directors being a control unit to MSC 17. That is, MSC 17 is a microprocessor logically interposed between primary host 18, other hosts 19, and the directors 16. Directors 16 respond to channel commands from MSC 17 in the same manner as they respond to primary host 18 and other hosts 19. Mass storage commands are uniquely received by MSC 17. Since general operation of MSS is not a part of the invention, those particular commands are not further described. For convenience, directors 16 have a four-channel interface; i.e., each director 16 can connect up to four hosts. MSC 17 appears as one of the hosts, always on the same interface connection. If the four connections are labeled A, B, C, and D, host MSC 17 is connected to interface A; while primary host 18 and some of the other hosts 19 are connected to the other three interfaces. Primary host 18 needs not be connected to all storage directors 16, while MSC 17 should be connected to all directors 16.

MSC 17 commands director 16 to exchange data signals between DASD spindles 14 and MSF 10. Additionally, MSC 17 supplies MSF 10 operating commands to library controller 21, the details of which are beyond the scope of the present description.

Figure 4:
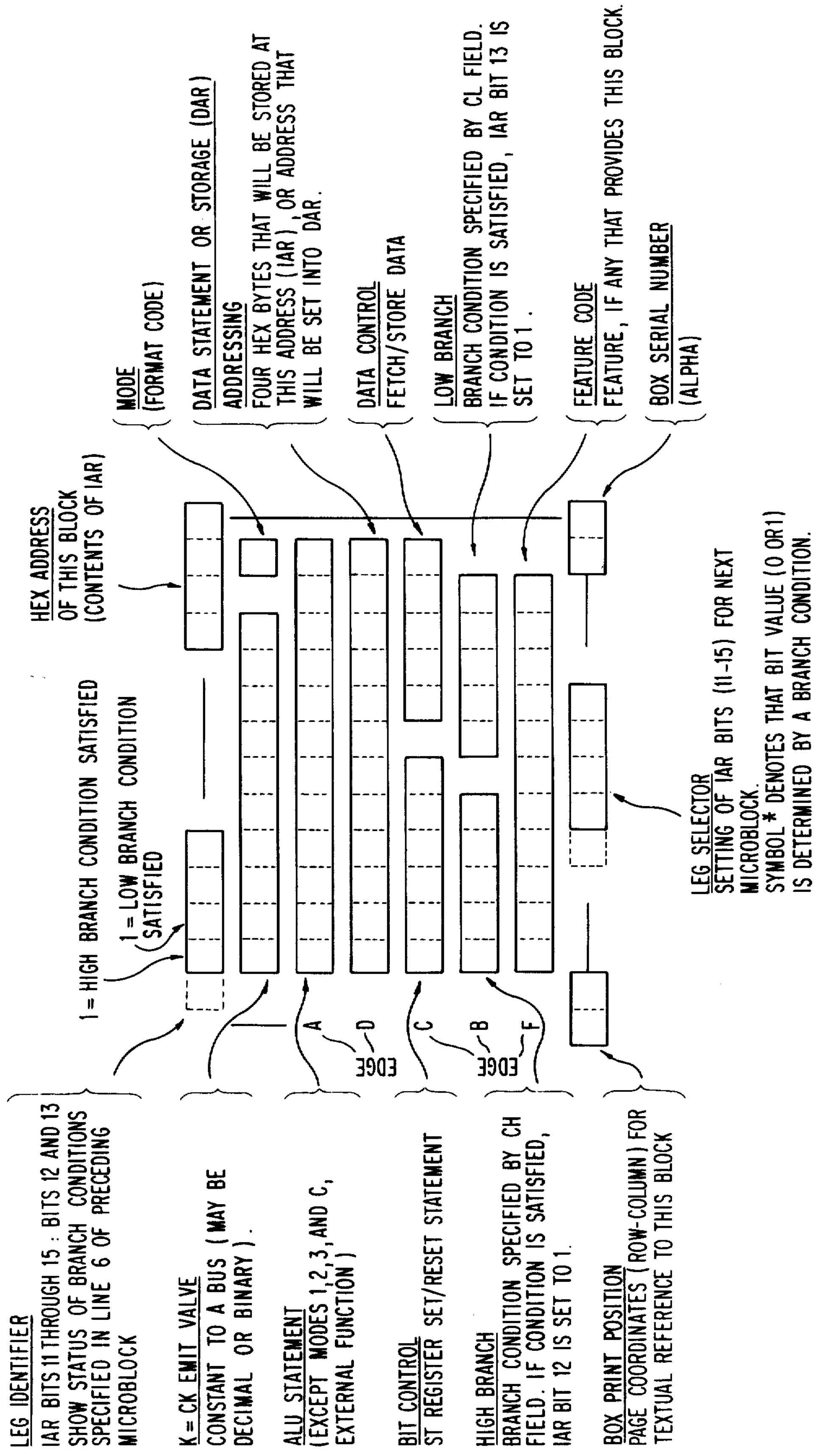
FIG. 4 is a diagram of a symbolic representation of a microcode instruction word usable with the FIG. 3 illustrated apparatus.

Both MSC 17 and directors 16 have the same constructed microprocessor circuits. That is, the calculator portion of directors 16 and MSC 17 are identical. Such calculators are also shown in FIG. 4 of U.S. Pat. No. 3,716,837 and in the DASD Director Model 3830 produced by International Business Machines Corporation, Armonk, N.Y. For a better understanding of the microprogramming involved with the present invention, the calculators and their relationship to the directors 16 are set forth in sufficient detail in combined flowchart and object code form to facilitate a ready understanding of what is achieved.

FIG. 2 diagrammatically shows MSC 17. The core of the control is a set of computer circuits 20 constructed as shown in FIG. 3. These computer circuits communicate via known byte multiplexor channel circuits 21 to a primary host which has the general responsibility for supervising operation of the entire data processing installation, as well as to selected other host computers. Such computers can be constructed in accordance with U.S. Pat. No. 3,400,372. Typical byte multiplexor circuits 21 are those used by the International Business Machines Corporation in their IBM 360/370 so-called "channel" circuits. Circuits 20 receive channel commands from the primary host and the other hosts via circuits 21. Circuits 20 include microprograms beyond the scope of the present description for interpreting those commands for executing memory functions such as those executed by the International Business Machines Corporation Model 3850 Mass Storage System. Additionally, control 17 includes a plurality of channel circuits 22 for communicating storage orders to directors 16 and MSF 10. These circuits 22 are constructed as the channel circuit in U.S. Pat. No. 3,400,372, whereas the directors 16 and MSF 10 appear as control units to those channel circuits. Communication between the computer circuits 20, directors 16, and MSF 10 is in accordance with U.S. Pat. No. 3,400,372. Additionally, computer circuits 20 include memory circuits for storage control signals incidental to the operation of the MSS. These include a plurality of addressable registers CHR, LRU, UCB, LTR, MVT, VVIT, VVA-VV, VVM, and QCB. In a most preferred embodiment, these control registers form a part of a random access storage device. Control registers CHR contain control signals for cylinder head records yielding upward level, or DASD, physical locations of control signals usable by computer circuits 20 in operating MSS. Each register contains four bytes for identifying the CCHH address, as is well known in DASD storage technology. The first two bytes can be a virtual address, while the second two bytes can be a real address. Information contained in these registers respectively is set forth in the table below.

| Register No. | Content |
|---|---|
| 01-14 | MVT Data Control |
| 14-18 | Staging Drive Group ID's |
| 18-1B | Mounted Volume Names |
| 1C-1F | Scratch Cartridge List |
| 20-23 | Virtual Volume Inventory |
| 24-27 | Transient Volume List |
| 28-2B | Cross-Reference VVA-VOLID |
| 2C-2F | Configuration Data |
| 30-33 | Page Data Stable |
| 34-37 | MSF 10 Cell Map |
| 38-3B | VVA |
| 3C-3F | Journal |
| 40-43 | Schedule Queue |
| 44-47 | Diagnostic Data |
| 48-4B | Message Buffer |

The LRU control registers contain the least recently used data information in connection with the automatic destaging from DASD spindles 14 to MSF 10 for that data which has not been recently used. These registers identify those data locations most eligible, i.e., oldest, for automatic data destaging to make room for data signals to be staged from MSF 10.

UCB control registers contain unit control blocks for controlling operations of the DASD and MSF 10 units beyond the scope of the present description.

The LTR control registers are a cross-reference table identifying real registers in DASD with logically named registers from the host in accordance with the sequence of logical names. Hence, computer circuits 20, by accessing control registers LTR based upon a logical name, can quickly identify the actual physical location of the data indicated by the logical name.

Control registers MVT contain a mounted volume table, which is a list of all so-called "DASD data set volumes" having activity with respect to the DASD spindles 14. Even though host computers may indicate that such volumes can be removed to MSF 10 by destaging signals, such volumes are continued to be identified in control register MVT until all DASD space of spindle 14 has been allocated to other volumes. The informational content of control registers MVT is not pertinent to a practice of the invention, hence, will not be further described.

Control registers VVIT contain a volume inventory table which has identifying and locational information of all data signals stored in MSF 10. Each VOLID (volume identification) includes the attributes of the volume and the physical location of the MSF assigned to each volume. Also, since this is incidental to a practice of the invention, it is not further described.

VVA-VV control register is a cross-reference index between a reference number VVA assigned to a virtual volume within MSS and the longer VOLID. In other words, VVA is a shorthand notation for identifying VOLID when any VOLID data signals have been staged to DASD. As an example, VVA is 1 byte long and VOLID is six bytes long.

VDM control registers contain a virtual device map relating real devices to virtual names for devices. That is, each host computer has a virtual unit addressed for a virtual device, i.e., a logical name. There is not a one-to-one mapping of virtual devices to real physical devices; i.e., one virtual device may actually physically consist of several real devices, a part of each real device being assigned to the logically named virtual device. Hence, control registers VDM are an index for relating the logical name units of the host to the actual physical unit of MSS.

Control registers QCB contain a so-called "queue control block". These registers are four-byte registers identified in the table below entitled "QCB Control Registers."

QCB Control Registers

| Register | 0 | 1 | 2 | 3 |
|---|---|---|---|---|
| 0 | Block Flags | Error Pointer | BF1 Level 1 | BF2 Level 2 |
| 1 | DIR-1 | DIR-2 | VVA1 | VVA2 |
| 2 | QCB0 | QCB1 | QCB2 | QCB3 |
| 3 | QCB4 | QCB5 | DRD | QCBP |
| 4 | VOLID | VOLID | VOLID | VOLID |
| 5 | VOLID | VOLID | LXYZ | LXYZ |
| 6 | Trace 2 | Trace 2 | Trace 3 | Trace 3 |
| 7 | ST SAVE | BR SAVE | JCP | — |
| 8 | Error | Error | Error | Error |

Since the QCB control registers contain information relatable to the present invention, they are described in more detail. The byte 0 block flags of register 00 are decoded as follows. Bits 0 and 1, if 00, indicate annulity; 01 indicates ready for delete or reread; 01 indicates valid, but the queue is not started; and 11 indicates valid and active in active stage queue (ASQ). That is, staging operations have been requested; and a separate queue (not shown) in directors 16 has listed the action from the QCB for staging.

Bit 2, when 1, indicates it is a nonstaging adapter type of operation. That is, signals are being exchanged directly between the host 19 and a DASD controller 15.

Bit 3, when 1, indicates two directors 16 are connected to a DASD spindle.

Bit 4, being active, indicates a DRD 12 allocation is not required for work in connection with the control block.

Bit 4, when 1, indicates a DRD 12 is assigned via the second director 16.

Bits 6 and 7 are reserved for alternate path retries beyond the scope of the present description.

Byte 1 of register 0 contains the register number of a so-called "mini header" currently in use or active.

Block flag 1 (BF1) for level 1, found in byte 2 of register 0, is interpreted as follows. Bit 0 as used herein must be a 0; when it is a 1, it is used for purposes beyond the scope of the present description. Bit 1 being a 1 indicates an error condition in addressing MSF 10. Bit 2 being a 1 indicates that the message buffer overflowed with respect to this control block. Bit 3 being a 1 indicates that data signals indicated by this control block are in error and waiting for job assignment by the scheduler of computer circuits 20. The schedule of computer circuits 20 is an operating supervisor which assigns tasks to various programs for execution, as is well known in the data processing arts. Bit 5 being a 1 inhibits reading the cartridge table of contents (CTOC) such that it cannot be transferred to a host computer. Bits 6 and 7 identify portions of MSF 10.

Block flag 2 (BF2) for level 2 is found in byte 3 of register 0. Bit 0 being a 1 indicates that CTOC has been read. CTOC is from the storage articles of MSF 10. Bits 1 and 2 are not used. Bits 3–7 identify the group of DASD spindles 14 associatable with the control block. Such identification can be either in the virtual, real, or physical mode. In register 1, bytes 0 and 1 contain the numerical identification of directors 16 (DIR-1 and DIR-2). That can be used to access a DRD 12 which has been allocated for processing data signals in connection with the control block.

Bytes 2 and 3 of register 1, VVA1 and VVA2, contain the virtual volume addresses used by directors 16 for accessing data in connection with this control block. It is remembered that the VVA is a shorthand notation for identifying a VOLID.

Registers 2 and 3 contain QCB's 0–B which have the signal contents of the queue control block associatable with a particular schedule queue block.

Byte DRD in byte 2 of register 3 is the address or identification of the DRD 12 which has been allocated for use in connection with this queue block.

Register 3, byte 3, contains QCBP which is a pointer or an address indicating a word in the QCB registers associatable with this control block.

Registers 4 and 5 contain VOLID, the name of a volume associated with the control block. Hence, it is seen that the QCB control registers also contain a translation from the VVA to the VOLID.

Also in register 5, in bytes 2 and 3, the LXYZ storage cell addresses in the MSF 10 for locating magnetic storage articles containing data signals associatable with this control block.

Register 6 has performance data in connection with allocation of a DRD 12 and the deallocation of DRD as the CTOC has been read from the storage article of MSF 10. ST and BR SAVE, found in register 7, indicate that the contents of the ST and BR registers of computer circuits 20, as later described, have been imaged in this register for use when the control block is referenced. Register 8 and subsequent registers contain error pointing data.

The mini headers (sets of control signals) also stored in the QCB control register contain a sequence byte indicating the status of the sequence. This includes bit 0 indicating verification of an MSF 10 addressing, bit 1 indicating that a stage/destage operation is requested, bit 2 indicating check point, bit 3 is unused, bit 4 updates a first director 16 table, bit 5 indicates update of a second director 16 table (two directors 16 can access a given DRD and a given DASD spindle 14), and bits 6 and 7 are unused. As the functions are performed, the bits are turned to 0.

A second byte in the mini header is a so-called "mini flag byte" wherein bits 0 and 1 are combined to indicate a destage for 00, a nonstaging operation for 01, a staging operation for 10, and a nonstaging operation for 11. Bit 3 indicates that a second mini header pointer is valid. Bit 4 indicates a no-operation, while bit 5 indicates an IORC type of operation. Bit 6 indicates that an IORB is associated with a second type of director 16. An additional byte is provided to point to the next mini header. It is a low-order address byte with the schedule sector queue being the high-order address byte. The last mini header of the QCB has 00. Trace T2 byte indicates the time the particular mini header was inserted into the schedule queue block. Trace T4 byte is the time that a stage or destage operation was initiated and is associatable with the particular mini header. Trace T5 indicates the time of completion for such stage/destage. Hence, the three trace bytes indicate performance. The order ID byte indicates the operation to be performed, i.e., stage/destage, etc. Another byte indicates the hosts associatable with the particular function to be performed in the order ID byte. Additionally, there is a so-called "directors 16 flag byte". Bits 0 and 1, when equal to 00, indicate that a staging operation to cylinders CC is to be performed. Bits 2–4 are all 0's. Bit 5 indicates an error has occurred on the staging operation; i.e., the DASD data is in error. Bit 6 equalling 1 indicates a stage to real DASD cylinders CC and that the page status table PST in directors 16 must be updated. This bit is on whenever a 1 DASD spindle 14 has its signal content transferred to another DASD spindle 14. Bit 7 is a 0. When bits 0 and 1 are a 10, a destage operation from cylinders CC is indicated. Again, bits 2–4 are 0. Bit 5 indicates an error on destaging (pertinent to the present invention), and bit 6 being a 1 indicates a destage from a DASD spindle to a storage article in MSF 10. There is also a staging table access flag byte as opposed to the previously described move data flag byte. When bits 0 and 1 of the table access flag byte are 00, the directors 16 PST has cylinder valid bits set active with the PST being updated with the VVA and VP. Bit 2 being equal to 1 indicates an unsuppressible device end pending for the VUA (virtual unit address) after cylinder processing. The function of this bit is for other than operation with the present invention. Bit 3 being equal to one indicates that the VVA has to be updated. Bit 4 being equal to one indicates that suppressible device end pending must be set for a given VUA after CC processing. This is a so-called "virtual pack change"; i.e., the host CPU's indicate that the VUA is being changed even though the physical location of the data in MSS is unchanged. Bit 5 being equal to 1 means to reset the message buffer. Bit 6 is a 0. Bit 7 indicates that an unsuppressible device end, plus a unit check, is pending for a VUA. Unit check indicates an equipment error. If bits 0 and 1 are a 01, then bit 2 indicates that the VVA is reserved to storage control 17 in connection with a VVIT operation. Bit 3 releases the bit 2 indicated reserve. Bit 4 indicates that the VVIT must be updated for a given VUA. Bit 5 indicates the PST must be updated in connection with an operation not pertinent to the present invention. Bits 6 and 7 are similar. When bits 0 and 1 are a 10, this indicates that the PST of directors 16 must turn off the cylinder-written bits; that is, the PST indicates data has been altered in DASD requiring destaging operations. With the cylinder-written bits turned off, such DASD data will not be destaged since a duplicate copy is contained in a storage article of MSF 10. Bits 2 and 3 are 0. Bit 4 indicates that the DASD CC address must be erased. Bits 5–7 are not used. If bits 0 and 1 are a 11, then bit 2 indicates that a pack change interrupt should be sent to the host CPU for a given VUA and that the VUA has a one-for-one correspondence with a real physical spindle. Bit 3 resets the PST removing the one-for-one correspondence of the VUA to a real unit. Bit 4 indicates that the LRU values of the LRU control registers have to be replaced. Bit 5 indicates that the staging drive group values for DRC 13 have to be updated. Bit 6 indicates a message of bytes 1–4 of the LTR control registers has to be transferred. Bit 7 indicates that the table of content of LTR must be sent to a program accessible memory portion of computer circuits 20. A count byte indicates the number of pages in the page list associated with the particular mini header. The VUA byte indicates the virtual unit address of the host used in connection with operations with the mini header. The VVA contains the VVA associated with the data. In addition, the QCB registers may contain other information not associated with the operation of a storage director 16 having a staging adapter.

The computer circuits 20 are generally shown in FIG. 4 of Waddell U.S. Pat. No. 3,716,838, as well as in FIG. 3 herein. Directors 16 also use identical computer circuits 20 and additionally have a serializer/deserializer or SERDES 30 which receives parallel data signals from computer circuits 20, supplies serial signals to DASD controller 15, and receives serial signals from controller 15 to convert same to parallel signals for transmittal to computer circuits 20. Modulation/-demodulation of DASD data is accomplished in SERDES in accordance with known techniques and as used on the Model 3830-II Director manufactured by International Business Machines Corporation. Computer circuits 20 contain a set of instruction steps in program store 31. Because computer circuits 20 are microprogrammed, a plurality of instruction word formats are employed. Each instruction has four bytes, with the fields being identified in the table below.

| | Instruction Word Formats | | | |
|---|---|---|---|---|
| Type | Byte 0 | Byte 1 | Byte 2 | Byte 3 |
| A | CK (CA, CV) | OP, CB/CD | FMT CX | CH CL |
| B | CD, CV | OP, CB | FMT CX | CH CL |
| C | CW, CV | OP, CB | FMT CX | CH CL |
| D | CK/CA, CS | OP**, CB/CD | FMT CX | CH Cl |
| E | CA, CS | OP**, CB/CD | FMT — | — — |
| F | OP, CS | —**, OP | FMT CX | CH CL |
| 1a | CK, CS | ML**, CB/CD | FMT CX | CH CL |
| 1b | CK, CS | ML**, CB/CD | FMT CX | CH CL |
| 1c | CK, CS | ML**, CB/CD | FMT CX | CH CL |
| 2a | MK/CK, CS | ML**, CB | FMT CX | CH CL |
| 2b | MH/CK, CS | ML**, CB | FMT CX | CH CL |
| 3 | NH/NK, CS | ML**, NL | FMT CX | CH CL |

Notes:
*Gated to A bus bits 4–7.
**Format bit ME in lefthand digit.
OP Is always three bits, remainder fields are five bits.

| | Format Coding in Instruction Words | | | | |
|---|---|---|---|---|---|
| Type | ME Bit | Coding in Format | | | |
| | ME | FM | KK | ND | NB |
| A | — | 1 | X | * | * |
| B | — | 1 | 0 | 1 | 1 |
| C | — | 1 | 1 | 1 | 1 |
| D | 0 | 0 | X | * | * |
| E | 0 | 0 | 0 | 1 | 1 |
| F | 0 | 0 | 1 | 1 | 1 |
| 1a | 1 | 0 | 1 | 0 | 0 |
| 1b | 1 | 0 | 1 | 0 | 1 |
| 1c | 1 | 0 | 0 | 0 | 0 |
| 2a | 1 | 0 | 1 | 1 | 0 |
| 2b | 1 | 0 | 1 | 1 | 1 |
| 3 | 1 | 0 | 0 | 1 | 0 |

Notes:
X = 1 or 0
*= ND, NB ≠ 11

Each of the fields identified in the table above are micro orders interpreted as set forth in the tables below, respectively identified by the field name. In the tables below, the edge character next to the micro order indicates a vertical position in

| Field CS Micro Orders | | |
|---|---|---|
| Micro Order | Edge | Function |
| DNST21 | C | Set ST reg. bit 2 if the D-bus is non-zero |
| 0→ST0 | C | Reset ST reg. bit 0 |
| 0→ST1 | C | Reset ST reg. bit 1 |
| 0→ST2 | C | Reset ST reg. bit 2 |
| 0→ST3C | C | Reset ST reg. bit 3 |
| 0→ST4 | C | Reset ST reg. bit 4 |
| 0→ST5 | C | Reset ST reg. bit 5 |
| 0→ST6 | C | Reset ST reg. bit 6 |
| 0→ST7 | C | Reset ST reg. bit 7 |
| 1→ST0 | C | Set ST reg. bit 0 to 1 |
| 1→ST1 | C | Set ST reg. bit 1 to 1 |
| 1→ST3C | C | Set ST reg. bit 3 to 1. This bit takes value of carry-out of ALU if "C" is added to D-bus statement. |
| 1→ST5 | C | Set ST reg. bit 5 to 1 |
| 1→ST6 | C | Set ST reg. bit 6 to 1 |
| 1→ST7 | C | Set ST reg. bit 7 to 1 |

| Field CA Micro Orders | | |
|---|---|---|
| GA 1001 | A | GP reg. with outgates to the A-bus |
| GB 10000 | A | GP reg. with outgates to the A-bus |
| GC 0001 | A | GP reg. with outgates to A-bus |
| MA 1111 | A | GP reg. usually used for devine read/write data |
| MB 1110 | A | GP reg. usually used for displacement register |
| MC 0111 | A | GP reg. usually used for ECC Low count |
| MD 0110 | A | GP reg. with outgates to the A-bus usually used for hannel Bus-In |
| NA 1011 | A | GP reg. usually used for CU address and channel conditions |
| NB 1010 | A | GP reg. with outgates to the A-bus |
| NC 0011 | A | GP reg. |
| ND 0010 | A | GP reg. outgates to the A-bus used for CUDI bus and tag |
| TA 1101 | A | GP reg. usually used for CUDI bus-out bits |
| TB 110 | A | GP reg. usually used for write control and ECC control and CUDI gates |
| TC 0101 | A | GP reg. usually used for SERDES controls and channel controls |
| TD 0100 | A | GP reg. usually used for CUDI tags and check indications |

| Field CB and CD Micro Orders | | |
|---|---|---|
| Micro Order | Edge | Function |
| MA 1011 | A | GP reg. with outgates to the B-bus; ingates from the D-bus |
| MB 1000 | A | GP reg. with outgates to the B-bus; ingates from the D-bus |
| MC 1111 | A | GP reg. with outgates to the B-bus; ingates from the D-bus |
| MD 1100 | A | GP reg. with outgates to the B-bus; ingates from the D-bus |
| NA 0111 | A | GP reg. with outgates to the B-bus; ingates from the D-bus |
| NB 10110 | A | GP reg. with outgates to the B-bus; ingates from the D-bus |
| NC 10101 | A | GP reg. with outgates to the B-bus; ingates from the D-bus |
| ND 10100 | A | GP reg. with outgates to the B-bus; ingates from the D-bus |
| SA 0000 | A | GP reg. with outgates to the B-bus; ingates from the D-bus |
| SB 0001 | A | GP reg. with outgates to the B-bus; ingates from the D-bus |
| SC 0010 | A | GP reg. with outgates to the B-bus; ingates from the D-bus |
| SD 0011 | A | GP reg. with outgates to the B-bus; ingates from the D-bus |
| ST 10001 | A | GP reg. usually used for status indications |
| TA 1001 | A | GP reg. with outgates to the B-bus; ingates from the D-bus |
| TB 0110 | A | GP reg. with outgates to the B-bus; ingates from the D-bus |
| TC 10111 | A | GP reg. with outgates to the B-bus; ingates from the D-bus |
| TD 1010 | A | GP reg. with outgates to the B-bus; ingates from the D-bus |

-continued

| Field CB and CD Micro Orders | | |
|---|---|---|
| Micro Order | Edge | Function |
| TG 10011 | A | GP reg. with outgates to the B-bus; ingates from the D-bus |
| 0 10000 | A | Forces all-0's to B register |
| BR 1110 | A | GP reg. with outgates to the B-bus; ingates from the D-bus |
| GA 0101 | A | GP reg. with outgates to the B-bus; ingates from the D-bus |
| GB 0100 | A | GP reg. with outgates to the B-bus; ingates from the D-bus |
| GC 1101 | A | GP reg. with outgates to the B-bus; ingates from the D-bus |
| GD 10010 | A | GP reg. with outgates to the B-bus; ingates from the D-bus |

| Field CH Micro Orders | | |
|---|---|---|
| Micro Order | Edge | Function |
| ADDRO | B | Set IAR bit 12 to 1 if Address out detected |
| BOPAR/ ILACT | B | Set IAR bit 12 to 1 if Bus out Parity check or IN-Line Active |
| BRO | B | Set IAR bit 12 to 1 if BR reg. bit 0 is a one |
| BR2 | B | Set IAR bit 12 to 1 if BR reg. bit 2 is a one |
| BR4 | B | Set IAR bit 12 to 1 if BR reg. bit 4 is a one |
| BR6 | B | Set IAR bit 12 to 1 if BR reg. bit 6 is a one |
| CARRY | B | Set IAR bit 12 to 1 if there was a carry out of ALU in previous microblock |
| CHK-2 | B | Set IAR bit 12 to 1 if Check 2 error detected. |
| INLIN | B | During INLINE mode BR-4 replaced by INLIN after SPEC OP 07 |
| COMMO | B | Set IAR bit 12 to 1 if op-in and command-out are active. EXT bch cond 12 |
| SECTR | B | During IMPL BR2 Replaced by SECTR (Sector) |
| SUPPO | B | Set IAR bit 12 to 1 if selected suppress-out detected |
| STO | B | Set IAR bit 12 to 1 if ST reg. bit 0 is a one |
| ST2 | B | Set IAR bit 12 to 1 if ST reg. bit 2 is a one |
| ST4 | B | Set IAR bit 12 to 1 if ST reg. bit 4 is a one |
| ST6 | B | Set IAR bit 12 to 1 if ST reg. bit 6 is a one |
| 0 0000 | B | Set IAR bit 12 to zero |
| 1 0001 | B | Set IAR bit 12 to 1 |

| Field CL Micro Orders | | |
|---|---|---|
| Micro Order | Edge | Function |
| BR1 | B | Set IAR bit 13 to 1 if BR reg. bit 1 is 1 |
| BR3— | B | Set IAR bit 13 to 1 if BR reg. bit 3 is 1— |
| BR5 | B | Set IAR bit 13 to 1 if BR reg. bit 5 is 1 |
| BR7— | B | Set IAR bit 13 to 1 if BR reg. bit 7 is 1— |
| BTRDY | B | During IMPL BR3 replaced by BTRDY (Byte Ready) |
| BFRDY CUEND— | B | Set IAR bit 13 to 1 if Control Unit End latch is on or Buffer full is detected— |
| CHANB | B | Set IAR bit 13 to 1 if channel B selected |
| D=0— | B | Set IAR bit 13 to 1 if the D-bus is equal to zero— |

-continued

Field CL Micro Orders

| Micro Order | Edge | Function |
|---|---|---|
| HLTIO/ XFER | B | Set IAR bit 13 to 1 if Halt I/O latch or transfer latch is set— |
| ILXEQ | B | During INLINES BR5 replaced by iLXEQ (inline execute switch latch)— |
| INDEX— (ST1) | B | Set IAR bit 13 to 1 is ST1=1 and INDEX is detected— |
| SELTD | B | Set IAR bit 13 to 1 if CU selected |

-continued

Field CL Micro Orders

| Micro Order | Edge | Function |
|---|---|---|
| SERVO/ MULTI | B | Set IAR bit 13 to 1 if Service-out or multi-tag switch (two-channel switch feature) are active— |
| ST3 | B | Set IAR bit 13 to 1 if ST reg. bit 3 is a one |
| ST5— | B | Set IAR bit 13 to 1 if ST reg. bit 5 is a one— |
| ST7 | B | Set IAR bit 13 to 1 if ST reg. bit 7 is a one |
| 0— | B | Set IAR bit 13 to zero— |
| 1 | B | Set IAR bit 13 to one |

The bit assignments of the micro-instruction words for the various formats are set forth in the tables below.

Table of Bit Usage - Format A

| Hex Value in Field ↓ | BYTE 0 bits 0–3 | BYTE 0 bits 4–7 | BYTE 1 bits 0–2 | BYTE 1 bits 3–4 | BYTE 1 bits 5–7 | BYTE 2 bit 0 | BYTE 2 bit 1 | BYTE 2 bit 2 | BYTE 2 bit 3 | BYTE 2 bit 4 | BYTE 2 bits 5–7 | BYTE 3 bits 0–3 | BYTE 3 bits 4–7 | |
|---|---|---|---|---|---|---|---|---|---|---|---|---|---|---|
| | CA | CV | OP | | CB/CD | 1 | 0 | 0 | 0 | | CX | CH | CL | |
| | CA | CV | OP | | CD | 1 | 0 | 0 | 1 | | CX | CH | CL | |
| | CA | CV | OP | | CB | 1 | 0 | 1 | 0 | | CX | CH | CL | |
| | CK | | OP | | CB/CD | 1 | 1 | 0 | 0 | | CX | CH | CL | |
| | CK | | OP | | CD | 1 | 1 | 0 | 1 | | CX | CH | CL | |
| | CK | | OP | | CB | 1 | 1 | 1 | 0 | | CX | CH | CL | |
| | A-Entry | Bits 4–7 | ALU Control | B-Entry and Destination: Bit 3 = 1 | B-Entry and Destination: Bit 3 = 0 | FM | of IAR KK | ND | NB | | Bits 8–11 of IAR | Branch High (IAR Bit 12) | Branch Low (IAR Bit 13) | |
| 0 | 0 | | AΩB→D | 0 | SA | | | | | | | 0 | 0 | 0 |
| 1 | GC | | A·B→D | ST | SB | | | | | | | 1 | 1 | 1 |
| 2 | ND | | A⊻B→D | GD | SC | Specifies | defines | Defines | | | | Carry | D = 0 | 2 |
| 3 | NC | | A+B→D | TG | SD | | | | | | | ST0 | Index (ST1) | 3 |
| 4 | TD | | A+B+C→DC | ND | GB | | | | | | | ST2 | ST3C | 4 |
| 5 | TC | | A−B+C→DC | NC | GA | | | | | | | ST4 | ST5 | 5 |
| 6 | MD | | A+B→DC | NB | TB | format | bits 0–3 | bits 3–7 | | | | ST6 | ST7 | 6 |
| 7 | MC | | A−B+1→DC | TC | NA | | | | | | | BR0 | BR1 | 7 |
| 8 | GB | | | GF | MB | | | | | | | BR2* | BR3** | 8 |
| 9 | GA | | | GE | TA | | | | | | | BR4*** | BR-5**** | 9 |
| A | NB | | | NF | TD | A,B,C | of byte 0 | of byte 1 | | BR6 | | BR7 | A | |
| B | NA | | | NE | MA | | | | | | | CHK-2 | SELTD | B |
| C | TB | | | TF | MD | | | | | | | COMMO | XFER/HLTIO | C |
| D | TA | | | TE | GC | | | | | | | ADDRO | SERVO/MULTI | D |
| E | MB | | | MF | BR | | | | | | | SUPPO | BFRDY/CUEND | E |
| F | MA | | | ME | MC | | | | | | | BOPAR+ | Chan B | F |

*During IMPL BR2 replaced by SECTR
**During IMPL BR3 replaced by BTRDY
***During In-Line Ops BR4 replaced by INLIN
****During In-Line Ops BR5 replaced by ILXEQ
+During In-Line, BOPAR replaced by ILACT Table of Bit Usage - Format B

| Hex Value in Field ↓ | BYTE 0 bits 0–4: CD — Destination Bit 0=1 | CD — Bit 0=0 | BYTE 0 bits 5–7: CV — Bits 5-7 of IAR | BYTE 1 bits 0–3: OP — ALU Control | BYTE 1 bits 4–7: CB — B-Entry Bit 3=1 | CB — B-Entry Bit 3=0 | BYTE 2 bit 0: 1 FM | BYTE 2 bit 1: 0 KK | BYTE 2 bit 2: 1 ND | BYTE 2 bit 3: 1 NB | BYTE 2 bits 4–7: CX — Bits 8-11 of IAR | BYTE 3 bits 0–3: CH — Branch High (IAR Bit 12) | BYTE 3 bits 4–7: CL — Branch Low (IAR Bit 13) | |
|---|---|---|---|---|---|---|---|---|---|---|---|---|---|---|
| 0 | 0 | SA | | A Ω B→D | 0 | SA | | | | | | 0 | 0 | 0 |
| 1 | ST | SB | | A · B→D | ST | SB | | | | | | 1 | 1 | 1 |
| 2 | GD | SC | | A ⊻ B→D | GD | SC | | | | | | Carry | D=0 | 2 |
| 3 | TG | SD | | A + B→D | TG | SD | | | | | | ST0 | Index (ST1) | 3 |
| 4 | ND | GB | | A + B + C→DC | ND | GB | | | | | | ST2 | ST3C | 4 |
| 5 | NC | GA | | A − B + C→DC | NC | GA | | | | | | ST4 | ST5 | 5 |
| 6 | NB | TB | | A + B→DC | NB | TB | | | | | | ST6 | ST7 | 6 |
| 7 | TC | NA | | A − B + 1→DC | TC | NA | | | | | | BR0 | BR1 | 7 |
| 8 | GF | MB | | | GF | MB | | | | | | BR2* | BR3** | 8 |
| 9 | GE | TA | | | GE | TA | | | | | | BR4*** | BR-5**** | 9 |
| A | NF | TD | | | NF | TD | | | | | | BR6 | BR7 | A |
| B | NE | MA | | | NE | MA | | | | | | CHK-2 | SELTD | B |
| C | TF | MD | | | TF | MD | | | | | | COMMO | XFER/HLTIO | C |
| D | TE | GC | | | TE | GC | | | | | | ADDRO | SERVO/MULTI | D |
| E | MF | BR | | | MF | BR | | | | | | SUPPO | BFRDY/CUEND | E |
| F | ME | MC | | | ME | MC | | | | | | BOPAR+ | Chan B | F |

*During IMPL BR2 replaced by SECTR
**During IMPL BR3 replaced by BTRDY
***During In-Line Ops BR4 replaced by INLIN
****During In-Line Ops BR5 replaced by ILXEQ
+During In-Line, BOPAR replaced by ILACT Table of Bit Usage - Format C

| Hex Value in Field ↓ | Byte 0 bits 0–3: CW — Bits 0-3 of IAR and bits 4-7 of A-Bus | Byte 0 bits 4–7: CV — Bits 4-7 of IAR | Byte 1 bits 0–2: OP — ALU Control | Byte 1 bits 3–7: CB — B-Entry Bit 3 = 1 | CB — Bit 3 = 0 | Byte 2 bit 0: 1 FM | Byte 2 bit 1: 1 KK | Byte 2 bit 2: 1 ND | Byte 2 bit 3: 1 NB | Byte 2 bits 4–7: CX — Bits 8-11 of IAR | Byte 3 bits 0–3: CH — Branch High (IAR Bit 12) | Byte 3 bits 4–7: CL — Branch Low (IAR Bit 13) | |
|---|---|---|---|---|---|---|---|---|---|---|---|---|---|
| 0 | | | A Ω B→D | 0 | SA | | | | | | 0 | 0 | 0 |
| 1 | | | A · B→D | ST | SB | | | | | | 1 | 1 | 1 |
| 2 | | | A ⊻ B→D | GD | SC | | | | | | Carry | D = 0 | 2 |
| 3 | | | A + B→D | TG | SD | | | | | | ST0 | Index(ST1) | 3 |
| 4 | | | A + B+C→DC | ND | GB | | | | | | ST2 | ST3C | 4 |
| 5 | | | A − B+C→DC | NC | GA | | | | | | ST4 | ST5 | 5 |
| 6 | | | A + B→DC | NB | TB | | | | | | ST6 | ST7 | 6 |
| 7 | | | A − B+1→DC | TC | NA | | | | | | BR0 | BR1 | 7 |
| 8 | | | ↑ No effective ALU (Suppress D-Bus) | GF | MB | | | | | | BR2* | BR3** | 8 |
| 9 | | | | GE | TA | | | | | | BR4*** | BR-5**** | 9 |
| A | | | | NF | TD | | | | | | BR6 | BR7 | A |
| B | | | | NE | MA | | | | | | CHK-2 | SELTD | B |
| C | | | | TF | MD | | | | | | COMMO | XFER/HLTIO | C |
| D | | | | TE | GC | | | | | | ADDRO | SERVO/MULTI | D |
| E | | | | MF | BR | | | | | | SUPPO | BFRDY/CUEND | E |
| F | | | | ME | MC | | | | | | BOPAR+ | Chan B | F |

*During IMPL BR2 replaced by SECTR
**During IMPL BR3 replaced by BTRDY
***During In-line Ops BR4 replaced by INLIN
****During In-Line Ops BR5 replaced by ILXEQ
+During In-Line, BOPAR replaced by ILACT Table of Bit Usage - Format D

| BYTE 0 bits 0–3 | BYTE 0 bits 4–7 | BYTE 1 bits 0–2 | BYTE 1 bit 3 | BYTE 1 bits 4–7 | BYTE 2 bit 0 | BYTE 2 bit 1 | BYTE 2 bit 2 | BYTE 2 bit 3 | BYTE 2 bits 4–7 | BYTE 3 bits 0–3 | BYTE 3 bits 4–7 |
|---|---|---|---|---|---|---|---|---|---|---|---|
| CA | CS | OP | 0 | CB/CD | 0 | 0 | 0 | 0 | CX | CH | CL |
| CA | CS | OP | 0 | CD | 0 | 0 | 0 | 1 | CX | CH | CL |
| CA | CS | OP | 0 | CB | 0 | 0 | 1 | 0 | CX | CH | CL |
| CK | CS | OP | 0 | CB/CD | 0 | 1 | 0 | 0 | CX | CH | CL |
| CK | CS | OP | 0 | CD | 0 | 1 | 0 | 1 | CX | CH | CL |
| CK | CS | OP | 0 | CB | 0 | 1 | 1 | 0 | CX | CH | CL |
| CK gated to | | | ME | | FM | KK | ND | NB | Bits 8-11 of IAR | Branch High | Branch Low |

| Hex Value Field ↓ | A-Reg per byte 2, bit 7 A-Entry | Status Set/Reset | ALU Control | B-Entry and Destinatin | FM | KK | ND/NB | Bits 8-11 of IAR | Branch High (IAR Bit 12) | Branch Low (IAR Bit 13) | |
|---|---|---|---|---|---|---|---|---|---|---|---|
| 0 | 0 | | A Ω B→D | SA | Specifies | Defines | Defines | If format | 0 | 0 | 0 |
| 1 | GC | 1→ST1 | A · B→D | SB | | | | specifies CK | 1 | 1 | 1 |
| 2 | ND | DNST21 | A ∀ B→D | SC | | | | field for A-Bus | Carry | D = 0 | 2 |
| 3 | NC | 1→ST3C | A + B→D | SD | that | bits | bits | entry: | ST0 | Index (ST1) | 3 |
| 4 | TD | 1→ST0 | A + B +C→DC | GB | | | | CX(7)=0 if K<16. | ST2 | ST3C | 4 |
| 5 | TC | 1→ST5 | A − B+ C→DC | GA | format | 0-3 | 3-7 | This directs CK | ST4 | ST5 | 5 |
| 6 | MD | 1→ST6 | A + B→DC | TB | | | | field to A-Reg. | ST6 | ST7 | 6 |
| 7 | MC | 1→ST7 | A − B + 1→DC | NA | is not | of | of | bits 4-7 | BR0 | BR1 | 7 |
| 8 | GB | 0→ST4 | | MB | | | | | BR2* | BR3** | 8 |
| 9 | GA | 0→ST1 | | TA | A,B, | byte 0 | byte 1 | CX(7)=1 if K>15. | BR4*** | BR-5**** | 9 |
| A | NB | 0→ST2 | | TD | | | | This directs CK | BR6 | BR7 | A |
| B | NA | 0→ST3C | | MA | | | | field A-Reg | CHK-2 | SELTD | B |
| C | TB | 0→ST0 | | MD | or | | | bits 0-3 | COMMO | XFER/HLTIO | C |
| D | TA | 0→ST5 | | GC | | | | | ADDRO | SERVO/MULTI | D |
| E | MB | 0→ST6 | | BR | C | | | | SUPPO | BFRDY/CUEND | E |
| F | MA | 0→ST7 | | MC | | | | | BOPAR+ | Chan B | F |

*During IMPL BR2 replaced by SECTR
**During IMPL BR3 replaced by BTRDY
***During In-Line Ops BR4 replaced by INLIN
****During In-Line Ops BR5 replaced by ILXEQ
+During In-Line, BOPAR replaced by ILACT Table of Bit Usage - Format E

| Hex Value In Field ↓ | BYTE 0 (0 1 2 3 4 5 6 7) CA A-Entry | CS Status Set-Reset | BYTE 1 (0 1 2 3 4 5 6 7) OP ALU Control | 0 ME | CB/CD B-Entry and Destination | BYTE 2 (0 1 2 3 4 5 6 7) 0 0 1 1 FM KK ND NB | Ignored | BYTE 3 Ignored |
|---|---|---|---|---|---|---|---|---|
| 0 | 0 | | A ∩ B → D | | SA | | | |
| 1 | GC | 1 → ST1 | A • B → D | | SB | | | |
| 2 | ND | DNST21 | A   B → D | | SC | | | |
| 3 | NC | 1 → ST3C | A + B → D | | | | | |
| 4 | TD | 1 → ST0 | A + B + C → DC | | GB | | | |
| 5 | TC | 1 → ST5 | A − B + C → DC | | GA | | | |
| 6 | MD | 1 → ST6 | A + B → DC | | TB | | | |
| 7 | MC | 1 → ST7 | A − B + 1 → DC | | NA | | | |
| 8 | GB | 0 → ST4 | | | MB | | | |
| 9 | GA | 0 → ST1 | | | TA | | | |
| A | NB | 0 → ST2 | | | TD | | | |
| B | NA | 0 → ST3C | | | MA | | | |
| C | TB | 0 → ST0 | | | MD | | | |
| D | TA | 0 → ST5 | | | GC | | | |
| E | MB | 0 → ST6 | | | BR | | | |
| F | MA | 0 → ST7 | | | MC | | | |

Table of Bit Usage - Format F

| Hex Value in Field ↓ | BYTE 0 (0 1 2 3 4 5 6 7) SPEC OP | CS Status Set/Reset | BYTE 1 (0 1 2 3 4 5 6-7) No effective ALU | 0 ME | BYTE 2 (0 1 2 3 4 5 6) SPEC OP | 0 1 1 1 FM KK ND NB | BFRDY/CUEND CX Bits 8–11 of IAR | BYTE 3 (0 1 2 3 4 5 6 7) CH Branch High (IAR Bit 12) | | CL Branch Low (IAR Bit 13) | |
|---|---|---|---|---|---|---|---|---|---|---|---|
| 0 | | | | | | | | 0 | 0 | | 0 |
| 1 | | 1 → ST1 | | | | | | 1 | 1 | | 1 |
| 2 | | DNST21 | | | | | | Carry | D = 0 | | 2 |
| 3 | 1 → ST3C | ST0 | | | | | | Index (ST1) | 3 | | |
| 4 | 1 → ST0 | ST2 | | | | | | ST3C | 4 | | |
| 5 | 1 → ST5 | ST4 | | | | | | ST5 | 5 | | |
| 6 | 1 → ST6 | ST6 | | | | | | ST7 | 6 | | |
| 7 | 1 → ST7 | BR0 | | | | | | BR1 | 7 | | |
| 8 | 0 → ST4 | BR2* | | | | | | BR3** | 8 | | |
| 9 | 0 →9 ST1 | BR4 | | | | | | BR-5 | 9 | | |
| A | 0 → ST2 | BR6 | | | | | | BR7 | A | | |
| B | 0 → ST3C | CHK-2 | | | | | | SELTD | B | | |
| C | 0 → ST0 | COMMO | | | | | | XFER/-HLTIO | C | | |
| D | 0 → ST5 | ADDRO | | | | | | SER-VO/-MULTI | D | | |
| E | 0 → ST6 | SUPPO | | | | | | BER-DY/-CUEND | E | | |
| F | 0 → ST7 | BOPAR+ | | | | | | Chan B | F | | |

*During IMPL BR2 replaced by SECTR
**During IMPL BR3 replaced by BTRDY
+ After Sp Op 19 BOPAR replaced by ILACT Table of Bit Usage - Format 1

| Hex Value in Field ↓ | BYTE 0: 0 1 2 3 | BYTE 0: 4 5 6 7 | BYTE 1: 0 1 2 | BYTE 1: 3 | BYTE 1: 4 5 6 7 | BYTE 2: 0 1 2 3 | BYTE 2: 4 5 6 7 | BYTE 3: 0 1 2 3 | BYTE 3: 4 5 6 7 | |
|---|---|---|---|---|---|---|---|---|---|---|
| | CK | CS | ML | 1 | CB/CD | 0 1 0 0 | CX | CH | CL | |
| | CK | CS | ML | 1 | CB/CD | 0 1 0 1 | CX | CH | CL | |
| | CK | CS | ML | 1 | CB/CD | 0 0 0 0 | CX | CH | CL | |
| | A-Bus Bits 4-7 | Status Set/Reset | DAR bits 5-7 | ME | B-Entry and Destination, and DAR Bits 8-15 | FM KK ND NB | Bits B-11 of IAR | Branch High (IAR Bit 12) | Branch Low (IAR Bit 13) | |
| 0 | | | | | 0 | | | 0 | 0 | 0 |
| 1 | | 1 → ST1 | | | ST | | | 1 | 1 | 1 |
| 2 | | DNST21 | | | GD | | | Carry | D = 0 | 2 |
| 3 | | 1 → ST3C | | | TG | | | ST0 | Index (ST1) | 3 |
| 4 | | 1 → ST0 | | | ND | | | ST2 | ST3C | 4 |
| 5 | | 1 → ST5 | | | NC | | | ST4 | ST5 | 5 |
| 6 | | 1 → ST6 | | | NB | | | ST6 | ST7 | 6 |
| 7 | | 1 → ST7 | | | TC | | | BR0 | BR1 | 7 |
| 8 | | 0 → ST4 | | | GF | | | BR2* | BR3** | 8 |
| 9 | | 0 → ST1 | | | GE | | | BR4*** | BR-5**** | 9 |
| A | | 0 → ST2 | | | NF | | | BR6 | BR7 | A |
| B | | 0 → ST3C | | | NE | | | CHK-2 | SELTD | B |
| C | | 0 → ST0 | | | TF | | | COMMO | XFER/HLTIO | C |
| D | | 0 → ST5 | | | TE | | | ADDRO | SERVO/MULTI | D |
| E | | 0 → ST6 | | | MF | | | SUPPO | BFRDY/CUEND | E |
| F | | 0 → ST7 | | | ME | | | BOPAR+ | Chan B | F |

*During IMPL BR2 replaced by SECTR
**During IMPL BR3 replaced by BTRDY
***During In-Line Ops BR4 replaced by INLIN
****During In-Line Ops BR5 replaced by ILXEQ
+During In-Line, BOPAR replaced by ILACT Table of Bit Usage - Format 2

| Hex Value in Field | BTYE 0: 0 1 2 3 | BTYE 0: 4 5 6 7 | BYTE 1: 0 1 2 | BYTE 1: 3 | BYTE 1: 4 5 6 7 | BYTE 2: 0 | BYTE 2: 1 | BYTE 2: 2 | BYTE 2: 3 | BYTE 2: 4 5 6 7 | BYTE 3: 0 1 2 3 | BYTE 3: 4 5 6 7 | |
|---|---|---|---|---|---|---|---|---|---|---|---|---|---|
| | MH | CS | ML | 1 | CB | 0 | 1 | 1 | 0 | CX | CH | CL | |
| | MH | CS | ML | 1 | CB | 0 | 1 | 1 | 1 | CX | CH | CL | |
| | DAR Bits 1-4 and A-bus | Status Set/Reset | DAR Bits 5-7 | ME | B-Entry | FM | KK | ND | NB | Bits 8-11 of IAR | Branch High (IAR Bit 12) | Branch Low (IAR Bit 13) | |
| 0 | Bits 4-7 | | | | 0 | | | | | | 0 | 0 | 0 |
| 1 | | 1 → ST1 | | | ST | | | | | | 1 | 1 | 1 |
| 2 | | DNST21 | | | GD | | | | | | Carry | D = 0 | 2 |
| 3 | | 1 → ST3C | | | TG | | | | | | ST0 | Index (ST1) | 3 |
| 4 | | 1 → ST0 | | | ND | | | | | | ST2 | ST3C | |
| 5 | | 1 → ST5 | | | NC | | | | | | ST4 | ST5 | 5 |
| 6 | | 1 → ST6 | | | NB | | | | | | ST6 | ST7 | 6 |
| 7 | | 1 → ST7 | | | TC | | | | | | BR0 | BR1 | 7 |
| 8 | | 0 → ST4 | | | GF | | | | | | BR2* | BR3** | 8 |
| 9 | | 0 → ST1 | | | GE | | | | | | BR4*** | BR-5**** | 9 |
| A | | 0 → ST2 | | | NF | | | | | | BR6 | BR7 | A |
| B | | 0 → ST3C | | | NE | | | | | | CHK-2 | SELTD | B |
| C | | 0 → ST0 | | | TF | | | | | | COMMO | XFER/HLTIO | C |
| D | | 0 → ST5 | | | TE | | | | | | ADDRO | SERVO/MULTI | D |
| E | | 0 → ST6 | | | MF | | | | | | SUPPO | BFRDY/CUEND | E |
| F | | 0 → ST7 | | | ME | | | | | | BOPAR+ | Chan B | F |

*During IMPL BR2 replaced by SECTR
**During IMPL BR3 replaced by BTRDY
***During In-Line Ops BR4 replaced by INLIN
****During In-Line Ops BR5 replaced by ILXEQ
+During In-Line, BOPAR replaced by ILACT Table of Bit Usage - Format 3

| Hex Value in Field ↓ | BYTE 0 (0 1 2 3) NH DAR bits 1-4 and A-bus bits 4-7 | BYTE 0 (4 5 6 7) CS Status Set/-Reset | BYTE 1 (0 1 2) ML DAR bits 5-7 | BYTE 1 (3) 1 ME | BYTE 1 (4 5 6 7) NL DAR bits 12-15 | BYTE 2 (0) 0 FM | BYTE 2 (1) 0 KK | BYTE 2 (2) 1 ND | BYTE 2 (3) 0 NB | BYTE 2 (4 5 6 7) CX Bits 8-11 of IAR | BYTE 3 (0 1 2 3) CH Branch High (IAR Bit 12) | BYTE 3 (4 5 6 7) CL Branch Low (IAR Bit 13) | |
|---|---|---|---|---|---|---|---|---|---|---|---|---|---|
| 0 | | | | | | | | | | | 0 | 0 | 0 |
| 1 | | 1 → ST1 | | | | | | | | | 1 | 1 | 1 |
| 2 | | DNST21 | | | | | | | | | Carry | D = 0 | 2 |
| 3 | | 1 → ST3C | | | | | | | | | ST0 | Index (ST1) | 3 |
| 4 | | 1 → ST0 | | | | | | | | | ST2 | ST3C | 4 |
| 5 | | 1 → ST5 | | | | | | | | | ST4 | ST5 | 5 |
| 6 | | 1 → ST6 | | | | | | | | | ST6 | ST7 | 6 |
| 7 | | 1 → ST7 | | | | | | | | | BR0 | BR1 | 7 |
| 8 | | 0 → ST4 | | | | | | | | | BR2* | BR3** | 8 |
| 9 | | 0 → ST1 | | | | | | | | | BR4*** | BR-5**** | 9 |
| A | | 0 → ST2 | | | | | | | | | BR6 | BR7 | A |
| B | | 0 → ST3C | | | | | | | | | CHK-2 | SELTD | B |
| C | | 0 → ST0 | | | | | | | | | COMMO | XFER/HLTIO | C |
| D | | 0 → ST5 | | | | | | | | | ADDRO | SERVO/MULTI | D |
| E | | 0 → ST6 | | | | | | | | | SUPPO | BFRDY/CUEND | E |
| F | | 0 → ST7 | | | | | | | | | BOPAR+ | Chan B | F |

*During IMPL BR2 replaced by SECTR
**During IMPL BR3 replaced by BTRDY
***During In-Line Ops BR4 replaced by INLIN
****During In-Line OPS BR5 replaced by ILXEQ
+During In-Line, BOPAR replaced by ILACT In addition to the above-listed operations, directors 16 and controls 17 have special operations; that is, the same micro order performs different functions in the various machines in accordance with hardware connections which use register assignments also defined below. In the two tables below, the special operations used in connection with the FIG. 1 illustrated apparatus are set forth.

Special Operations for MSC 17

| Dec. | Hex | Special Operation | Dec. | Hex | Special Operation |
|---|---|---|---|---|---|
| 0 | 0 | Microprogram Stop | 27 | 1B | Unused |
| 1 | 1 | Microprogram Stop in CE Error Stop Mode | 28 | 1C | Diagnostic Selective Reset |
| 2 | 2 | Set Extended Format 1 Mode and Load AMR from the ME Register | 29 | 1D | Unused |
| 3 | 3 | Reset Check 2 Errors | 30 | 1E | Reset INTERVAL TIMER CARRY Latch |
| 4 | 4 | Set Storage Diagnotic Mode | 31 | 1F | Unused |
| 5 | 5 | Reset Storage Diagnostic Mode | 32 | 20 | Reset ACTIVATE BACKUP MSC Latch |
| 6 | 6 | Load ACR Inline | 33 | 21 | Set ACTIVATE BACKUP MSC Latch |
| 7 | 7 | Inline/ILXEQ Branch | 34 | 22 | Unused |
| 8 | 8 | Stop MPL File | 35 | 23 | Unused |
| 9 | 9 | Start MPL File | 36 | 24 | Unused |
| 10 | A | MPL File Load SD Register | 37 | 25 | Unused |
| 11 | B | Reset Extended Format 1 Mode/ 38 | 26 | | Unused |
| 12 | C | Load Machine Type Code in ME Register | 39 | 27 | Initiate Auto IMPL |
| 13 | D | Load NC,ND,NE Registers - Check 2 | 40 | 28 | Unused |
| 14 | E | Load NA Register - Check 2 | 41 | 29 | Unused |
| 15 | F | Reset 500 ms Timer | 42 | 2A | Unused |
| 16 | 10 | Initialize Interval Timer | 43 | 2B | Unused |
| 17 | 11 | Reset DXFER Branch Latch | 44 | 2C | Unused |
| 18 | 12 | Gate Alternate Branch | 45 | 2D | Unused |
| 19 | 13 | Set TAG BRANCH Latch | 46 | 2E | Unused |
| 20 | 14 | Reset TAG BRANCH Latch | 47 | 2F | Unused |
| 21 | 15 | Unfreeze Channel Switch | 48 | 30 | Unused |
| 22 | 16 | Set POWER RAS INTERFACE STROBE Latch | 49 | 31 | Unused |
| 23 | 17 | Set ALTERNATE SPECIAL OPERATION LATCH | 50 | 32 | Unused |
| 24 | 18 | Gate Interval Timer Contents to MB Register | 51 | 33 | Unused |
| 25 | 19 | Unused | 52 | 34 | Gate Event Recorder Read Bust to MC Register |
| 26 | 1A | Freeze Channel Switch | 53 | 35 | Set Allow 4K Additional |
| | | | 54 | 36 | Reset Allow 4K Additional |

The special operations for directors 16 is similar. A main difference is the special operations for controlling the staging adapter.

Each instruction word has an operation code OP in connection with the arithmetic logic unit ALU 32. The ALU operations are set forth in the table below.

ALU Operations

| Mnemonic | OP Micro Order | Edge | Function |
|---|---|---|---|
| A ∩ B→D | 0000 | A | A-register ORed with B-register and the results placed on D-bus |
| A . B→D | 0001 | A | A-register ANDed with B-register and the results placed on D-bus |
| A   B→D | 0010 | A | A-reg. EXCLUSIVE ORed with the B-reg and the results placed on the D-bus |
| A + B→D | 0011 | A | A-reg. ADDed to the B-reb. and the results placed on the D-bus |

-continued

| | | | ALU Operations |
|---|---|---|---|
| Mnemonic | OP Micro Order | Edge | Function |
| A + B − C→DC | 0100 | A | A-reg. and B-reg. and present condition of Carry-In (ST3C) ADDed |
| A − B + C→DC | 0101 | A | ADD, Complement, Carry |
| A + B→DC | 0110 | A | A and B registers are added and results placed on D-bus. Set ST reg. bit 3 to 1 if carry occurred. |
| A − B + 1→D | 0111 | A | ADD twos complement (Subtract) |

Additionally, certain registers have greater significance in instructions words than others. These include the data address register DAR; IAL, the lower byte of the instruction address register used to drive program store; and IAR, the instruction address register.

Returning now to FIG. 3, the program store 31 supplies the instruction word to an instruction holding register 35, the outputs of which drive decode circuit 36 to supply a set of micro orders to all the units. Such decoder is constructed as is well known in the arts and serves to sequence operation of all of the units. A portion of the instruction word is feb back to IAR in the W and X registers for program branching and accessing the next instruction word from program store 31, as will become apparent.

Computing circuits 20 operations all center about ALU 32. It has two inputs, the A register and the B register. These two registers receive signals from funnels or assembly circuits AASM and BASM, respectively. The assembly circuits merely take the signals from a plurality of signal buses and gate same to the A and B registers under control of decode 36. Two of the input buses to the AASM and BASM are the A bus 36, which transfers signals from a set of microprogram registers 37 to the A register, and the B bus 38 which transfers signals to the B register from selected ones of the microprogram registers 37 and from the instruction word holding register 35. An important aspect of microprogramming computer circuits 20 is the assignment and construction of microprogram registers 37. A general arrangement of the microprogram registers is shown in the table below.

| Microprogram Registers 37 | | | | | |
|---|---|---|---|---|---|
| General Purpose Registers: | | | | | |
| GA | GB | GC | GD | | |
| NA | NB | NC | ND | | |
| TA | TB | TC | TD | | |
| MA | MB | MC | MD | | |
| Special Purpose Registers: | | | | | |
| SA, SB, SC, SD: | | | | Inputs = | Control store, D bus, external |
| | | | | Outputs = | Control store, B bus, external |
| BR (Branch Register): | | | | Input = | D bus |
| | | | | Output = | B bus, control store address decode |
| ST (Status Register): | | | | Input = | D bus, condition sense |
| | | | | Output = | B bus, external |

Not only must the assignment of the microprogram registers to the general classes be understood, but also the specific application of the registers 37 to execution of the microprogram sequences must be known. As used in directors 16 and control 17, the utilization of the microprogram registers 37 is set forth in the table below. The term "control unit" refers to the circuits associated with decode 36 which includes an oscillator and sets of registers (not shown) for controlling the sequencing of the microprogram, all in accordance with known computer techonology therefore not further described.

| | | Register Assignments | |
|---|---|---|---|
| From | Register Position | Meaning | To |
| | MA 0 | | SERDES |
| | MA 1 | | |
| | MA 2 | | |
| | MA 3 | | |
| Control Unit | MA 4 | Write Data To Device | |
| | MA 5 | | |
| | MA 6 | | |
| | MA 7 | | |
| | MA P | | |
| | MA 0 | | Control Unit |
| | MA 1 | | |
| | MA 2 | | |
| Device | MA 3 | Read Data From Device | |
| | MA 4 | | |
| | MA 5 | | |
| | MA 6 | | |
| | MA 7 | | |
| | MA P | | |
| | MA 0 | P O Low not equal to P 3 or parity unequal. | |
| | MB 1 | P O Low not equal to P 3. | |
| | MB 2 | P O Low not equal to P 2 or parity unequal. | |
| | MB 3 | P O Low not equal to P 2. | |
| ECC | MB 4 | P O Low not equal to P 1 or parity unequal. | Control Unit |
| | MB 5 | P O Low not equal to P 1. | |
| | MB 6 | P O Low not equal to 0. | |
| | MB 7 | P O Hi not equal to 0. | |
| | MB P | Generated Parity. | |
| | MD 0 | P O Bit 18 | |
| | MD 1 | P O Bit 17 | |
| | MD 2 | P O Bit 16 | |
| | MD 3 | P O Bit 15 | |
| ECC | MD 4 | P O Bit 14 | Control Unit |
| | MD 5 | P O Bit 13 | |

-continued

| Register Assignments | | | |
|---|---|---|---|
| From | Register Position | Meaning | To |
| | MD 6 | P O Bit 12 | |
| | MD 7 | P O Bit 11 | |
| | MD P | Generated Parity | |
| | MD 0 | Bus In 0 | |
| | MD 1 | Bus in 1 | |
| | MD 2 | Bus In 2 | |
| | MD 3 | Bus In 3 | |
| Control | MD 4 | Bus In 4 | Selected |
| Unit | MD 5 | Bus In 5 | Channel |
| | MD 6 | Bus In 6 | |
| | MD 7 | Bus In 7 | |
| | MD P | Bus in P | |
| | NA 0 | Bus Out 0 | |
| | NA 1 | Bus Out 1 | |
| | NA 2 | Bus Out 2 | |
| Selected | NA 3 | Bus Out 3 | Control Unit |
| Channel | NA 4 | Bus Out 4 | |
| | NA 5 | Bus OUt 5 | (Not Sp Op 14) |
| | NA 6 | Bus Out 6 | |
| | NA 7 | Bus Out 7 | |
| | NA P | Bus Out P | |
| Channel | NA 0 | Chan. A/B Buffer Parity Check | |
| Channel | NA 1 | Channel A Interface Check | |
| Channel | NA 2 | Channel B Interface Check | |
| Channel | NA 3 | Data Transfer Check | Control Unit |
| SERDES | NA 4 | SERDES*CUDI*ECC Check | (gated by |
| SERDES | NA 5 | PLO Check | Sp. Op. 14) |
| | NA 6 | Sector Counter Check, | |
| Channel | NA 7 | | |
| | NA P | Generated Parity | |
| CUDI | ND 0-7 | TD 01 = 00 | Control Unit |
| | ND 0 | CUDI Bus In 0 | |
| | ND 1 | CUDI Bus In 1 | |
| | ND 2 | CUDI Bus In 2 | |
| | ND 3 | CUDI Bus In 3 | |
| | ND 4 | CUDI Bus In 4 | |
| | ND 5 | CUDI Bus In 5 | |
| | ND 6 | CUDI Bus In 6 | |
| | ND 7 | CUDI Bus In 7 | |
| | ND P | CUDI Bus In P | |
| | | TD 01 = 01 | |
| | ND 0 | Drive Sel Failure | |
| | ND 1 | Tag Invalid | |
| | ND 2 | Device Check | |
| | ND 3 | CUDI Bus Out Check | |
| | ND 4 | CUDI Bus In Check | |
| | ND 5 | CUDI Tag Bus Check | |
| | ND 6 | | |
| | ND 7 | Not Used | |
| | ND P | Generated Parity | |
| | | TD 01 = 10 | |
| | ND 0 | CU Physical Address | |
| | ND 1 | CU Physical Address | |
| | ND 2 | Selected Module 3/6 0 | |
| | ND 3 | Selected Module 3/6 1 | |
| | ND 4 | Selected Module 3/6 2 | |
| | ND 5 | Selected Module 3/6 3 | |
| | ND 6 | Selected Module 3/6 4 | |
| | ND 7 | Selected Module 3/6 5 | |
| | ND P | Generated Parity | |
| | SC 0 | ECC Error - No input data received. | |
| | SC 1 | ECC Error - P O or Write | |
| | SC 2 | ECC Error - P 1 or P 3 | |
| | SC 3 | ECC Error - P 2 | |
| ECC | SC 4 | Not Used | Control Unit |
| | SC 5 | Not Used | (gated by |
| | SC 6 | Not Used | Sp. Op. 15) |
| | SC 7 | Not Used | |
| | SC P | Generated Parity | |
| CUDI | SD 0 | CUDI Unsafe (use TD decode 01) | |
| SERDES | SD 1 | Write Parity Check | |
| SERDES | SD 2 | Read Parity Check | |
| SERDES | SD 3 | Bit Ring Check | Control Unit |
| SERDES | SD 4 | Write Compensation Check | (gated by |
| ECC | SD 5 | Error 2 in ECC (ECC Check) | Sp. Op. 13) |
| SERDES | SD 6 | VFO Check - missing PLO pulses. | |
| SERDES | SD 7 | VFO Phase Check | |
| | SD P | Generated Parity | |
| | TA 0 | CUDI Bus Out 0 | |
| | TA 1 | CUDI Bus Out 1 | |
| | TA 2 | CUDI Bus Out 2 | |
| | TA 3 | CUDI Bus Out 3 | |
| Control | TA 4 | CUDI Bus Out 4 | Tag modifiers |
| Unit | TA 5 | CUDI Bus Out 5 | To CUDI |
| | TA 6 | CUDI Bus Out 6 | |
| | TA 7 | CUDI Bus Out 7 | |
| | TA P | CUDI Bus Out P | |
| | TB 0 | Module Select Gate | CUDI |
| | TB 1 | Tag Gate | CUDI |

-continued

Register Assignments

| From | Register Position | Meaning | To |
|---|---|---|---|
| | TB 2 | Enable Tag Valid Check | CUDI |
| Control Unit | TB 3 | Long Select | CU |
| | TB 4 | Protect NA register | CU |
| | TB 5 | ECC Control A } * | ECC |
| | TB 6 | ECC Control B | ECC |
| | TB 7 | ECC Conrol C | ECC |
| | TB P | | |
| | TC 0 and TC 1 | 00 Not used | |
| | | 01 Channel Read Control | |
| | | 10 Channel Write Control | |
| | | 11 Freeze Transfer | |
| Control Unit | TC 2 | Last byte request | Channel |
| | TC 3 | Operational In | |
| | TC 4 | Address In | |
| | TC 5 | Status In | |
| | TC 6 | Non-suppressible Request In - Channel A | |
| | TC 7 | Suppressible Request In - Channel A | |
| | TD 0 and TD 1 | 00=CUDI Bus In | CUDI |
| | | 01=CUDI Check Conditions | |
| | | 10=3 of 6 Code and CU Physical Address | CUDI |
| | TD 2 | | |
| | TD 3 | | |
| Control Unit | TD 4 | Decode 8 Bit } | DRV |
| | TD 5 | Decode 4 Bit } CUDI | DRV |
| | TD 6 | Decode 2 Bit } Tag | DRV |
| | TD 7 | Decode 1 Bit } Bus | DRV |
| | TD P | Parity for Tag Bus } | |
| | TG 0 and TG 1 | 01=Lock VFO To PLO | SERDES |
| | | 10=Lock VFO To Data | SERDES |
| | | 11=Fast PLO Lock In, | SERDES |
| | TG 2 | Separate Data Sync (write address mark, when write gate on). | DRV |
| | TG 3 (0) | Disable CU end A - Enable CU end B | SERDES |
| Control Unit | TG 3 (1) | Enable CU end A - Disable DU end B | Channel |
| | TG 4 | Block SW to Channel A | |
| | TG 5 | Block SW to Channel B | Channel |
| | TG 6 | Non-suppressible Request in Channel B | Channel |
| | TG 7 | Suppressible Request in Channel B | Channel |
| | TG P | | |
| | TG 0 | Engage MPL File Head | |
| | TG 1 | Move MPL One Track In | |
| | TG 2 | Move MPL One Track Out | |
| CU (gated by MPL latch) | TG 3 | MPL File Start Read | MPL File |
| | TG 4 | | |
| | TG 5 | | |
| | TG 6 | | |
| | TG 7 | | |
| | TG P | | |
| | Sp Op 0 | PGM-STOP Statement | Clock |
| | Sp Op 1 | CHK-STOP Statement | Clock |
| | Sp Op 2 | | |
| | Sp Op 3 | Error 2 Reset to User | CHL-SERDES |
| | Sp Op 4 | Gate Read Error Pattern to NB | Ctrl. Stor. |
| | SP Op 5 | Reset Storage Error Register | Ctrl. Stor. |
| | Sp Op 6 | Set Addr Comp from SA & SB | CE Controls |
| | Sp Op 7 | INLIN (In-line) Branch in CE Mode | Br. Controls |
| | Sp Op 7 | ILXEQ (Data Entry) Branch in CE Mode | Br. Controls |
| | Sp Op 8 | Stop MPL Operations | MPL File |
| | Sp Op 9 | Start MPL Operations | MPL File |
| | Sp Op 10 | Gate MPL Data to D Bus | MPL File |
| | Sp Op 11 | | |
| | Sp Op 12 | | |
| | Sp Op 13 | Gate SERDES Errors to SD | SERDES |
| | Sp Op 14 | Control Errors to NA | Channel |
| CU | Sp Op 15 | Gate ECC Errors to SC | ECC |
| | Sp Op 16 | Shift P 0 (if ECC decode = Allow Decode Write, also shifts P 1, P 2, and P 3) | |
| | Sp Op 17 | Shift P 1, P 2, and P 3 | |
| | Sp Op 19 | Set INLINE Active Latch | CE |
| | Sp Op 20 | Reset INLINE Active Latch | CE |
| | Sp Op 21 | Unfreeze Channel Switch - Allow Disable | Channel |
| | Sp Op 22 | Allow Disable A | |
| | Sp Op 23 | Allow Disable B | |
| | Sp Op 24 | Load Sector Counter to SA and SB | |
| | Sp Op 25 | | |
| | Sp Op 26 | Freezer Channel Switch | |
| | Sp Op 27 | | |
| | Sp Op 28 | | |
| | Sp Op 29 | | |
| | So Op 30 | | |
| | Sp Op 31 | | |

-continued

| | | Register Assignments | |
|---|---|---|---|
| From | Register Position | Meaning | To |
| ECC CONTROL DECODES | | | |

| A | B | C | Meaning |
|---|---|---|---|
| 0 | 0 | 0 | Reset |
| 0 | 0 | 1 | Read |
| 0 | 1 | 0 | Write Data |
| 0 | 1 | 1 | Write Burst Code |
| 1 | 0 | 0 | Not Used |
| 1 | 0 | 1 | Allow Decode Read |
| 1 | 1 | 0 | Not Used |
| 1 | 1 | 1 | Allow Decode Write |

Another factor is the accessing of the program store, particularly through the address register IAR. In the table below, the term "latched" means it is held over from the previous instruction word, i.e., not changed. The program store has a two-byte instruction address register IAR having the bit assignments set forth in the table below.

Program Store Address Register Inputs
Byte 0 (Type Instruction D-3 Latched, Bit 0 = 0)

| | Type | Bits | Input |
|---|---|---|---|
| | A | 0 | 0 |
| | | 1-3 | Latched |
| | | 4-7 | Latched/CV |
| | B | 0 | 0 |
| | | 1-4 | Latched |
| | | 5-7 | CV |
| | C | 0 | 0 |
| | | 1-3 | CW |
| | | 4-7 | CV |
| Byte 1: | | | |
| | A-D | 8-11 | CX |
| | F-3 | 12 | CH |
| | | 13 | CL |
| | | 14, 15 | 0 |
| | E | All | CB |

Data Address Register (Control Registers)

| Type | bits | Input |
|---|---|---|
| 1a-1c | 0-4 | 0 |
| | 5-7 | ML |
| | 8-15 | CB |
| 2a-2b | 0 | 0 |
| | 1-4 | MH |
| | 5-7 | ML |
| | 8-15 | CB |
| 3 | 0-4 | 0 |
| | 5-7 | ML |
| | 8-11 | NH |
| | 12-15 | NL |

As set forth above, the microprogram registers 37 supply signals to ALU 32 and also receive signals from ALU 32 via D bus 40. Registers 37 also supply signals in directors 16 to SERDES 30 and in control 17 to the channels 22. Hence, the data loop in computer circuits 20 includes ALU 32, D bus 40, microprogram registers 37, A and B buses 36 and 38, and the A and B registers. It should be noted that the inputs from program store 31 to ALU 32 is via the B bus. All communications in the computer circuits flow through ALU 32. For example, D bus 40 also goes to the IG register which then supplies signals to channel circuits 41 which, in turn, are connected to one of the hosts 19. Channel circuits 41 are those channel circuits defined as a control unit in U.S. Pat. No. 3,400,372, supra, and are those used in connection with the Type 370 computer manufactured by International Business Machines Corporation. Further examination of FIG. 3, along with the charts above, will clearly show the data flow of computer circuits 20, it being understood that this arrangement is essentially the same as that shown and used by International Business Machines Corporation in the 3803 Model II Director Unit.

Director 16 has what is termed a "staging adapter," that is, a buffer system which connects DRD's and DRC's 13 to the DASD controller 15. Because tape units operate at different rates than disk storage spindles 14, a buffer memory 42 of the count-up/count-down type is interposed between the SERDES 30 which is a connection to the DASD units, as previously explained, and buffer memory 42. Buffer memory 42 includes independent control circuits known in the buffering art for automatically transferring signals to the DRC 13 and for receiving signals from DRC 13 while simultaneously exchanging signals with DASD controllers via SERDES 30. All of this operation is independent of computer circuits 20 of director 16. It should be noted that computer circuits 20 are involved in transfer of signals from DASD spindle 14 to the host computer 19 via the SERDES as was practiced in the International Business Machines Corporation manufactured 3803 Model II Director Unit. Buffer memory 42 has two parts which are alternately used. A first part receives signals from DRC 13, while the second part simultaneously supplies signals to SERDES 30. When the transfers are completed, the operations are switched such that the first part is then supplying signals to SERDES 30; while the second part receives signals from DRC 13 for providing an uninterrupted exchange of data signals. The same operation is provided in moving data from the DASD spindle 14 to DRD 12. Since such buffer memory operations are well known, they are not further described.

Microprogram Instruction Representation

Figure 5:
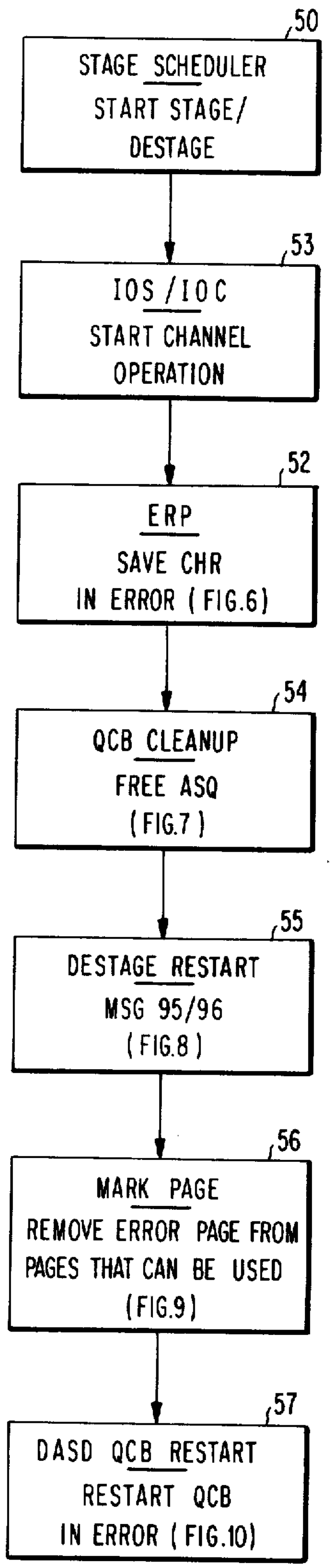
FIG. 5 is an overall flow diagram of one embodiment of the invention.

Referring to FIG. 5, the tabular representation of instruction words, as defined above, is shown in diagrammatic form. The format is amenable to computer printout for identifying the instruction layout in program store 31. Generally, the left side is the input side; and the right side is the output side. That is, entry into an instruction execution is represented at the left side. The movement to the next instruction is represented at the right side. First discussing the input side, the leg identifier means entry from another instruction execution when certain branch conditions have been satisfied. That is, if there are a plurality of instructions which can be executed from a four-way branch, then there will be four blocks as shown in FIG. 5, each with a different leg identifier, respectively, indicating branch conditions required for entry into the block. Note the relationship to the instruction address register. The second line refers to the K fields of the instruction word. When the field is CK, the numerical signal contents of that field are used directly by the instruction. That is, this constant is supplied to the A bus and may be decimal or binary. The third line of the instruction block has the edge identifier A referred to above in the various tables. In A, the ALU statement, as defined above, is inserted. This includes the operation code with the exceptions noted for the various types of instruction words. The fourth line is identified by edge D. The fifth line, identified by edge C, has the bit control for the status register ST of registers 37. The sixth line is identified by edge B and contains a so-called "high branch" corresponding to the CH field of the instruction word. The bottom line is merely a geographical representation of where the box is located on the printout and tables, as will become apparent in the micro code tables used below.

Going to the upper side of the block symbol, the high branch satisfied corresponds to the CH field and the low branch condition corresponds to the CL field.

Going to the output side, or the righthand side, in row 1, the hexaddress represents the content of the instruction address register IAR used to access the instruction word represented by the tabulation. In the second line, the mode indicates the format code as set forth in the tables above. In the fourth line, the data statement or DAR addressing is a continuation of the edge D field. The data control in the next row indicates whether there should be a fetch or store of data. In the sixth line, the righthand side of the branch row contains the low branch which is specified by the CL field. The F field is the feature code; that is, certain particular functions may be added to a microprocessor with these additional functions called "features". In the bottom line is the box serial number (alphanumeric), plus a leg selector (branch condition) for going to the next instruction word. The lines interconnect the graphical tabulations for showing sequence flow of the microprogram. Further on in the detailed description, this will be more clearly pointed out.

Microprogram Flow

Only that portion of the microprogram in control 17 that pertains to the function of the present invention is described in detail. All of the other micro code is resident in machines manufactured by International Business Machines Corporation known as the 3803 Model III (control 17) and the 3803 Model II with staging adapter feature for the director 16. The microprocessor computer circuits 20 contain a supervisory program called a known "scheduler" (as at 50 of FIG. 5) which provides multitasking and multiprocessing within the computer circuits.

The scheduler invokes a microprogram which initiates a destage operation; i.e., orders are sent from MSC 17 to director 16 to read signals from a specific set of tracks from a specific DASD spindle 14. MSC 17 also orders a DRC, DRD to receive signals from the DASD spindle 14 to record same on tape. The buffer in director 16 is activated to automatically transfer the signals being destaged. The actual programs in MSC 17 for initiating and supervising these operations are termed IOS/IOC of box 53. Detailed understanding is not pertinent to the invention, it being understood that operational control as defined above is initiated and maintained by MSC 17.

Figure 6:
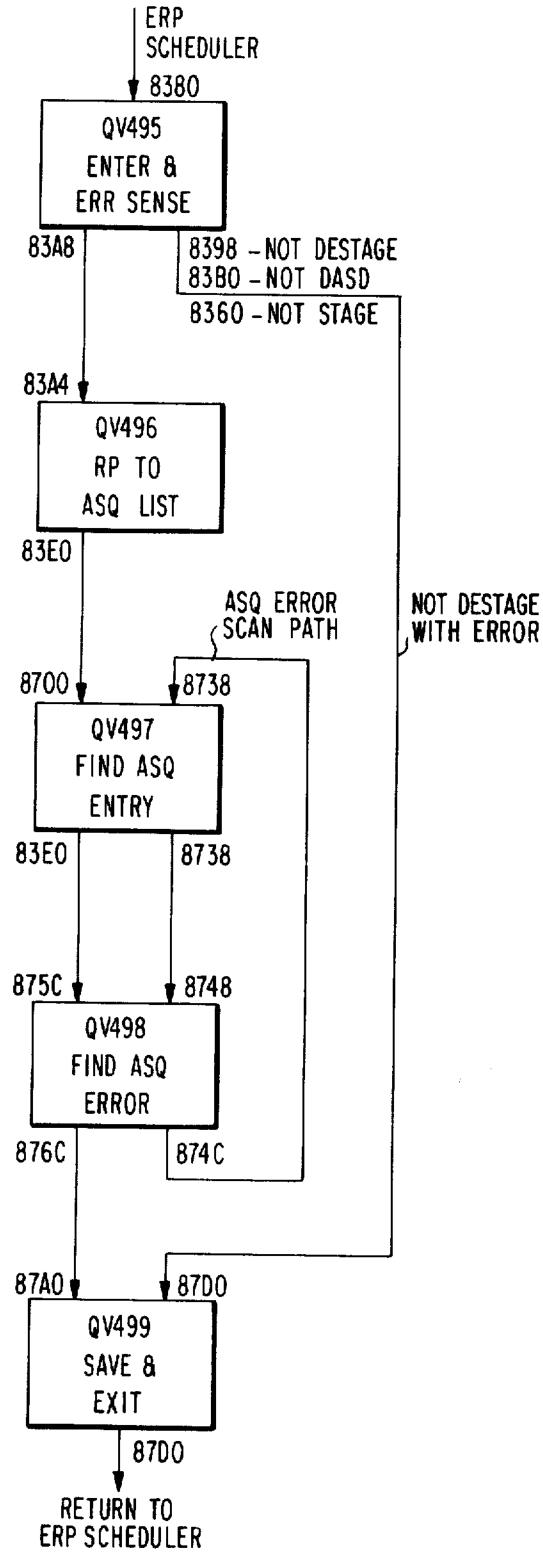
FIG. 6 is a flow diagram of error recovery microprogram steps for detecting an attempted destage with error.

Assume a destage operation has been initiated by MSC 17 and a DASD read error has occurred during a destage. Such error stops the read operation as in all prior DASD apparatus. That is, the error location (DASD spindle address and CCHHR) are recorded in a memory of director 16 plus a host 19; and error recovery procedures (ERP) are automatically invoked, such as at 52. The ERP is also a set of microprograms for defining recovery steps. The ERP also has a scheduler for selecting which program is to be executed. For brevity, the detailed description and FIG. 6 showing is limited to that program particularly pertinent to the invention; any known method for invoking a program execution may be employed. The portion of the present invention relating generally to an ERP is saving the CHR (cylinder, head, and record) associated with the DASD read error; i.e., location of the error in MSC 17. Note old DASD ERP's in director 16 already have saved the CHR for a host 19.

Steps 54, 55, 56, and 57 show the present invention. Step 54 of FIG. 7 changes the queue control block (QCB) of MSC 17 as well as releasing a so-called "ASQ" (later described) in MSC 17 for use by other MSS operations. These actions prepare MSC 17 to enter step 55 of FIG. 8 wherein messages are sent to primary host 17 and director 16 to MSS for restarting destaging after a DASD read error. This includes an order to swap disk packs between spindles 14 for recovery. Corrective control action for DASD is taken in step 56 (FIG. 9) wherein the page (eight DASD cylinders) having an error is controlled, as will become apparent. Finally, at 57 (FIG. 10), destaging is put in a QCB for destaging with a DASD read error to record all data in the same format on tape by DRD. Swapping packs may incidentally remove the read error — which means all data is now correct.

FIGS. 6–10 are simplified flowcharts showing the micro code used to initiate and control the operation of the MSS for implementing the methodology of the present invention. Each of the flowchart boxes correspond to the table number indicated in the box. For example, QV495 of FIG. 6 corresponds to table QV495 which is a tabulation of the code which shows the enter and error sensing of the ERP portion of the code for error recovery. The numeral 8380 indicates a memory address (hexidecimal) of the first instruction word of table QV495. In a similar manner, numeral 83A8 indicates the memory address of the instruction exiting the table QV495 which is directed to enter the flowchart box QV496 at address 83A4. Also, numerals 8398, 83B0, and 8360 are alternate exit points for entering flowchart box QV499. It is possible in certain flowchart steps that only one instruction is involved in a flowchart box. QV497 of FIG. 6 has an entrance instruction location of 8738, with the same instruction exiting at 8738 to QV498 at 8748.

ERP Entrance to Destage With Error

As mentioned above, the ERP micro code has its own scheduler. One of the programs invoked by the scheduler which operates in a normal manner is the destage with error programs. The ERP destage with error programs are divided into five flowchart steps shown in FIG. 6. Flowchart steps QV495-QV499 are respectively detailed at the instruction level in FIGS. 12–16.

Figure 12:
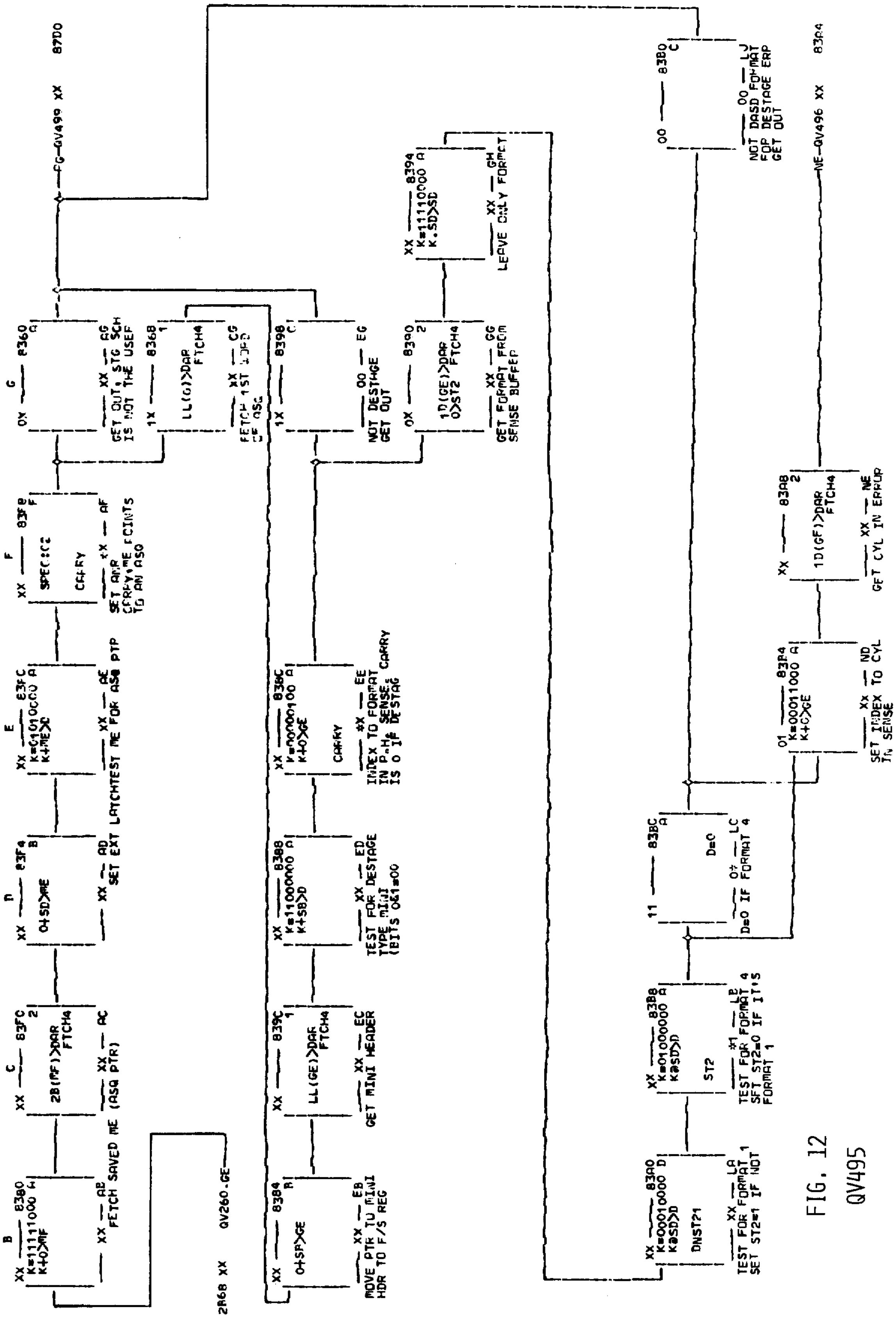
FIGS. 12–73 are flowcharts showing instruction sequences implementing the flowchart steps of FIGS. 6–10; the numeric designations on the flowchart steps also identify the respective instruction sequence flowchart.
Figure 13:
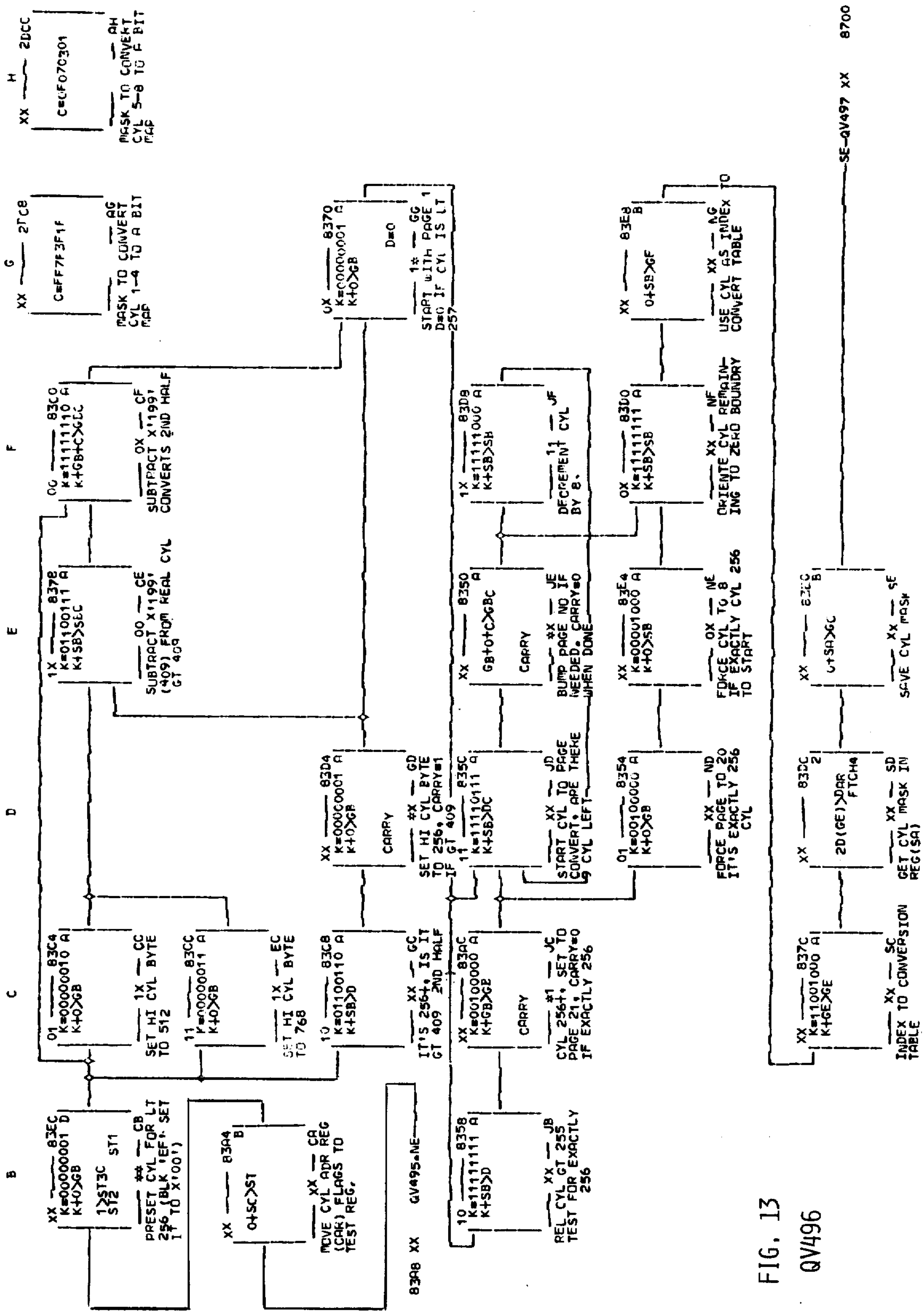
Figure 14:
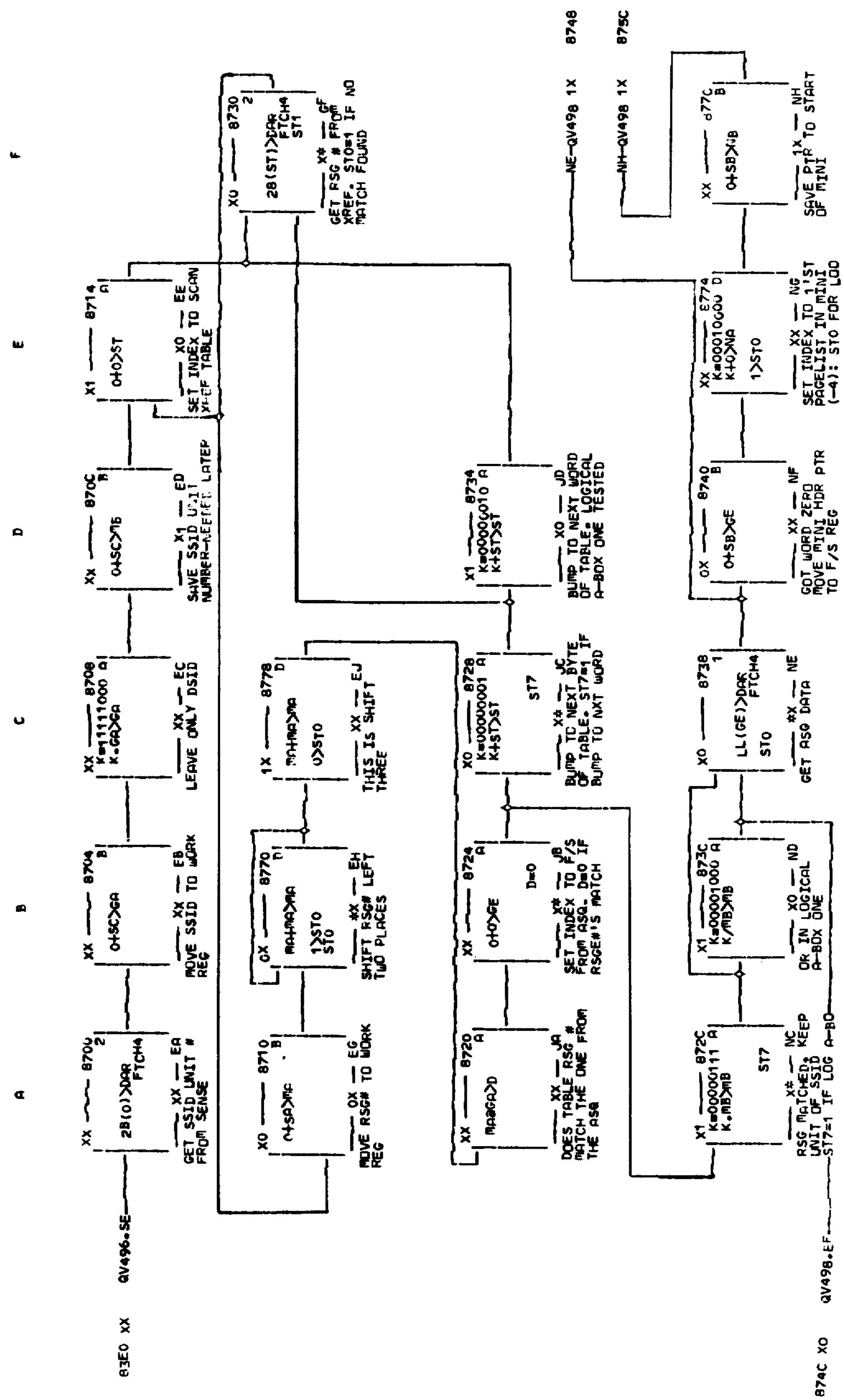
Figure 15:
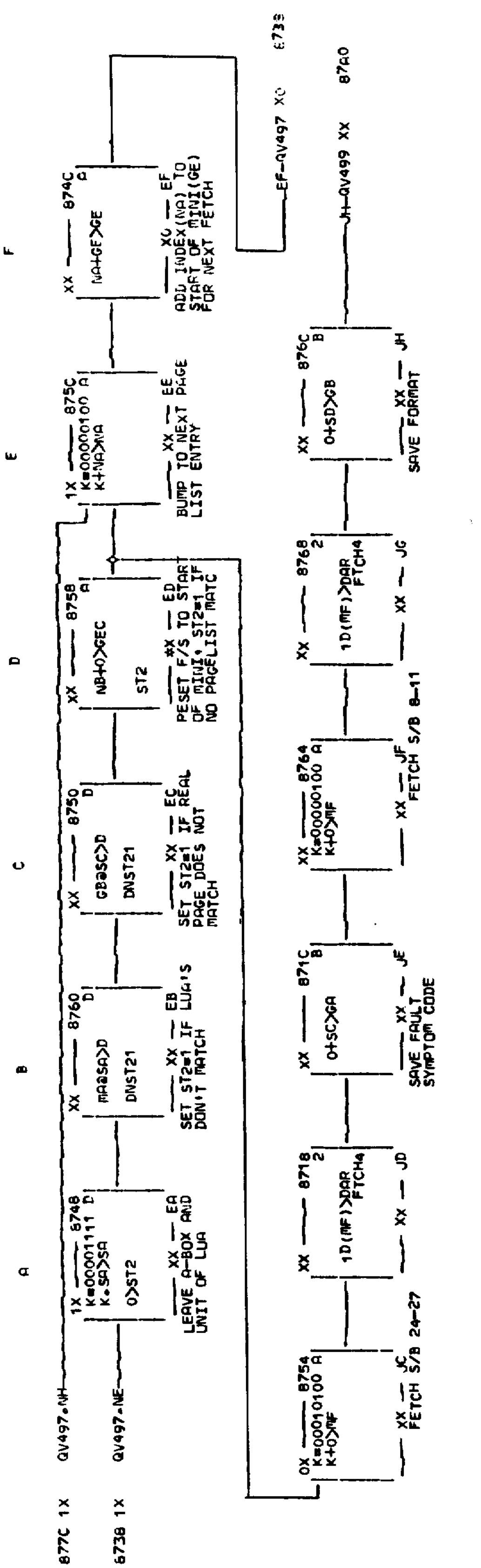
Figure 25:
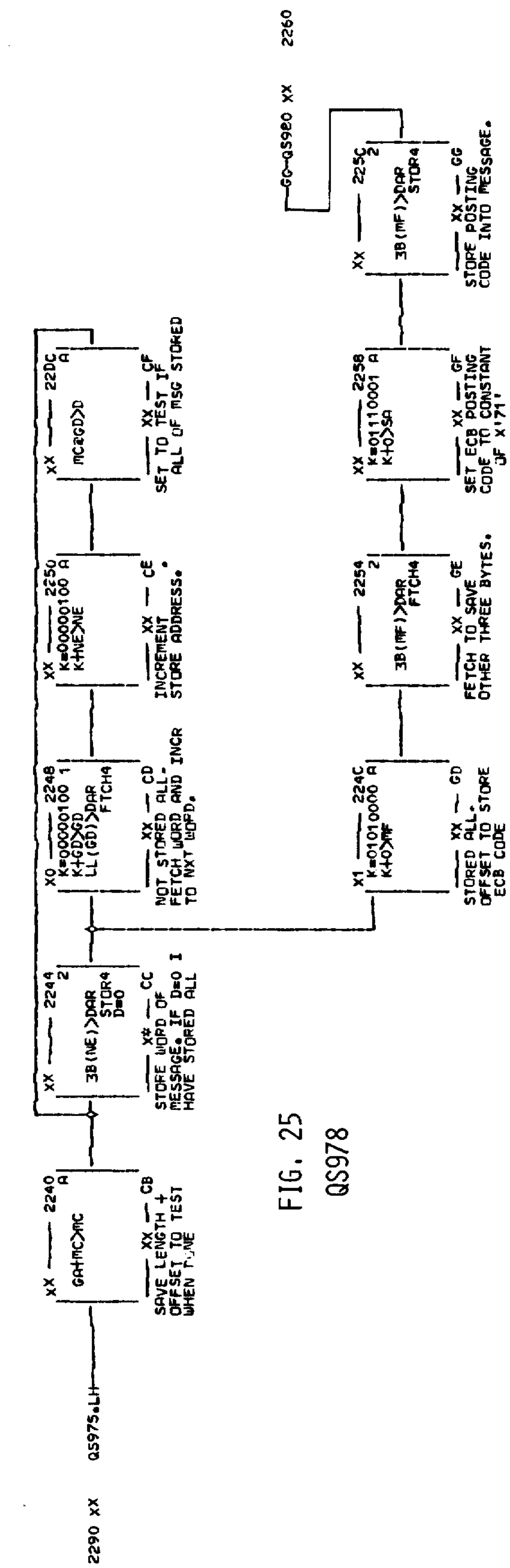
Figure 16:
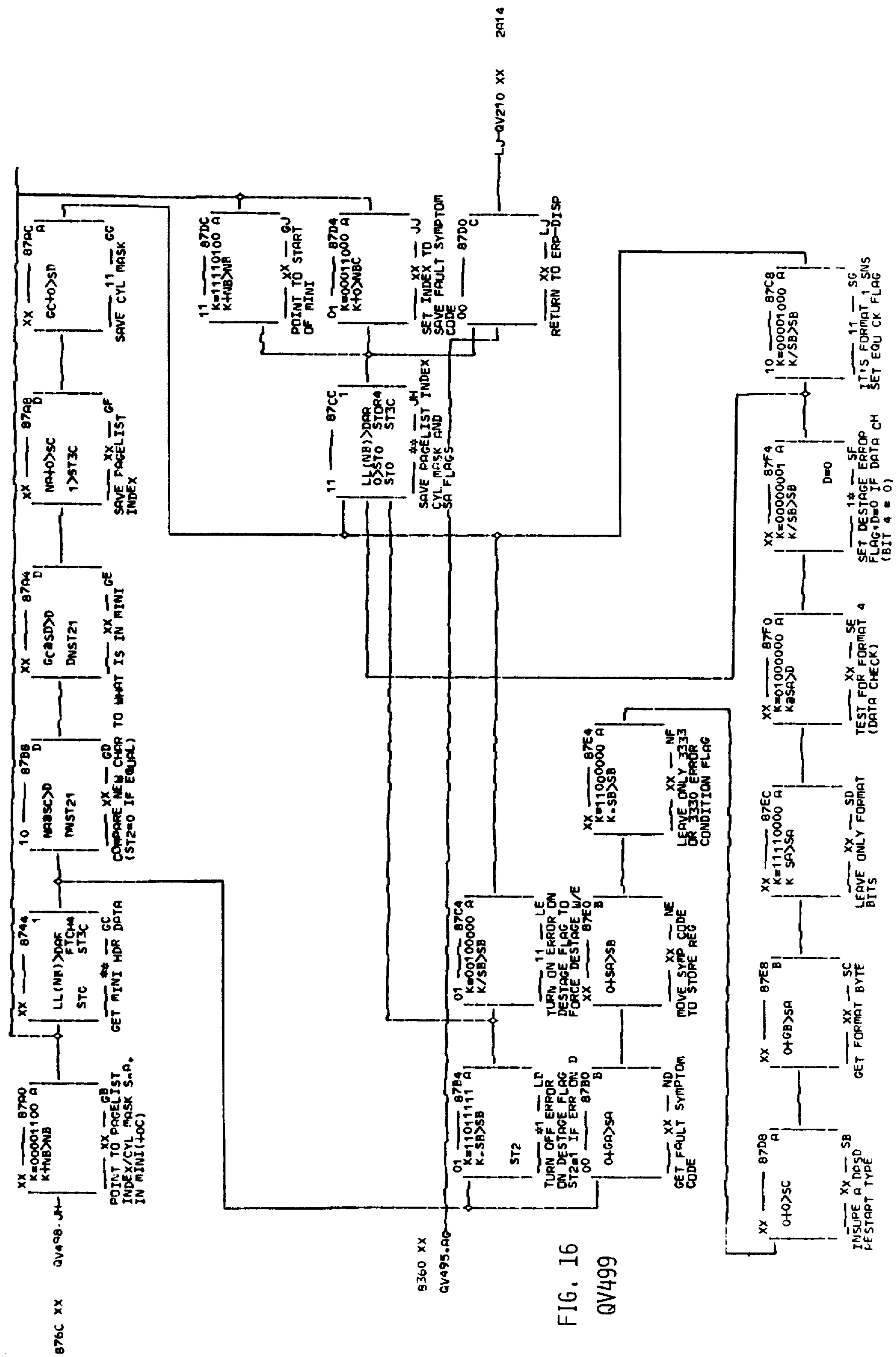

Referring to FIG. 12, QV495, the first instruction 8380 fetches the ASQ pointer for finding the mini header. This pointer is set into external latches at 83F4 with an ASQ scan starting at 83FC. Then, at 8384, the ASQ pointer is moved to the mini header, to the fetch and store register. The mini header is obtained at 839C, and instruction at 8388 determines whether or not the destaging operation was involved when an error occurred. If the error occurred by other than a destage, the program is short-circuited via instruction at 8398 which enters flowchart step QV499 (FIG. 16) for bypassing the flowchart steps QV496, QV497, and QV498, all associated with destage with error.

When a destage is detected, instruction 8390 obtains sense data from the sense buffer. This data includes format definitions for various types of formats as may be used in MSS. Instructions 83A0, 83B8, and 83BC test for format types, i.e., is it DASD or other? If it is not DASD format, then the error did not occur during a DASD read and, hence, QV499 is then entered for bypassing destage with error programming. Assuming destage with error has been sensed, the cylinder in error of the DASD unit is identified at 83B4 and 83A8. Then, flowchart step QV496 (FIG. 13) is entered for transferring the identification of the real page RP to the ASQ list.

The sole entry to QV496 is at 83A4 wherein the cylinder address register (CAR) flags or signals are sent to the test register identified by the micro code. At 83EC, constants are read into the program for identifying the character of the DASD. By way of explanation, different sized spindles 14 may be employed in MSS. QV496 can handle a base size plus a double size. In accordance with this arrangement, the rest of the instructions on QV496 are dedicated for converting the double size to the single size. For example, at memory locations 2DC8 and 2DCC, masks for converting cylinders to a bit map are stored. Additionally, at 8378 and 83C0, an arithmetic conversion from the actual cylinder address of the double-sized DASD spindle 14 to a reference-sized DASD spindle is performed. At 8370, conversion is complete. In the line of instruction words, beginning at 8358 and extending through 83D8, tests are made to find whether or not there are addressing anomalies. In the next line of the table, beginning at memory location 8354 through 83E8, corrections are made for such anomalies. In the last line, beginning at memory location 837C through 83EO, the bit maps are transferred; and the cylinder masks, as used in DASD, are fetched from the microprogramming register SA with flowchart step QV497 (FIG. 14) being entered at 8700.

Flowchart step QV497 scans the ASQ list for finding the appropriate ASQ entry associatable with the present destaging with error. In fact, QV497 and QV498 (FIG. 15) have coordinated action for finding the ASQ entry in error. Since there are a plurality of entries, i.e., there may be a plurality of errors, two flowchart steps provide an ASQ error scan path, as will become apparent.

QV497 (FIG. 14) first obtains the SSID unit number for the failing spindle 14 from the sense register and moves it to a work area in memory, as indicated at 8704. Next, the ASQ list must be scanned, such as beginning at 8714. For example, the controller 15 address was found to match at 872C indicating the scan is in the right spindle group. The branch instruction at 8738 will branch to QV498 (FIG. 15) at address 8748 to compare the LUA's for virtual unit address matching. If there is no match, status register ST at bit 2 is set to a 1 at instruction 8750. If there is no match, as determined at 8758, the scan must continue. 875C adjusts the scan to the next page (set of eight cylinders) and returns to QV497. Returning to QV497, instruction sequences at locations 8740 through 877C are also entered from 8738 and are used only at the beginning of the ASQ list.

QV498 has some terminal processing whenever a match is made. This occurs in instructions 8754 through 876C (second row). That is, the 8758 branch instruction will branch to this sequence whenever there is a match of LUA's. Following the terminal processing in QV498, QV499 (FIG. 16) is entered at 87A0.

QV499 (FIG. 16) is a flowchart step which saves all of the accumulated data with respect to destage with error for use later in the destage with error flowchart steps, particularly step 54 of FIG. 5. QV499 can be entered either at 87A0 from the destage with error flowchart steps QV497 and QV498 or by the bypass not destage with error at address 87D0. Examination of the instruction list and table will show that the error symptoms associated with destaging are saved and, in the event of entry from QV495, only instruction 87D0 is executed for returning to the ERP dispatcher. In the table, the term 3330 refers to spindle 14, while 3333 refers to the combination of controller 15 and spindle 14. The term "format" refers to the data format identification; i.e., is it DASD, tape, or otherwise.

QCB Cleanup

Figure 7:
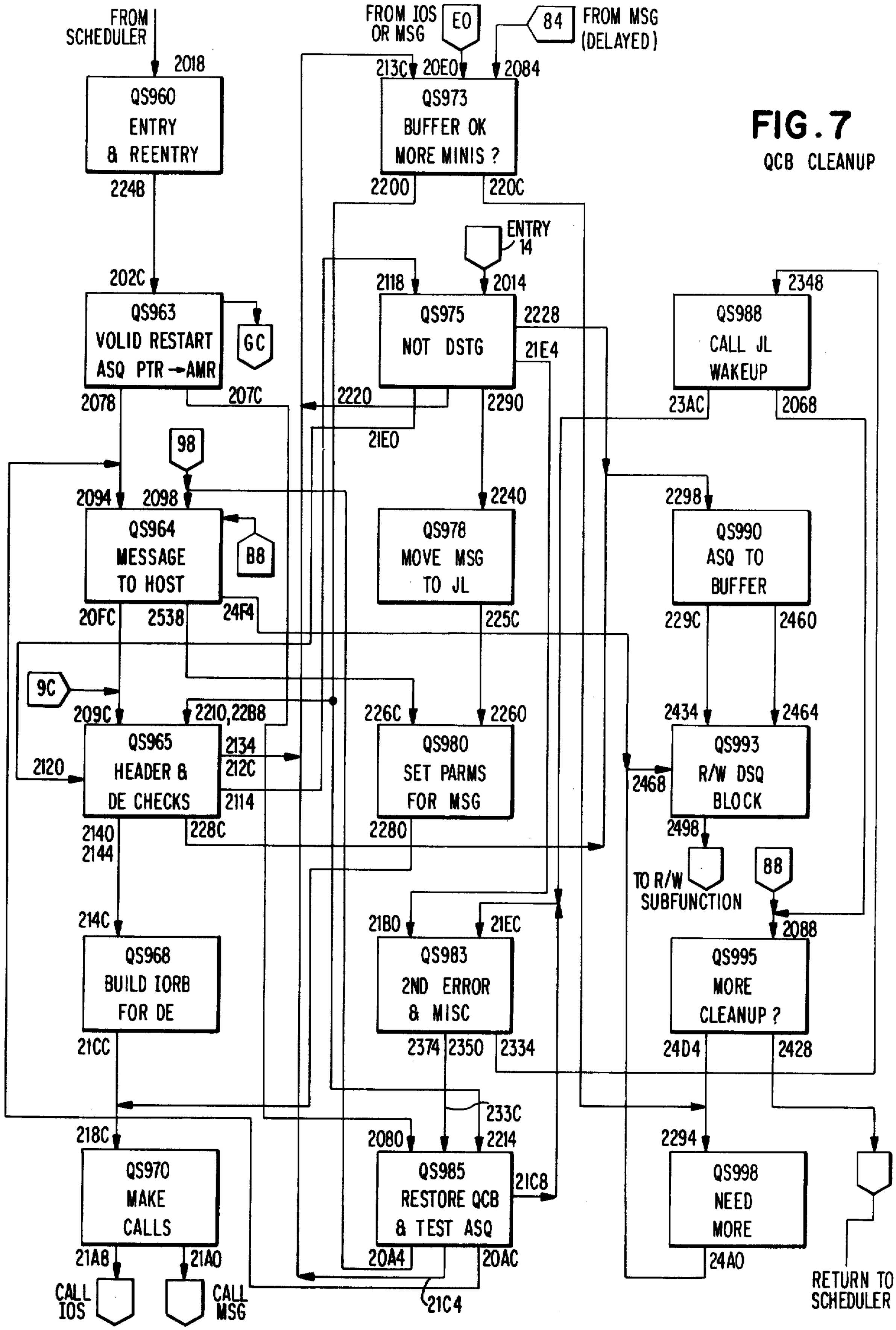
FIG. 7 is a flow diagram of queue control block modifying microprogram steps related to a lower storage level.
Figure 17:
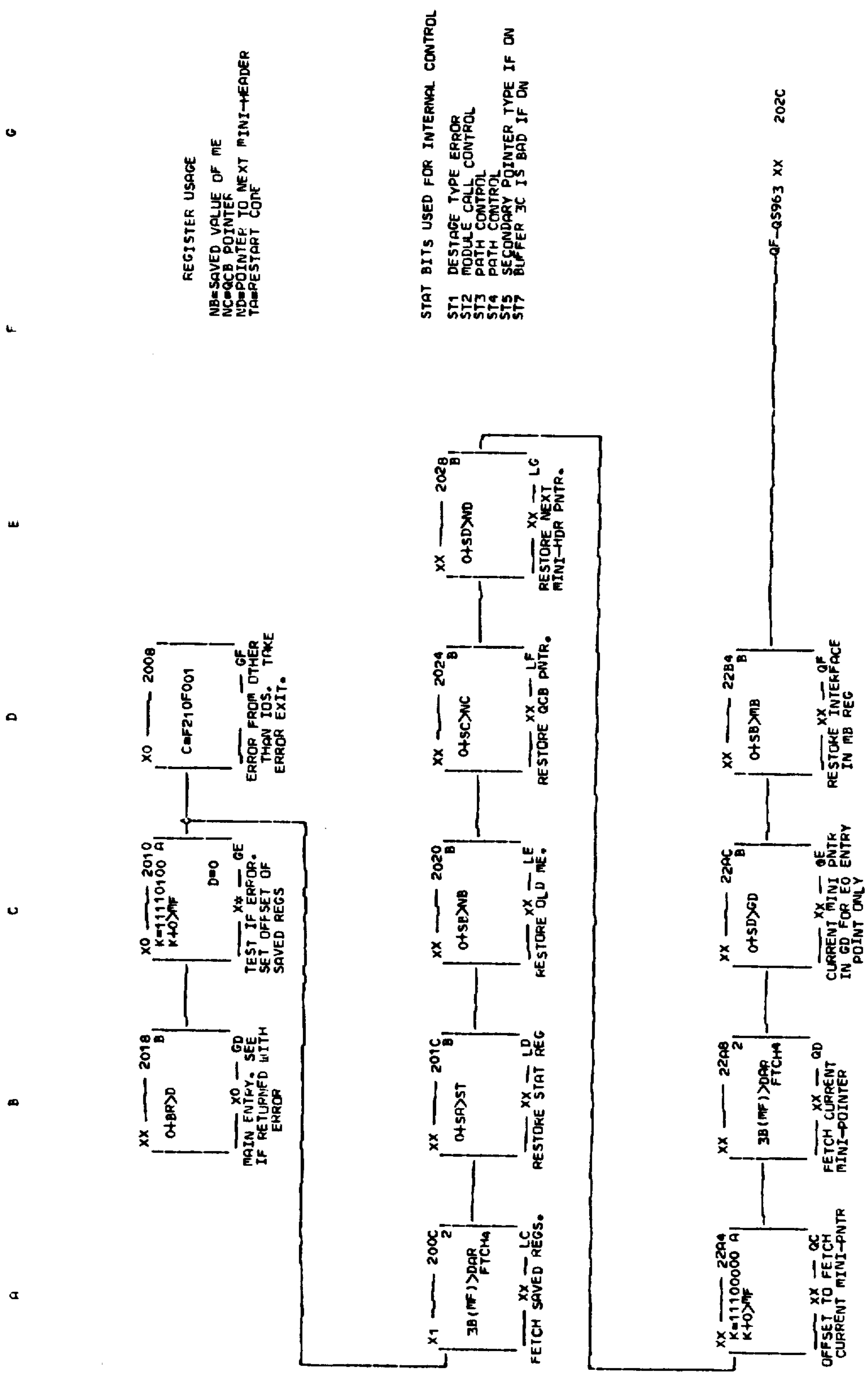
Figure 18:
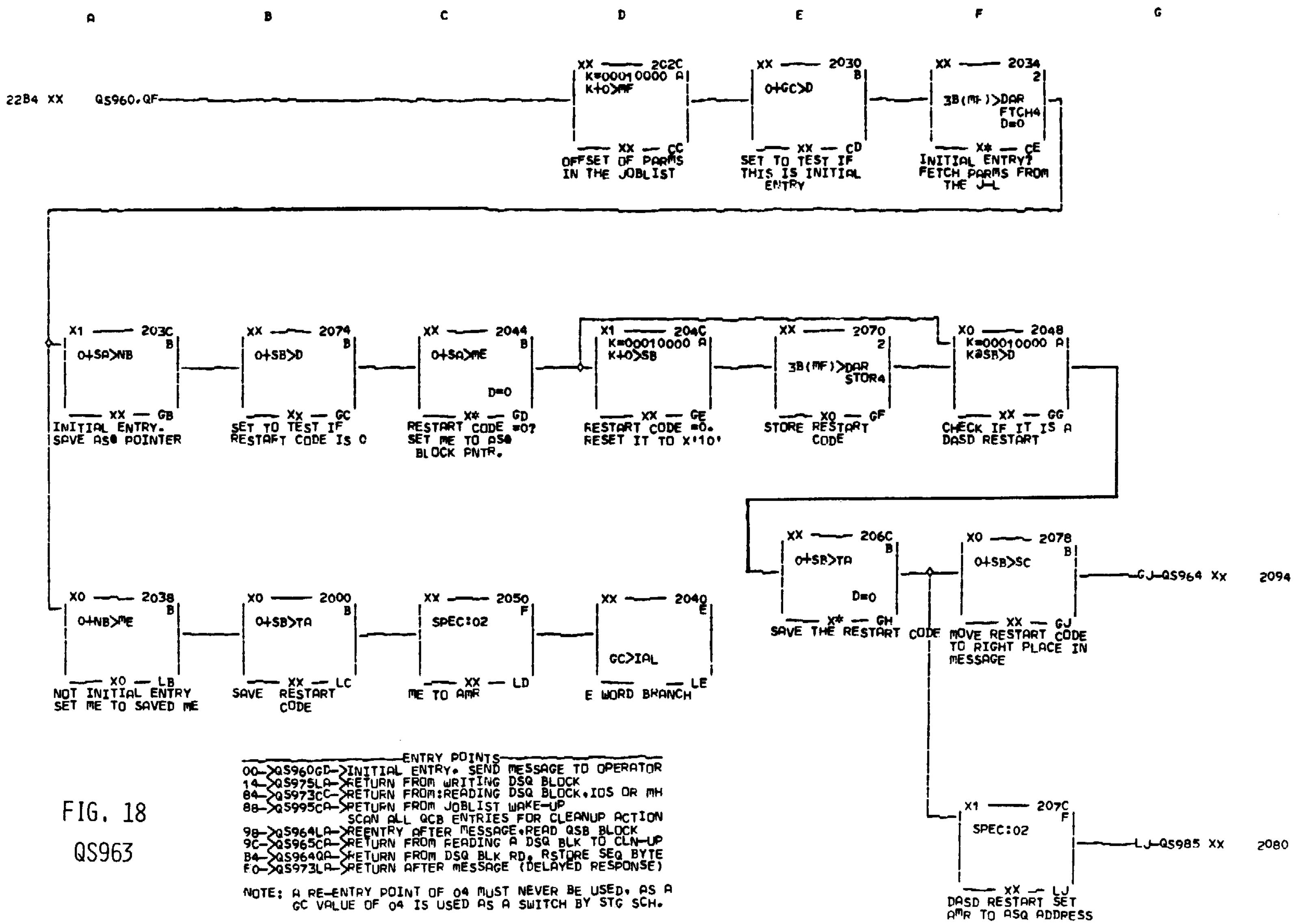
Figure 19:
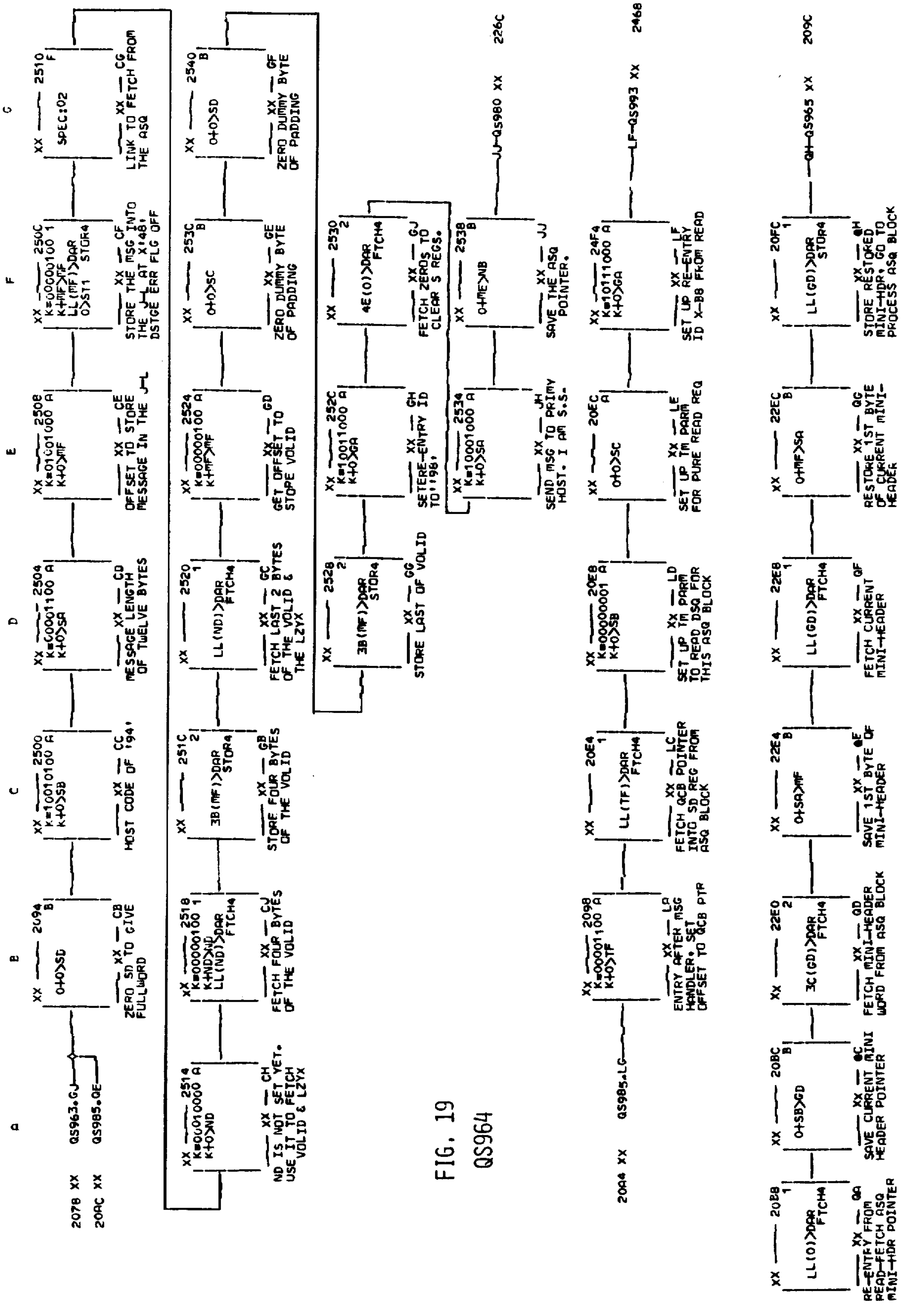
Figure 20:
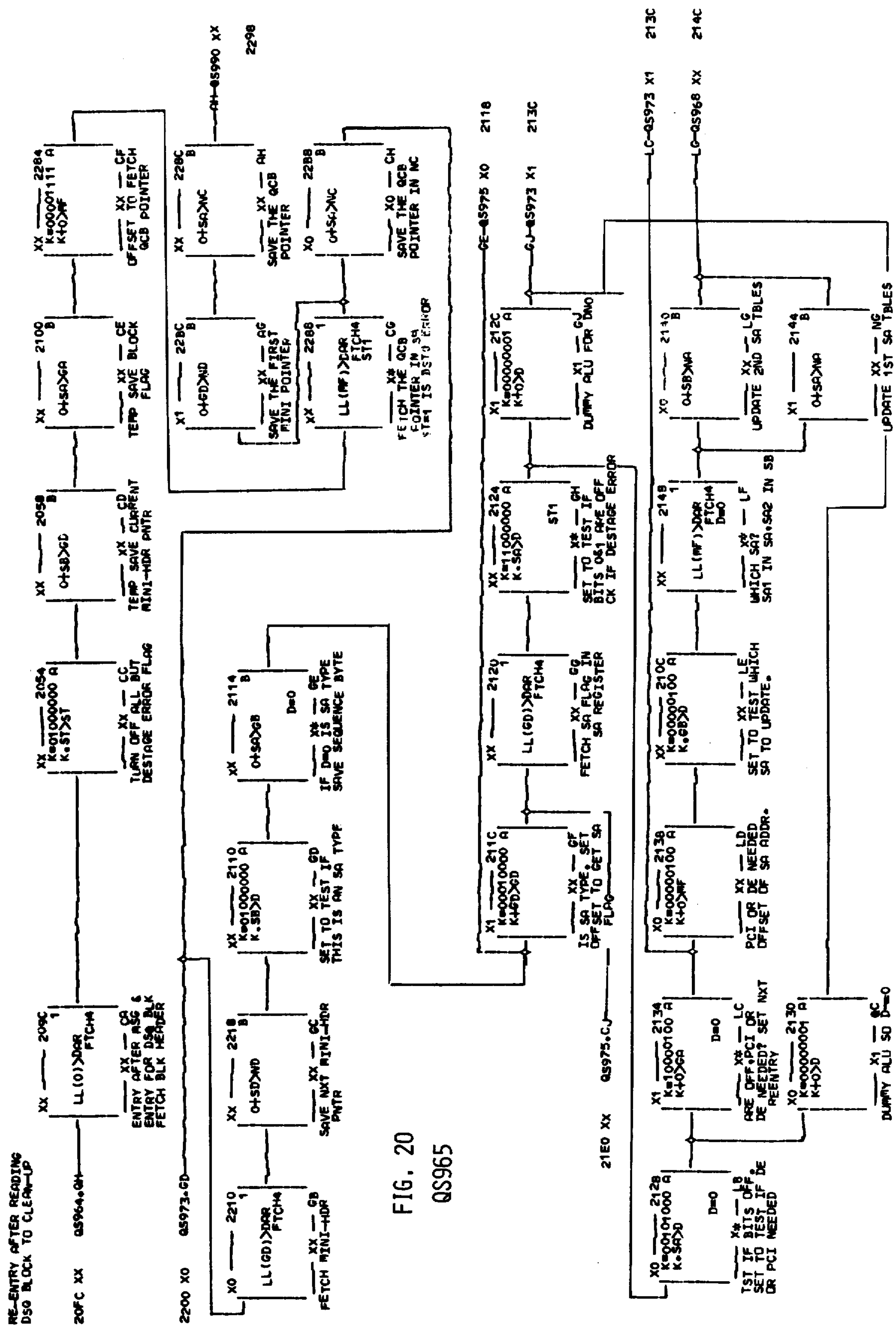
Figure 21:
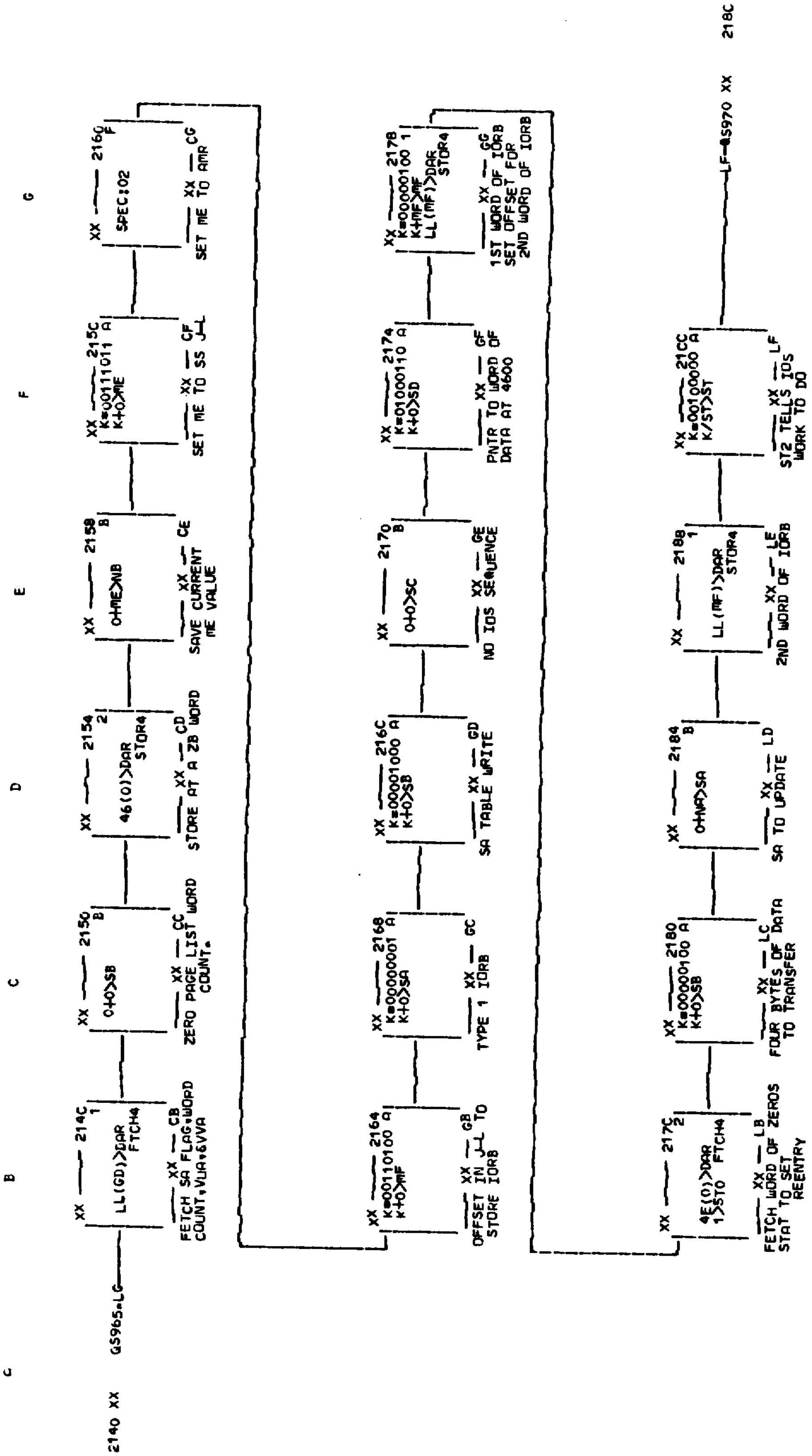
Figure 22:
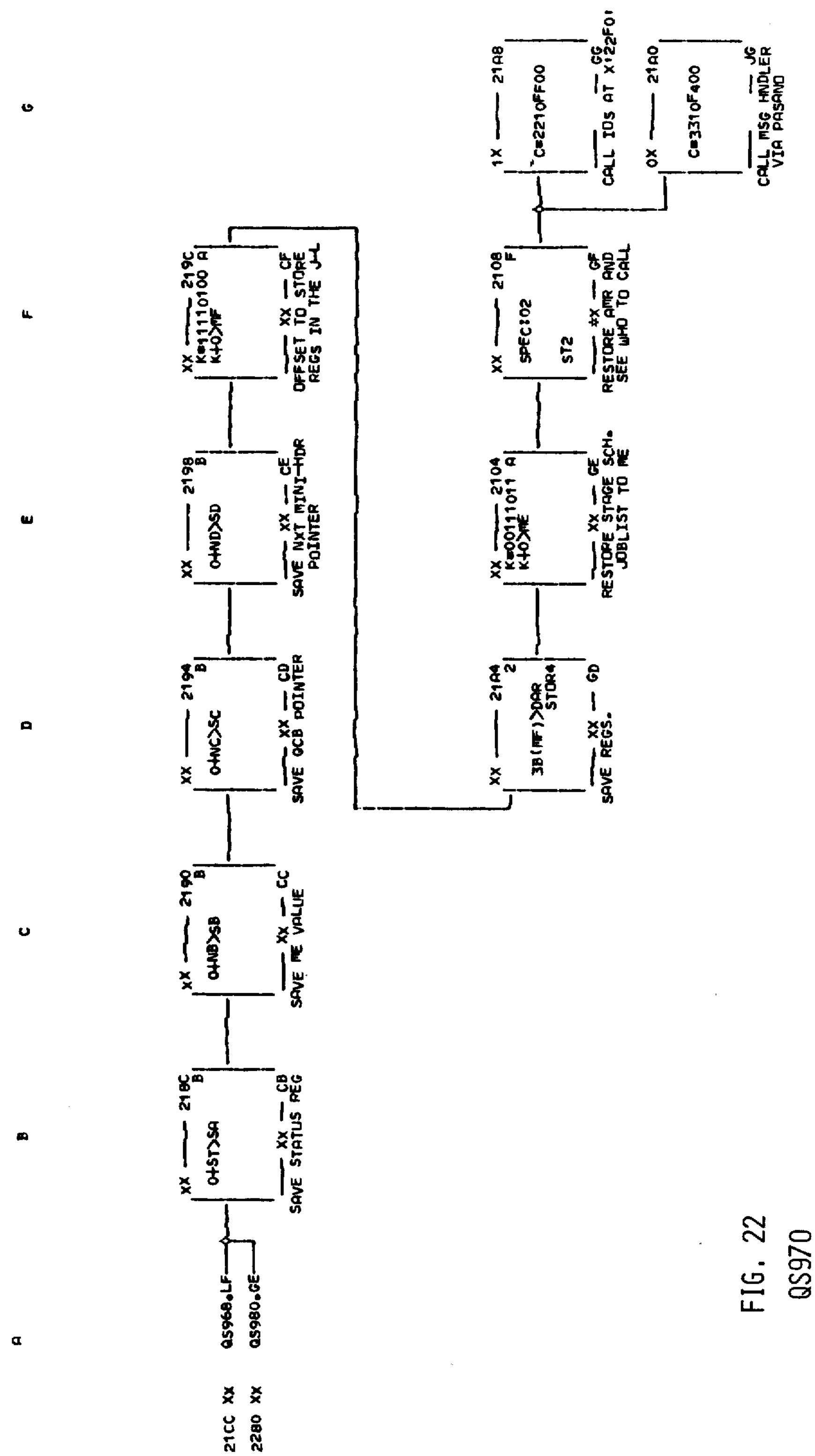

The functions of the microprograms represented in FIG. 7 and in the instruction flowcharts of FIGS. 17–33 change the signal content of the queue control blocks (QCB) in preparation for a destage restart for enabling a destage with error. The first FIG. 7 flowchart step QS960 (FIG. 17) is entered at 2018.

The main entry at instruction address 2018 is from the ERP scheduler which scans the register including 2018 during an error condition. At 2010, the error is tested (D=O), and the offset, i.e., the relative memory address of the save registers, is set. If the error is other than IOS, i.e., it is not an external error, therefore, not a destage error, then the sequence is exited at 2008. Assuming it is an IOS error, including a destaging error, instructions 200C through 22B4 prepare MSC 17 for execution of the other flowchart steps in FIG. 7. Also, FIG. 17 lists the microprogram and status bits used for control in connection with the FIG. 7 illustrated program. For example, register NC stores the QCB pointer, ND stores the pointer to the next mini header, etc.

QS960 is exited at 224B for entering QS963 (FIG. 18) at 202C. If this is an initial entry of the destage restart rather than a re-entry, then the parameters have to be fetched from the MSC 17 job list, such as at 2034. A job list is a program determined set of registers (in memory) containing signals necessary for program execution of a task or job. Also upon initial entry, the sequence of instruction words in the second row of instruction word symbols beginning with 203C is executed. Note that the destage restart coding is manipulated in this sequence of instructions. If the entry is a re-entry, i.e., not an initial entry, then the sequence of instructions, beginning with 2038, is executed with the code symbol GC being inserted into the lower-byte portion of the instruction address register IAR by instruction 2040. This is a so-called E-word branch for re-entry into the FIG. 7 program.

Table QS963 (FIG. 18) also stores the indications of the entry points and re-entry points. For example, initial entry always comes from QS960; while a re-entry can come from several indicated instructions identified by the table numbers. Suffixes indicate the branch conditions. GC is a microprogram register addressable for branching to points in accordance with known microprogramming techniques.

In addition to storing the branch indicator at GC, QS963 also has exits to QS964 (FIG. 19) for continuing the initial entry processing. Note that after executing instruction 2040, the MSC 17 returns to the ERP scheduler.

Flowchart step QS964 is used only upon initial entry for transferring a message to a host computer 19 informing same that a destage with error has been started. This includes the instruction words 2094 through 2538 of QS964 with the program exiting at 2538 to enter QS980 (FIG. 26), which sets the parameters for the message. QS980, later described, then exits at 2280 for entering QS970 (FIG. 22) at 218C for making a call to a program (invokes a program) for transferring the assembled message to primary host 18.

Once the message has been handled by the message handler (a program of known structure), as by an exit from QS970 at instruction 21AO (later described), reentry into QS964 (FIG. 19) is by scanning an index register having index 98 to fetch instruction 2098. Also note the off-page entry 98 is merged with entry from QS985 (FIG. 28) as later described. The instructions 20E4 through 24F4 set up parameters for continuing the destage with error processing, QS964, in this instance, is exited at instruction 24F4 for entering QS993 (FIG. 31) for a read/write DSQ operation. That is, the signals for the DSQ block are transferred from a DASD spindle 14 into MSC 17. From QS993, at instruction 2498, a program is invoked for the read/write subfunction, i.e., transfer the DSQ block signals from DASD (spindle 14) into the internal memory of MSC 17.

Execution of the read/write subfunction causes an index to be read pointing to register 20B8 (QS964) termed "B8", which is a re-entry from reading the DASD for obtaining the ASQ mini header pointer. Then, instructions 20BC through 20FC are executed for storing the fetched signals in the internal memory of MSC 17. Finally, the next flowchart step QS965 (FIG. 20) is entered at 209C for checking the header and device end (DE) status. Note that if MSC 17 has a sufficiently large internal random access memory, the read/write subfunction would be replaced by a mere memory reference.

QS965 (FIG. 20) checks to see if a destaging with error operation is occurring and that a device end (DE) has not been sent to primary host 18. Examination of FIG. 20 will show the functions as they are performed. Only the exits and entries will be described to facilitate an understanding of the program execution.

Figure 23:
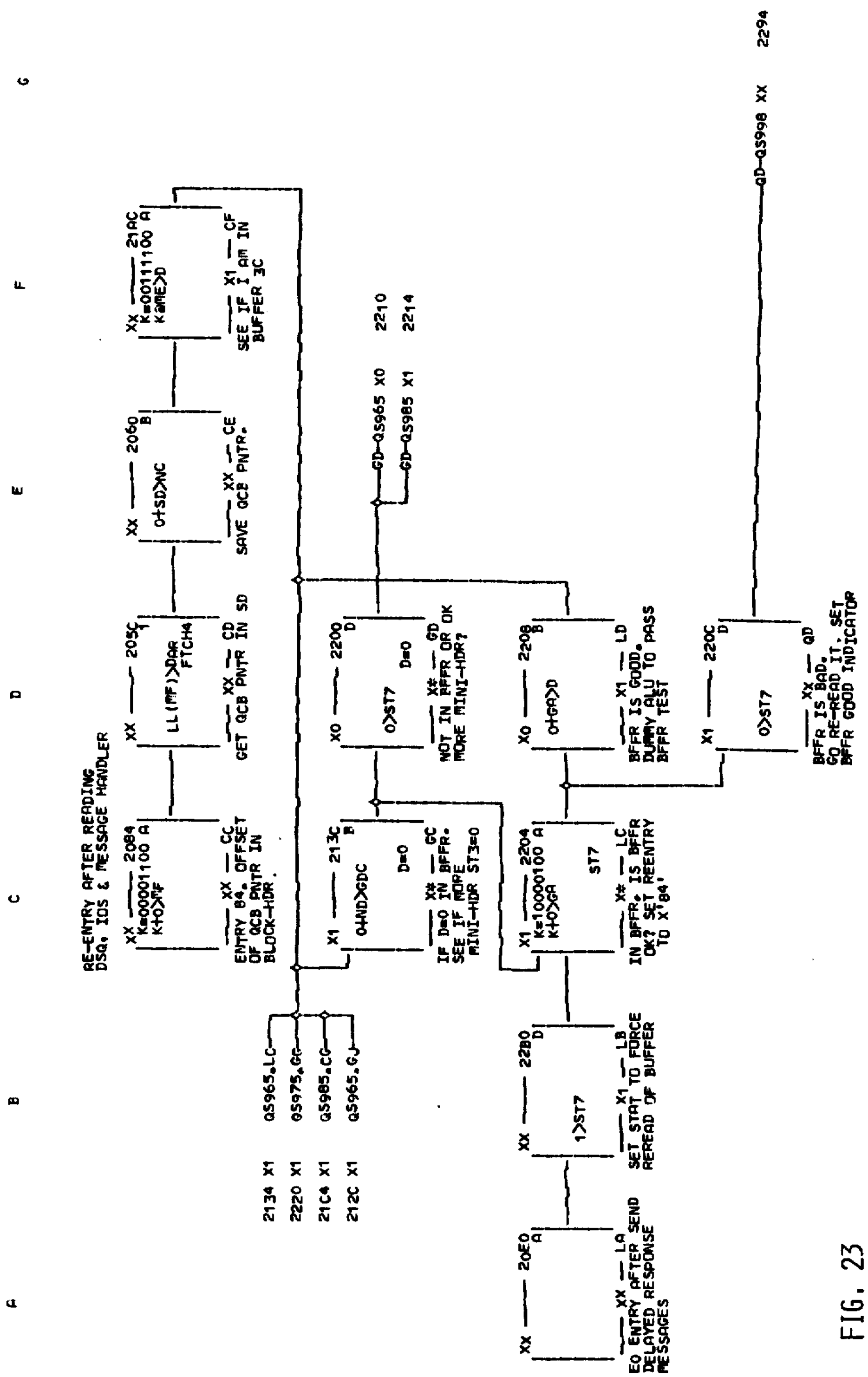
Figure 24:
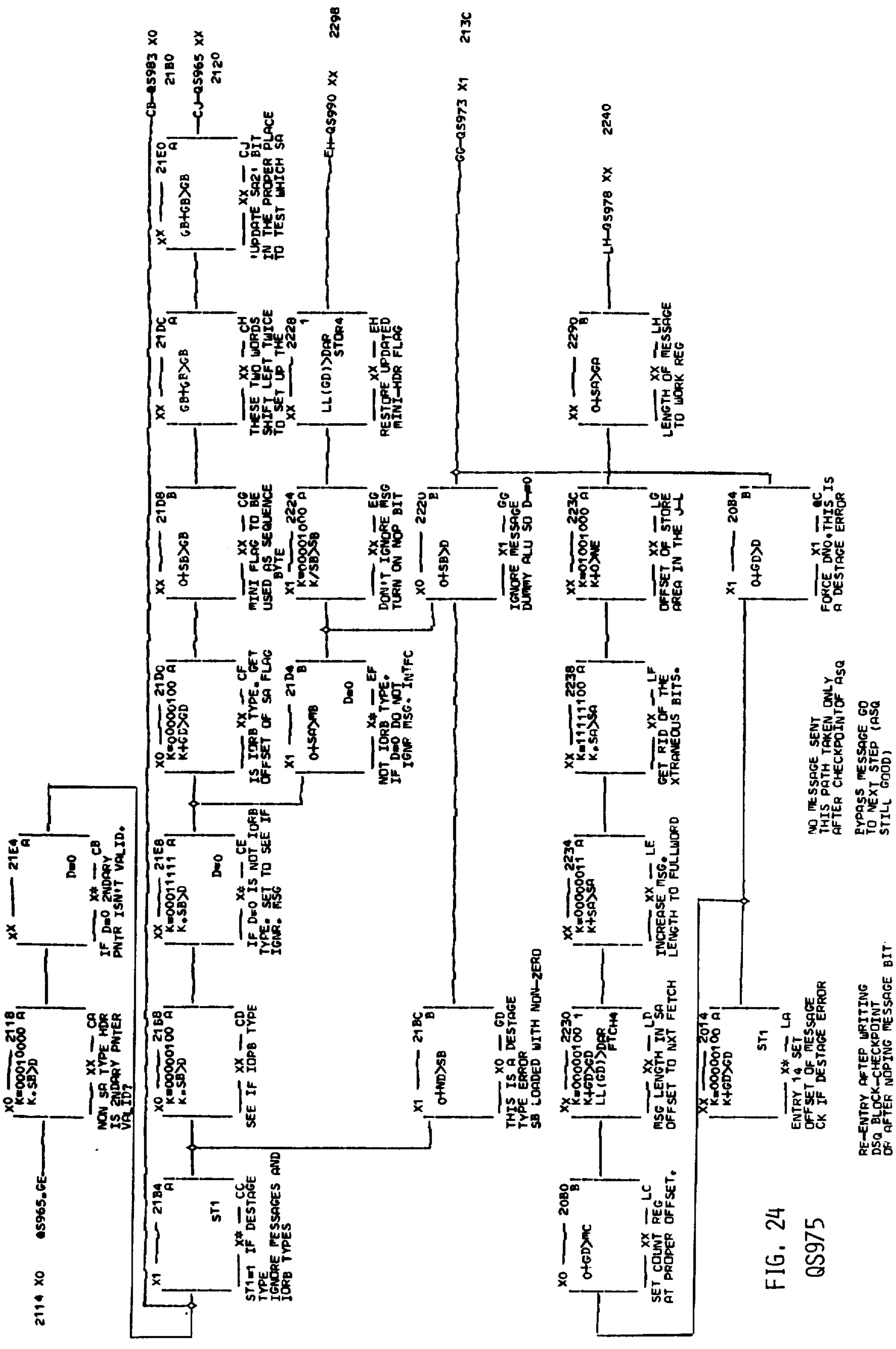

Exit from QS965 is at 2134 and 212C to QS973 (FIG. 23) for verifying that the buffer has been filled properly. Exits at 2140 or 2144 are to the next sequential flowchart step QS968 (FIG. 21) for building the IORB for device end (DE). The alternative entries to QS965 are at 2210 and 22B8 for returning from QS973 (FIG. 23). Additionally, an off-page entry 9C enters at instruction 209C.

Flowchart block QS968 (FIG. 21) builds the input/output request block (IORB) for DE. Entry is only at 214C wherein the staging adapter flag, word counts, VUA, and VVA are fetched. The page list is then zeroed. Other housekeeping functions are performed in QS968. IORB consists of two words of four bytes each. Finally, register ST has its bit 2 position set for indicating to IOS program that there is work to do; i.e., there is going to be a message sent to primary host 18. The QS968 is exited at 21CC to enter QS970 (FIG. 22) at 218C for making the message handler and IOS calls.

QS970 is entered at 218C from either QS968 (FIG. 21) after the IORB is built or from QS980 (FIG. 26) which had set the parameters for a host message. The instruction words of QS970 are housekeeping functions in preparation for invoking IOS for a DASD operation and preparation of the message handler for sending a message to primary host 18. IOS invokes functions in director 16 for reading or writing on DASD spindles 14 in the same manner that a host 18/19 operates with a director 16. Such operations are set forth in U.S Pat. No. 3,400,371, supra. The return from IOS or message can either be a reentry in QS960 or into QS973 via E0 or 84 off-page connectors. QS973 (FIG. 23) verifies buffer contents and determines whether or not more mini headers have to be fetched.

The verification and checking operations in QS973 are apparent from examination of the instructions. A delayed response message to the host simply means that a DASD spindle 14 had some function to perform and that the host 19 would wait before proceeding on that particular job until a response has been returned. A typical response is a device end (DE) as explained in U.S. Pat. No. 3,400,371. Exit from step QS973 at instruction 2200 can be to either QS965 (FIG. 20, supra) for further header and device end checks or to QS985 (FIG. 28) for restoring QCB and testing ASQ. Instruction word 2200 causes the routine to go to QS965 if there are more mini headers and to QS985 if everything is alright up to this point in destaging with error.

The exit of QS973 at 220C to QS998 (FIG. 33, infra) occurs only when the buffer is incomplete or an error condition has been detected. The buffer then is re-read by QS998 via QS993 (FIG. 31), which initiates the read/write subfunction; i.e., the information is again read from DASD spindle 14 for insertion into MSC 17. Hence, QS973 flowchart step is a checking function for ensuring high-quality operation of destage with error.

Flowchart step QS975 (FIG. 24) sets up a destage read (DR) message to be sent to a director 16 for causing it to read signals from an addressed portion of an addressed spindle 14. Entry to QS975 can be from QS965 at instruction 2118. This instruction also includes control functions with respect to a nonstaging adapter type of operation. However, if it is a destage, then instruction 21BC in Column B loads microprogramming register SB with nonzeroes; and QS973, supra, is entered for verifying buffer, etc. Exit 21EO returns the program to QS965 after manipulating the staging adapter flags, mini header flags, for verifying the updated information. At 21E4 of Column C, if the secondary pointer is invalid, QS983 (FIG. 27) is entered and functions performed as later described.

Figure 26:
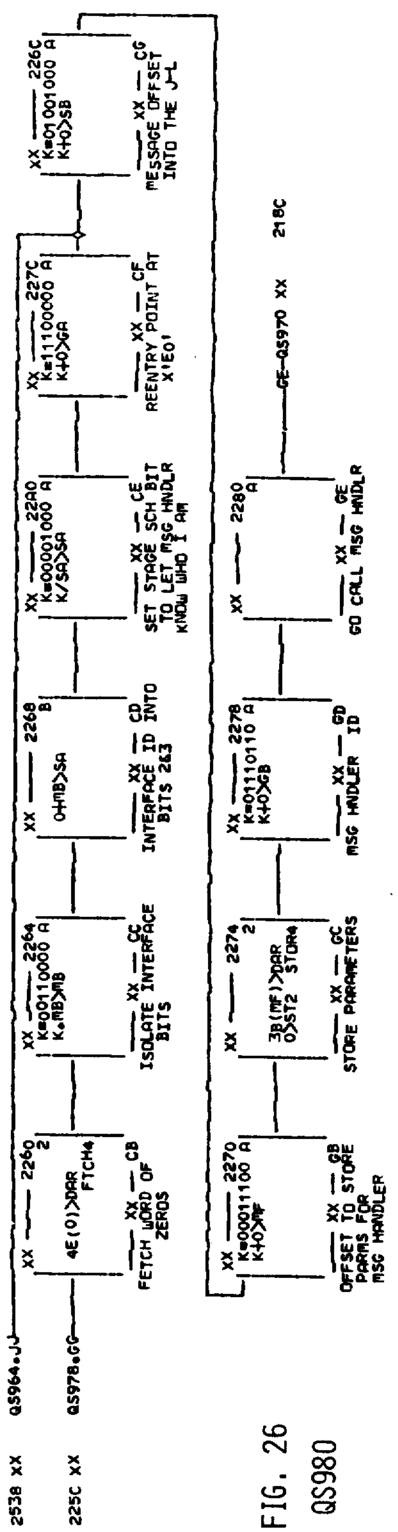
Figure 27:
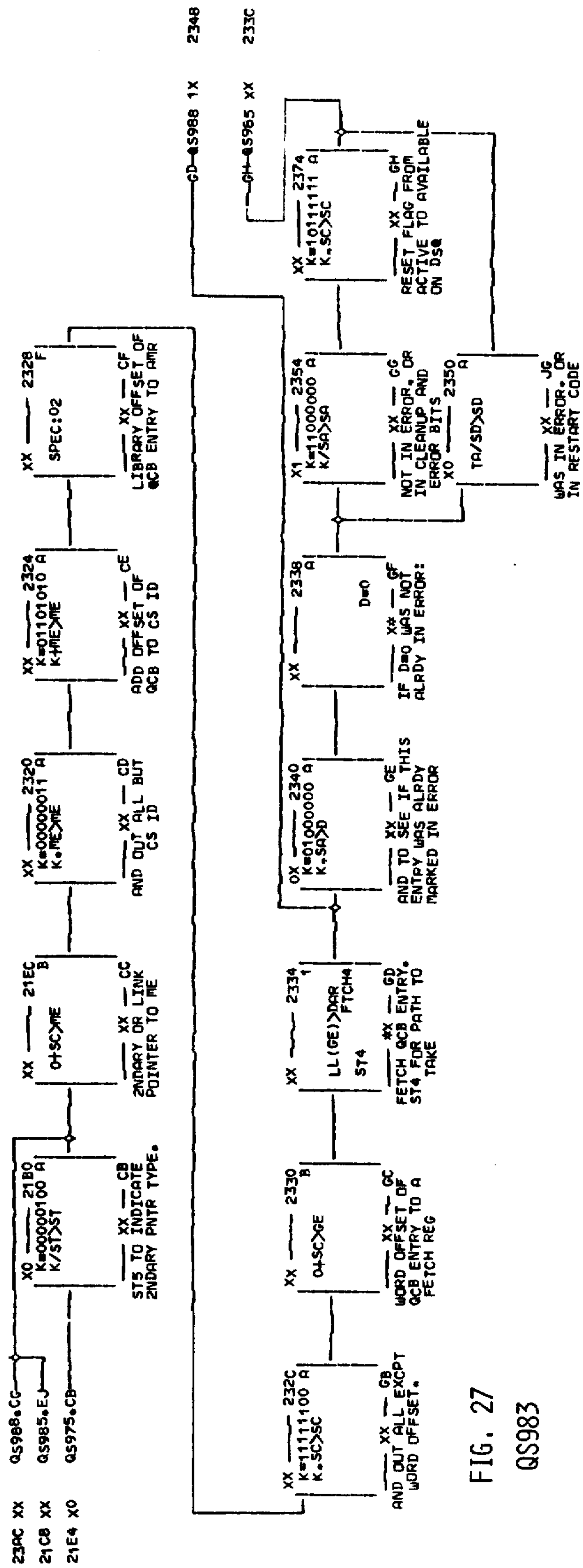
Figure 28:
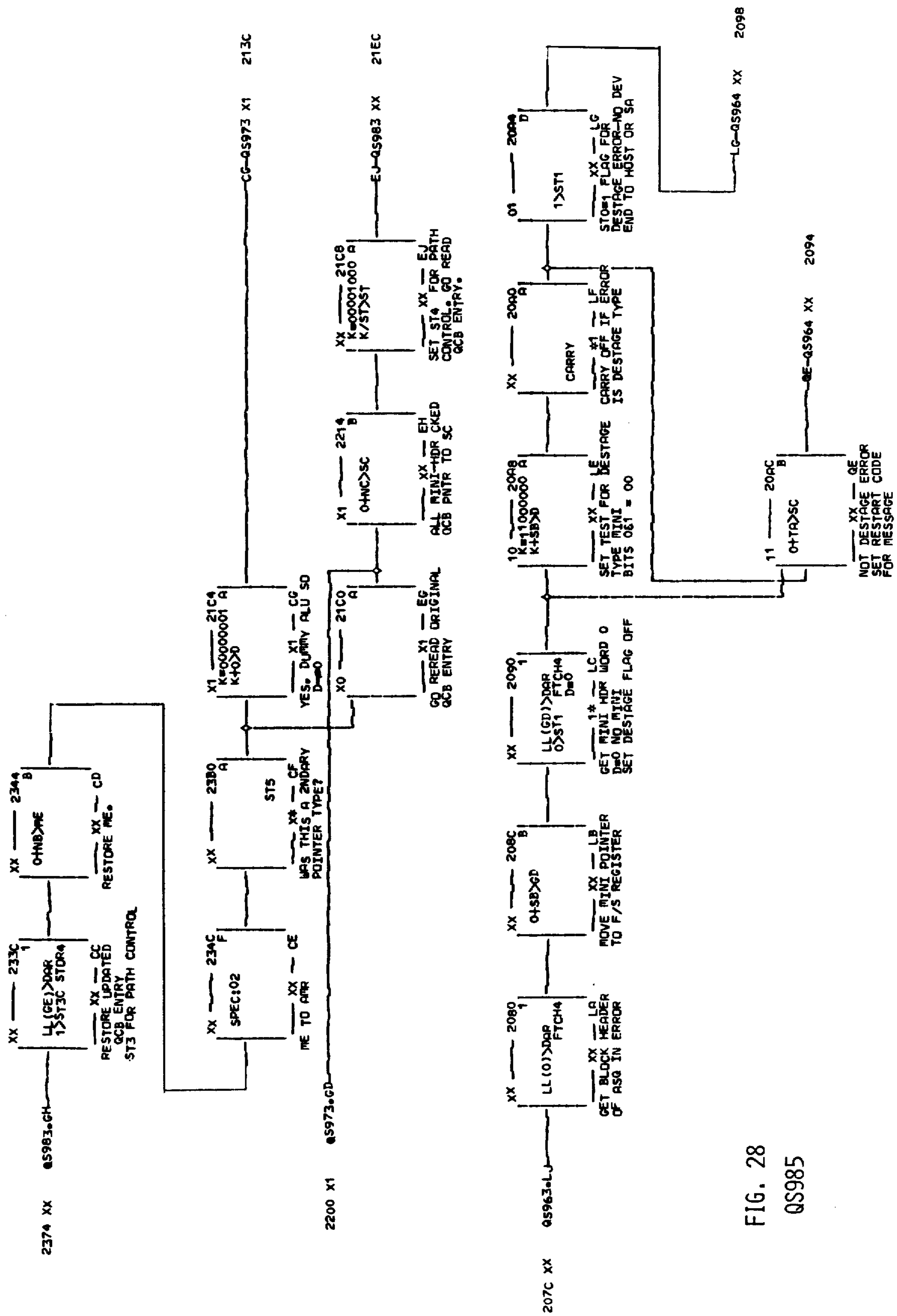
Figure 29:
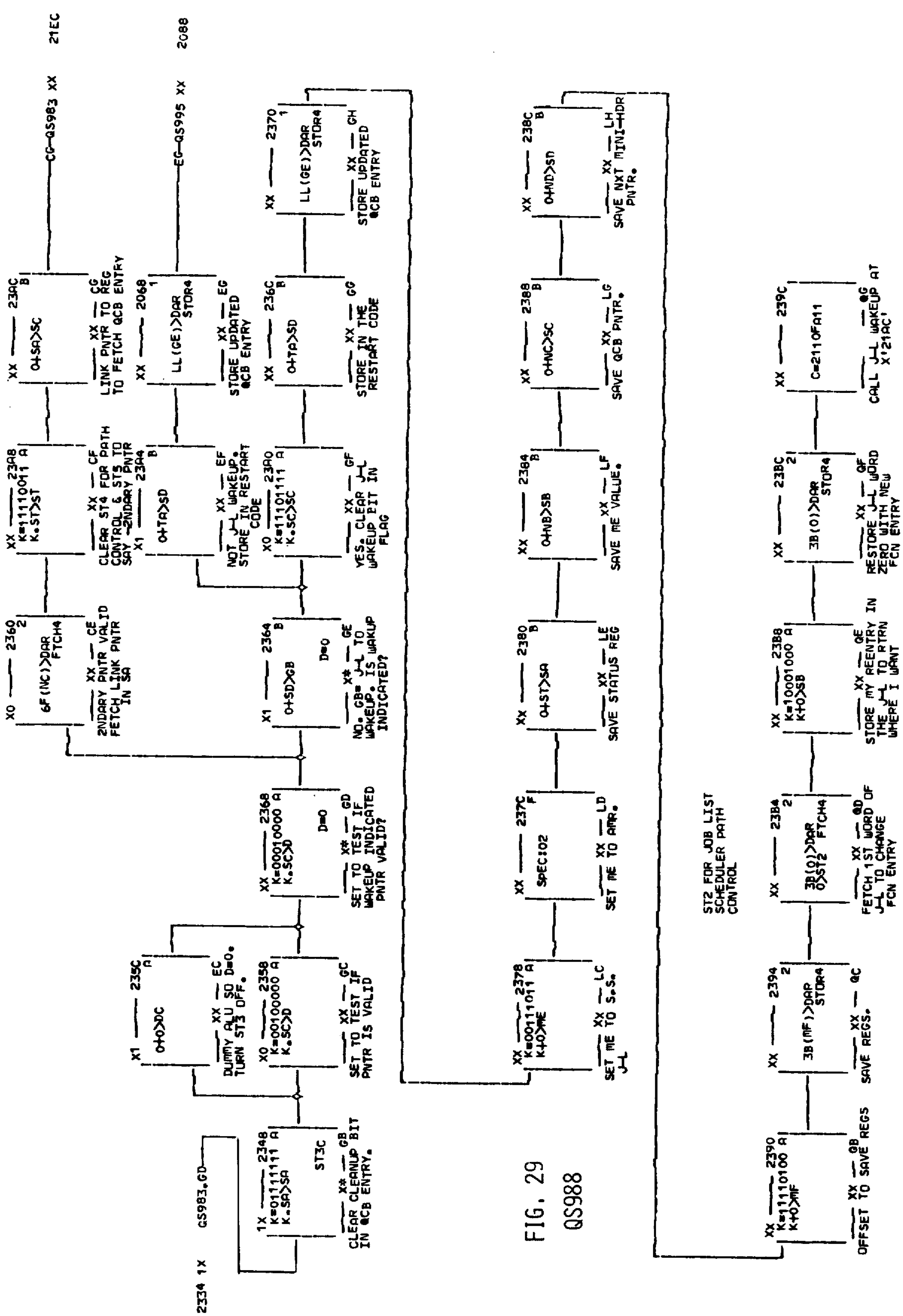
Figure 30:
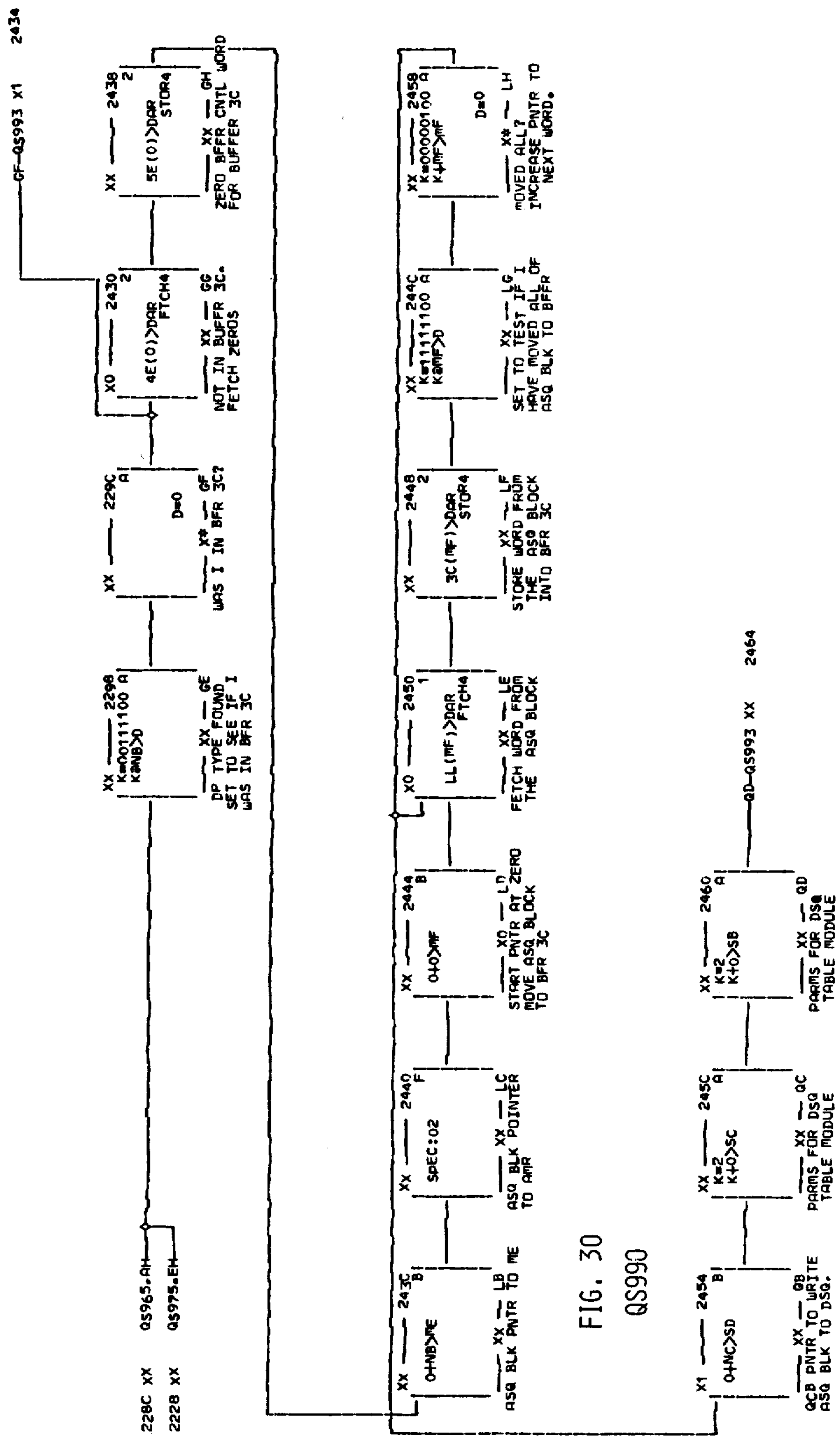
Figure 31:
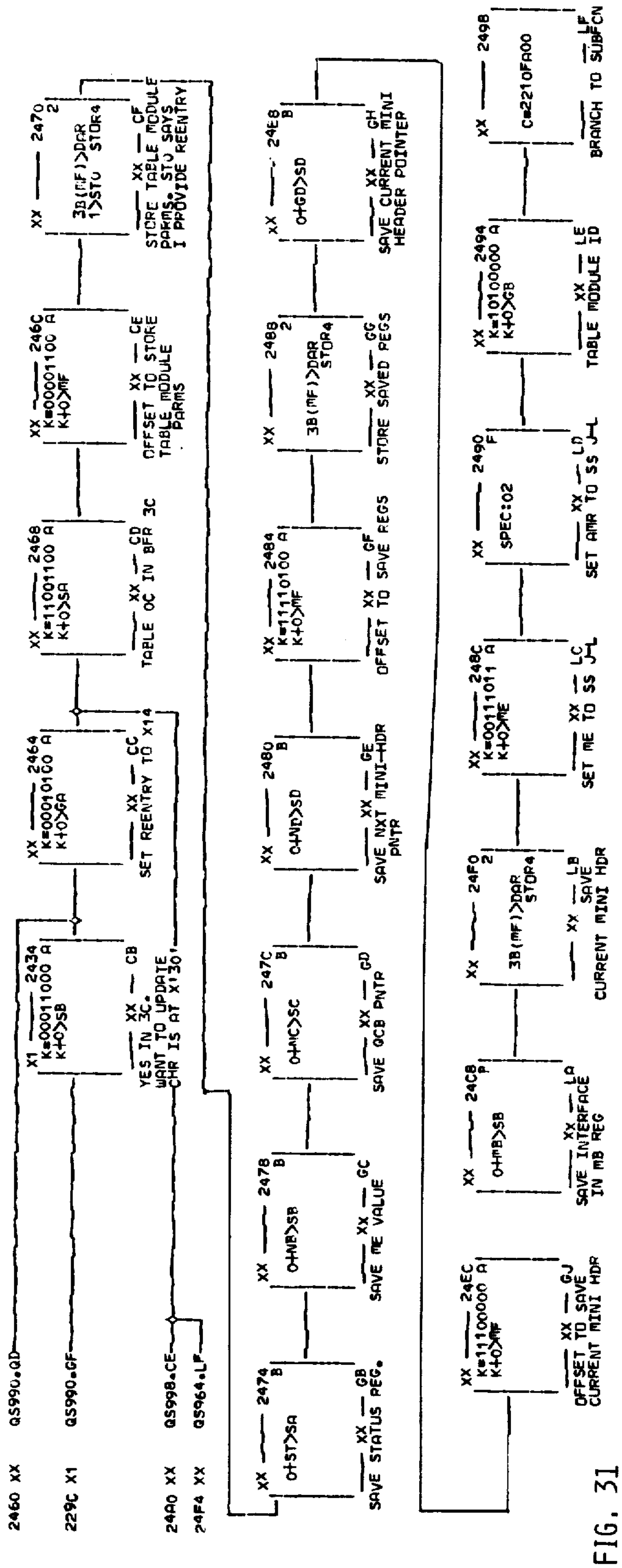
Figure 33:
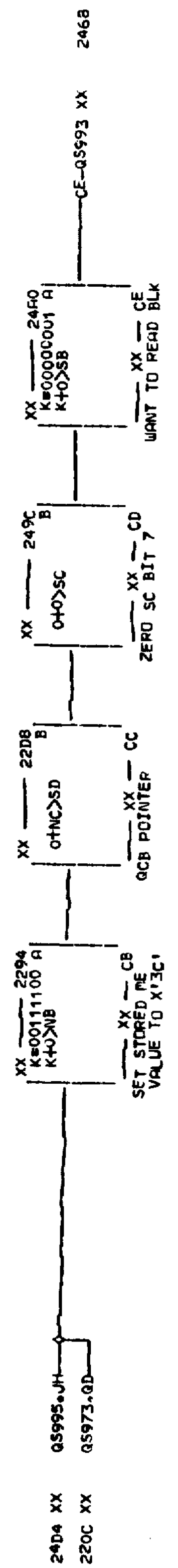
Figure 32:
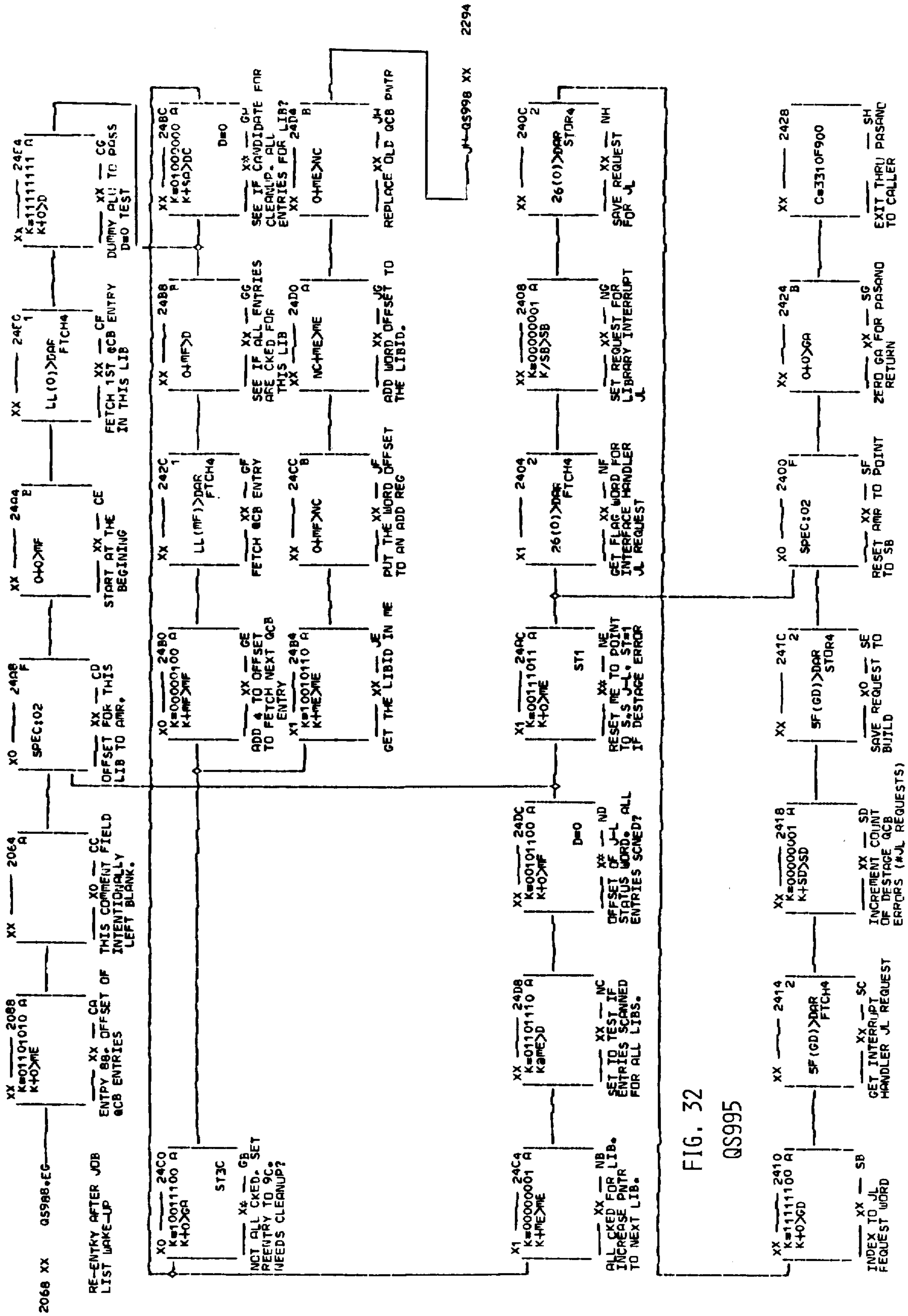

Off-page entry 14 (14 was stored in a microprogramming register) occurs after the DSQ block was written in MSC 17 internal memory. At 2014, a destage error is verified. If it is a destage error, at 20B4, register DN is forced to zero; and QS973 is entered at 213C. The sequence of instructions of QS975 beginning at 20B0 sets up message controls in preparation for entering QS978 (FIG. 25, Sheet 14) for moving the message for director 16 to a job list, i.e., in preparation for transferring the message to director 16 for the destage with error operation beginning in QS978. Flowchart step QS978 merely moves the message for director 16 into the job list of MSC 17. The sole entry of QS978 is at 2240 with the remaining instructions ensuring that the entire message is stored in the MSC 17 buffer area. When the message is stored, the branch at 2244 moves program execution to 224C to post the message, and the posting code (location of posting ) is stored with the message. At 225C, the parameters for the message are ready to be set by QS980 (FIG. 26).

QS980 (FIG. 26) can be entered either from QS978 (FIG. 25) of from QS964 (FIG. 19), which also sends a message to primary host 18. Entry from QS978 is at 2260 which sets up messages so that the MSC 17 stage scheduler can identify the source of the message and that it should go to an addressed director 16. For a message to primary host 18, entry from QS964 is at 226C. QS980 merely offsets the message into the job list; i.e., the messages for primary host 18 or director 16 are intermingled in the job list. In the FIG. 26 second row of instructions beginning with 2270, the parameters mentioned above are stored, and the message handler is called from 2280. Note that instruction 227C (top row of instructions) sets re-entry points EO for re-entry of the FIG. 7 illustrated program into QS960 after the message has been sent to either a host 18, 19 or to a director 16. Exit from QS980 at 2280 moves the program to QS970 (FIG. 22) for making the message call or the IOS call as previously described.

Flowchart step QS983 (FIG. 27) is an error handling subroutine. Any secondary pointer error is referred to QS983 which includes setting bit 5 of microprogramming register ST by instruction 21B0. A link pointer is set by instruction 21EC with offset being established by instruction 2324. The 2334 instruction word is a branch instruction which includes referring to the QCB entry and bit 4 of the ST microprogramming register for exiting to QS988 (FIG. 29) for calling a job list for further action or exiting to QS985 (FIG. 28) via either instruction 2374 or 2350 for restoration of the QCB in an error recovery action.

The flowchart step QS985 (FIG. 28) restores the QCB entry and tests for the ASQ entry having a destage error. At instruction 23B0, the micro code checks to see whether or not the pointer was of the secondary type; if yes, the ALU is dummied at 21C4 and QS973 (FIG. 23, supra) is entered. If not, instruction at 21C0 requires a re-read of the original QCB entry. It sets bits 4 of register ST at 21C8 and goes to QS983 for error and recovery functions. The entry at 2080 from QS963 accumulates the block and mini headers for the ASQ in error, test for destage (20A8), and at 20A4 sets bit 0 of register ST to 1 signifying a destage in error with no DE to a host 18, 19. QS964 is then entered for sending a DE signal to a host 19. Instruction 20AC is executed whenever the operation is not a destage with error. From here, QS964 is entered for sending a message to a host 19 signifying inter alia no destage with error.

Flowchart step QS988 (FIG. 29) calls the job list for ensuring that the destage with error continues. The single entry to QS988 is at instruction location 2348. QS988 resets the QCB cleanup bit indicating that the program of FIG. 7 will be exited. A test is initiated at 2358 if the pointer is valid; and at 2360 (top row), a link pointer is fetched which was stored in a previous routine. Then, after the link pointer has been appropriately processed, QS983 is entered. If there is no job list to wake up, then the branch at 2368 causes the program to execute instruction 2364 which in turn branches to either store the updated QCB entry, as at 2068, and then enter QS995 (for detecting more cleanup work, i.e., updating program control bits) or enters the sequence of instructions beginning at 23A0 which includes storing the updated QCB entry for later use and sets the job list wake up by instruction at location 239C. In this latter instance, the scheduler is re-entered using normal microprogramming techniques.

Program flowchart step QS990 (FIG. 30) transfers the block of ASQ indicating signals to a buffer (portion of internal memory) in MSC 17. This action prepares the MSS for recording the ASQ updated to the tables contained on DASD. The sole entry is at 2298 from either QS975 or QS965. The instructions merely show the techniques used to move the signals of the ASQ block to the buffer for operation by QS993.

QS993 (FIG. 31) read/write DSQ block merely initiates the read/write subfunction asociated with DASD spindles 14. MSC 17 initiates the action as a host to director 16 which then establishes a data path (using known techniques) between MSC 17 and the DASD controller 15 and spindle 14. All of the instructions in QS993 save the appropriate control signals such that director 16 and MSC 17 can cooperate in transferring the data signals, as above described. The only exit from QS993 is at 2498 which branches to MSC scheduler while inserting control signals in MSC 17 storage for initiating the read/write subfunction. Such read/write subfunction (not shown or described in this application), can be compared to access method services and input/output systems of present-day IBM 360/370 computers. After executing instruction 2498, the program returns to the MSC 17 scheduler.

Flowchart step QS995 (FIG. 32) includes instructions for determining whether or not more updating for destaging with error is required. Entry is from either QS988 (FIG. 29) directly or via the scheduler from off-page entry 88. Examination of the instructions shows that QCB entries are fetched and compared to determine whether or not all of the job listings have been completed. If not, QS998 (FIG. 33) is entered from 24D4 from 995 for more QCB operations. If the cleanup is completed, the MSC 17 scheduler is reentered from instruction 2428 or QS995.

Flowchart step QS998 (FIG. 33) sets register ME to "3C", zeroes bit 7 of register SC, and enters QS993 (FIG. 31) fore reading the ASQ block. Such action is in preparation for executing the programming illustrated in FIG. 8.

Destage Restart

Figure 8:
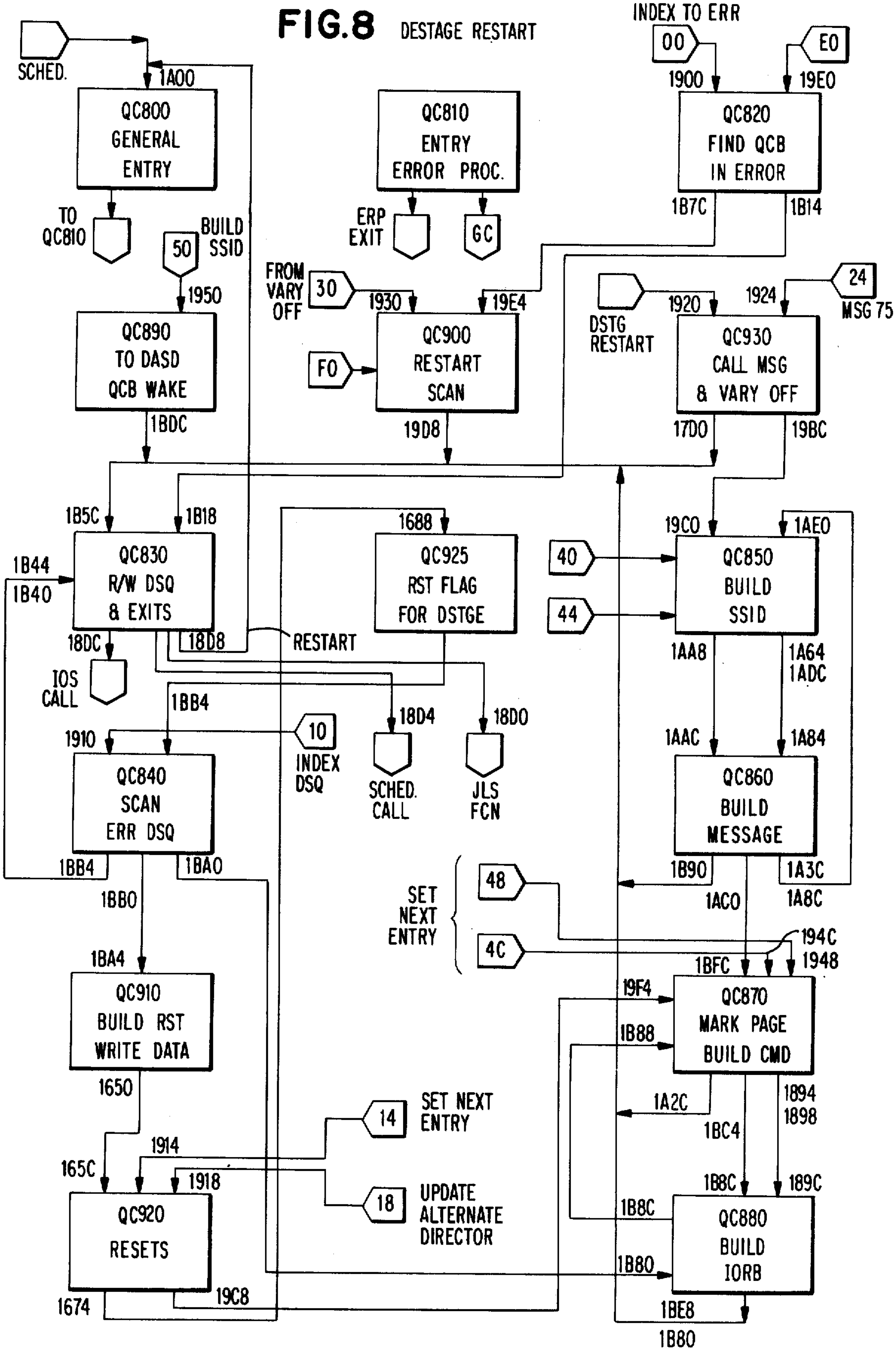
FIG. 8 is a flow diagram of destage restart microprogram steps.

Referring to FIG. 8, the program for initiating a destage in a destage with error is shown in flowchart form. This program sets all the control signals in MSS for facilitating reading DASD after a DASD destage read error and after the disk pack has been moved from one spindle 14 to a second spindle 14 without altering the logical address and, hence, without altering any of the control signals within MSS. That is, each pack contains an electrically sensed address card that determines the unit address of the pack, hence, the address of spindle 14 on which the pack is mounted. Such apparatus is included in the IBM 3330 disk storage apparatus. A portion of the programming initiates a vary-off, such as at QC930 (FIG. 39) which includes a vary-off neutral in which the disk pack is physically connected but logically disconnected, as will become more apparent.

The general entry to the FIG. 8 illustrated programming is to QC800 (FIG. 34) which includes the initial entry from the MSC 17 scheduler.

Figure 35:
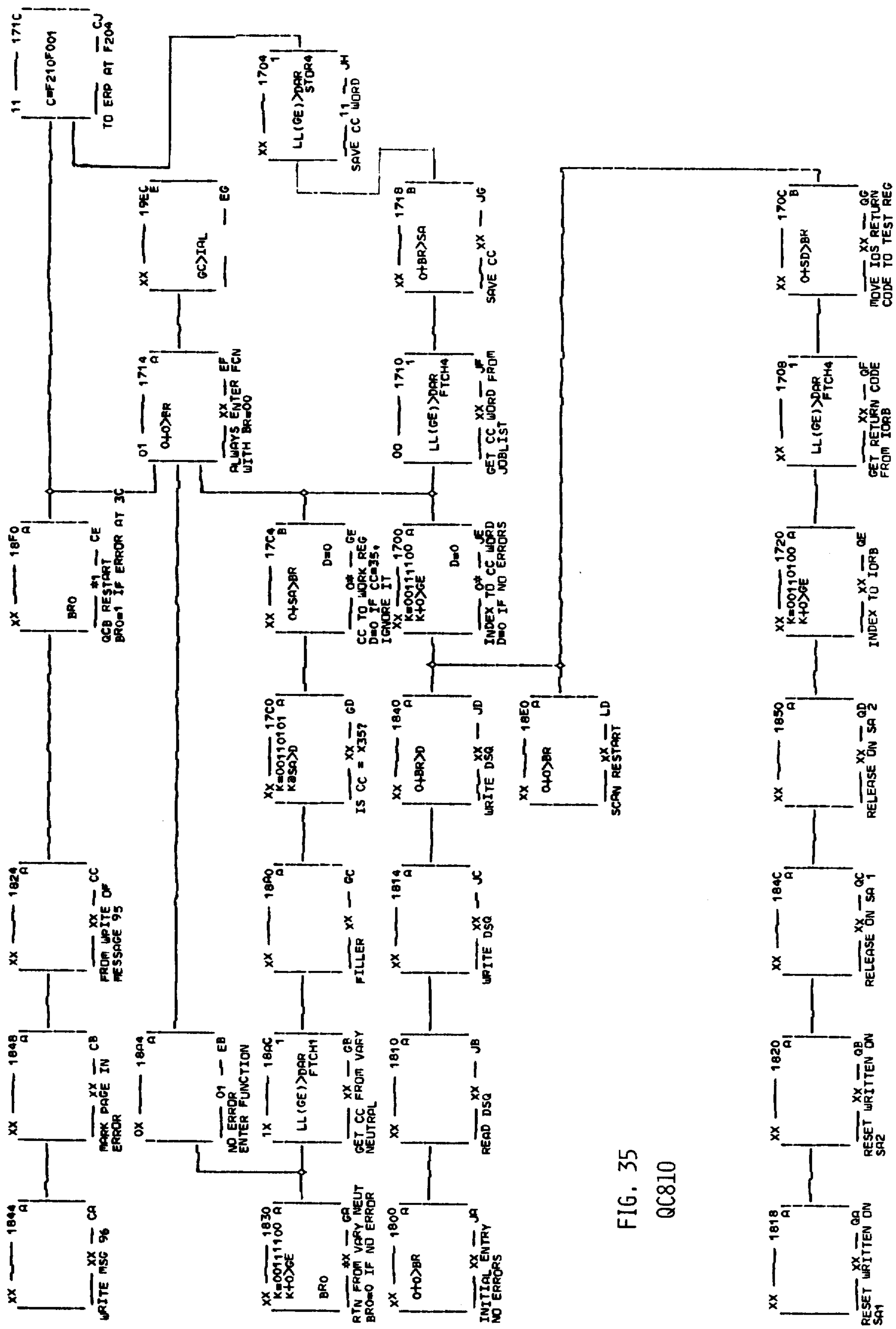
Figure 40:
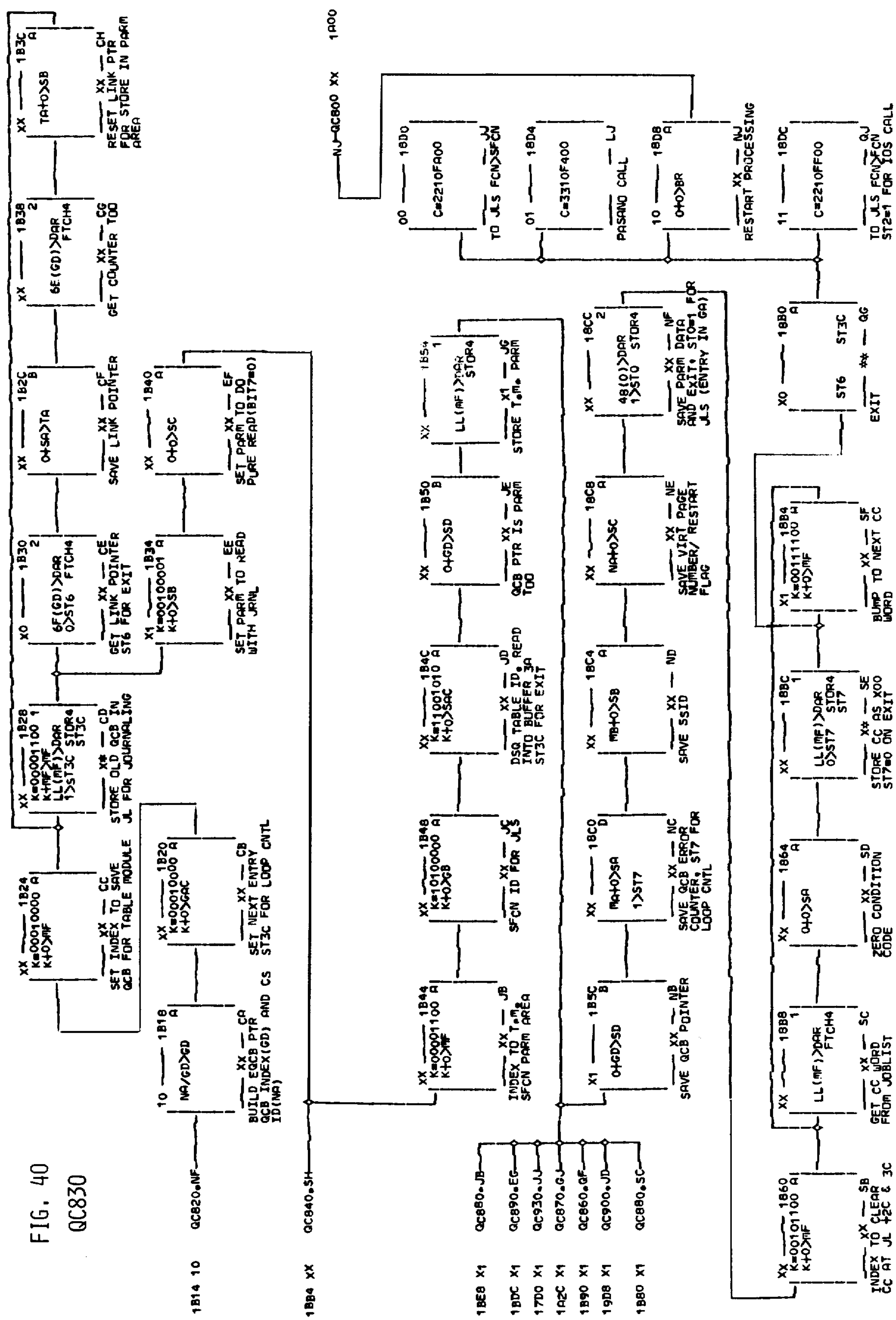

In addition to the program steps, FIG. 34 lists general entry points for a destage restart, as well as the entry point sequence. The format of the save area at memory address 4800 is also shown. In addition to being entered from the MSC 17 scheduler, restart entry also occurs from QC830 (FIG. 40). The MSC 17 scheduler entry is from a flowchart step (not shown) enumerated ZB021 of the MSC 17 scheduler. The sole exit is at 18FC, which connects control with the proper linking set of signals to QC810 (FIG. 35). The signal content of microprogramming registor GC goes to IAR for fetching an instruction word entering QC810, as next described.

QC810 (FIG. 35) flowchart step is entry error processing, i.e., it adjusts the program status signal for executing destage restart. Messages 95 and 96 are the message to the primary host 18 CPU to inform it of (95) equipment checks or (96) data checks. Included is the information and destage with error. Concerning the VOLID of the virtual volume being processed, entry to QC810 at 1844 occurs from writing the message 96, while entry at 1824 occurs from writing the message 95. Exit is at 171C which returns to the error recovery procedures (not shown or described) referred to briefly with respect to FIG. 6. In this instance, control of MSC 17 in the ERP is at register F204. The code recorded at F204 is GC. Another entry to QC810 is at 1830, which returns from the vary neutral function. This action makes the disk pack of the spindle in error unavailable to any host 18, 19. This inhibition is achieved by reserving the spindle to MSC 17. If there is, in fact, no error instruction 18A4 provides reference to a function (FCN) and then transfers content of GC to IAL, the off-page connector shown in FIG. 8. If there is an error, then in Column B, 18AC, the condition code is obtained from the vary neutral operation of the ERP. Instruction 18A0 is merely ad address filler. The instruction sequence following 18A0 is program housekeeping related to particular condition codes which is apparent from inspection of the instructions.

When there is an initial entry without error instruction at 1800, the following instruction sequence operates with DSQ's (as shown) for a pure DASD function not pertinent to the present invention. If there is a restart of the scan of DSQ's, the instruction 18E0 is entered which leads into instruction 1700 for indexing to the condition code as indicated.

More than one director 16 may be connected to a given controller 15 and spindle 14. In such instances, both directors must have information concerning the destage with error, even though only one of the directors 16 is directly involved. In such an instance, the reset written on the first director 16 labeled "SAL" is done in instruction 1818 (bottom row of FIG. 35); while for the second, labeled "SA2" is done at 1820. The release for the two directors 16 is in the two subsequent instruction words 184C and 1850. Then, there is an index to the IORB for obtaining the return code, i.e., link address. Then, the IOS return code is sent to the test register of MSC 17 and the routine branches to the proper exit instruction via branch instruction 1700.

Figure 36:
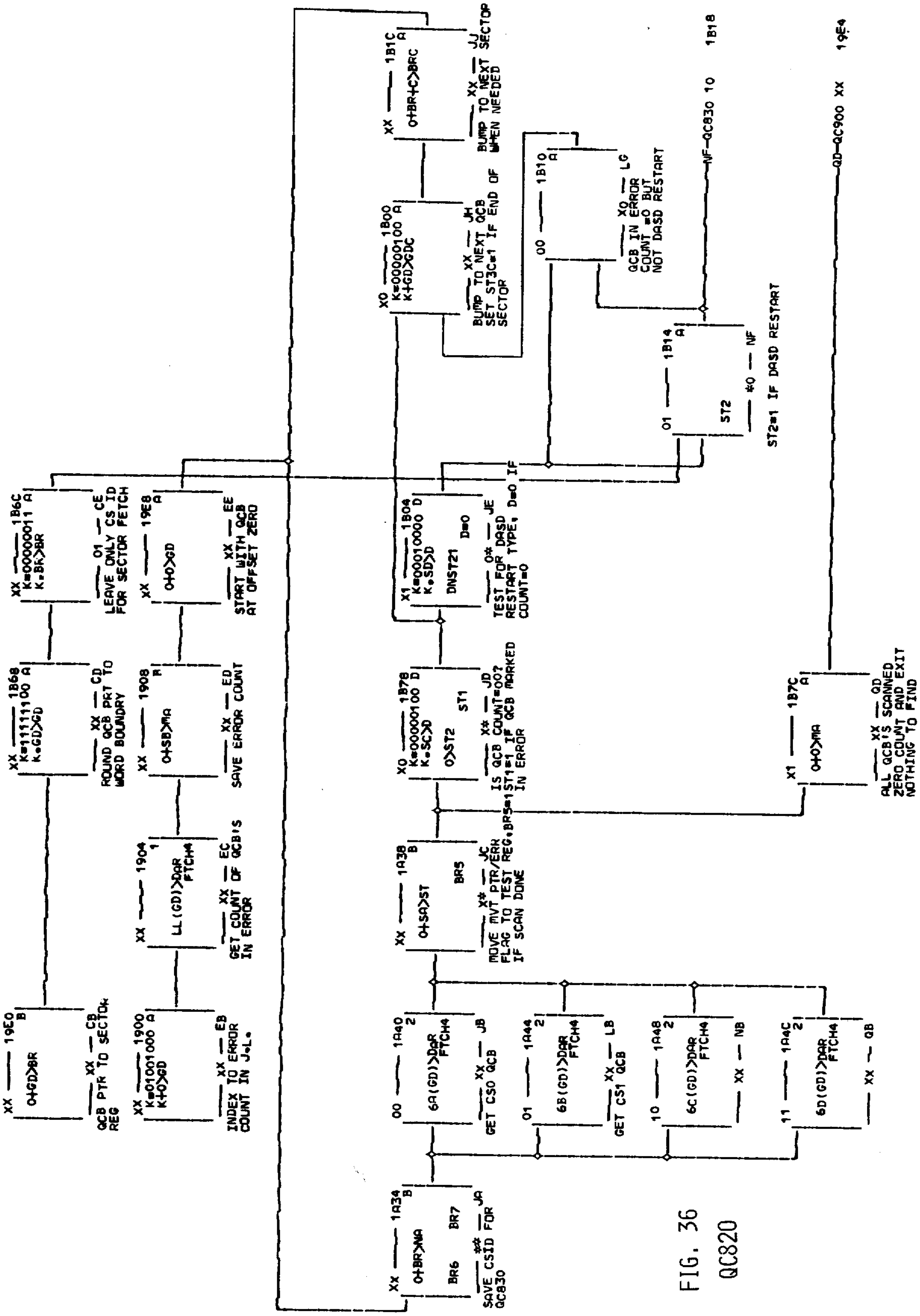
Figure 38:
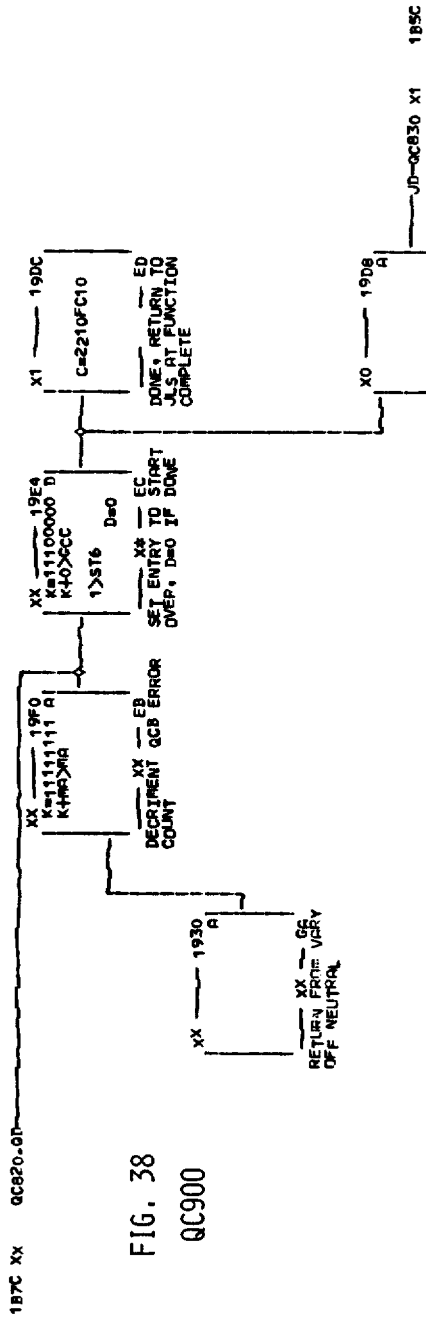

Another function performed by the FIG. 8 illustrated programs is to find the QCB in error. QC820 (FIG. 36) performs this function. All of the entries to QC820 are from instruction 19EC of QC810. The entry at 19E0 takes the QCB pointer and supplies same to the sector register of DASD, i.e., the register of MSC 17 which identifies the sector having the QCB pointer. Instructions 1B68 and 1B6C modify the QCB pointer for use with DASD. Then, the instruction at 1B14 sets bit 2 of ST register to 1 if it is, in fact, a DASD restart. Exit can be to QC830 (FIG. 40), later described, or the branch can be to more internal program code of QC820. If it is not a DASD restart, instruction 1B10 indicates that the QCB in error count is zero such that at 1B00 the QCB in error counter is incremented (bumped) to the next QCB. If it is at the end of the sector of DASD, then bit 3 of register ST is set to a one. In this manner, the QCB in error is found by the indication of a DASD restart. Note the QCB is not in error if there is no DASD restart. From 1B1C the program moves to 1A34 which saves the SSID for step QC830. Instruction 1834 is a fourway branch which goes to an appropriate instruction for moving an appropriate address to the data address register DAR. Instruction 1A38 moves the MVT pointer error flag to test register BR. Bit 5 is 1 if the scan is over, i.e., no QCB in error was found. If so, instruction 1B7C exits the program to QC900 (FIG. 38), as later described. On the other hand, 1B78 is executed if the QCB is marked as being in error. Then, instructions 1B00 and 1B1C an be re-executed in the illustrated loop for finding the QCB in error. Finally, previously described instruction 1B14 is executed; and QC830 (FIG. 40) is entered at 1B18.

Another entry to QC820 is at 1900 which indexes the program to error count in the job list. The QCB scan count is obtained at 1904, saved at 1908, and a QCB scan loop being entered through instruction 19E8.

Figure 37:
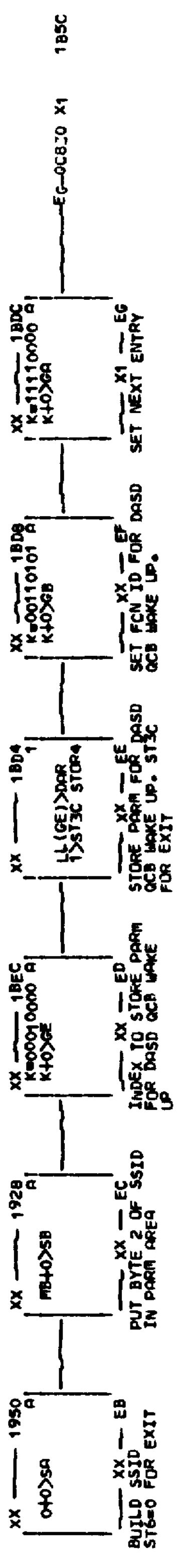
Figure 39:
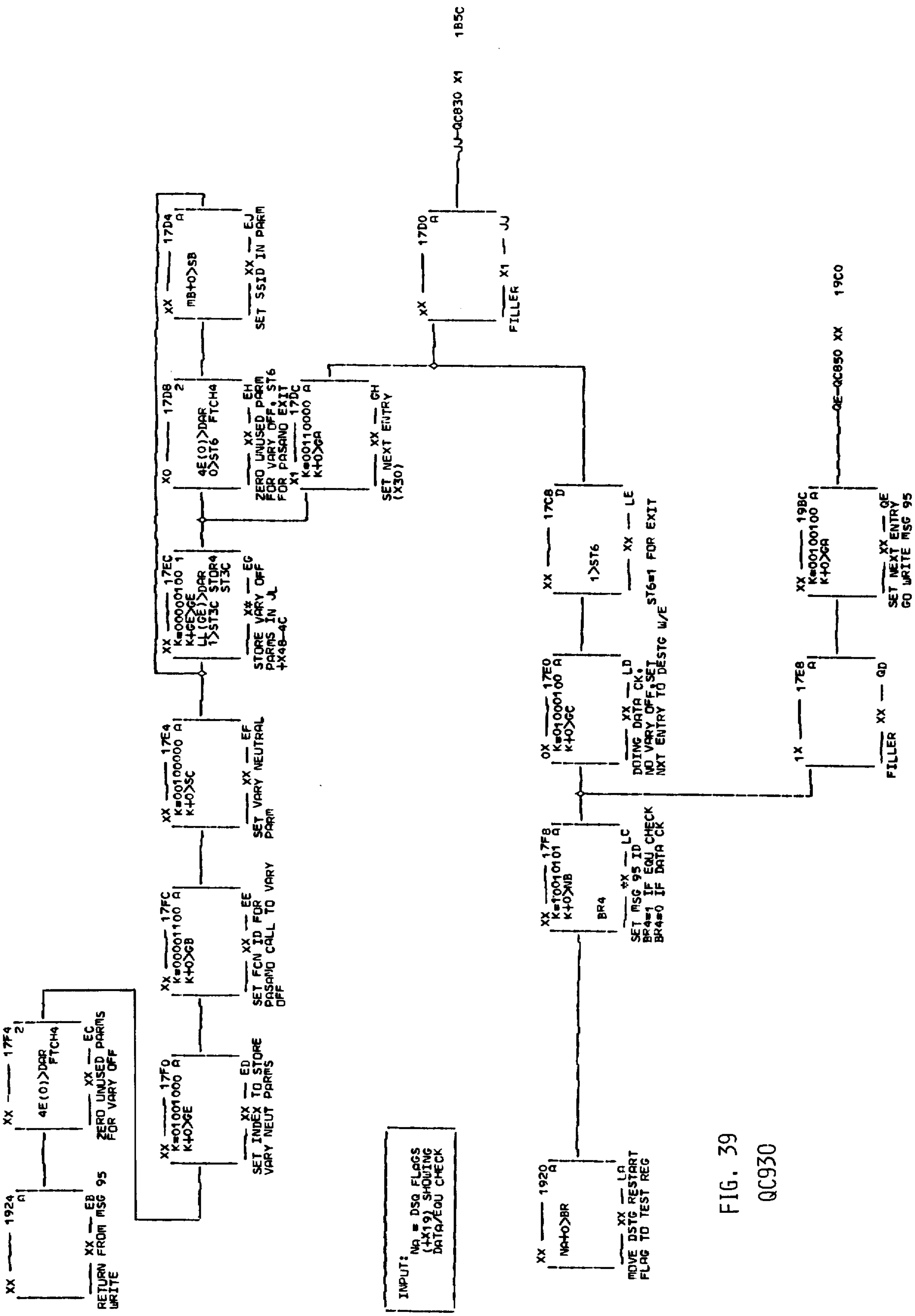

Before going into more of the detail of destage restart, other entry flowchart steps are first described, specifically, QC890 (FIG. 37), QC900 (FIG. 38), and QC930 (FIG. 39). Off-page entry 50 moves the program to 1950 of QC890 to build SSID for the QCB wake-up (followup). The QC890 entry is from 19EC of QC810. The SSID for the controller 15 and spindle in error is stored in a program-defined parameter area of MSC 17. The next entry of the FIG. 8 programming is then set by 1BDC (next entry from the block 19EC, QC810) and then QC830 (FIG. 40) is entered for exit from the FIG. 8 illustrated program.

Turning now to program step QC900, destage restart scanning is re-initiated. This can be done by entry from QC820. Instruction 19E4 checks for the D-bus being zero. If it is zero, all of the scanning is completed and instruction at 19DC returns to the scheduler of MSC 17 indicating function complete. On the other hand, if D is not zero, restart is initiated via 19D8 to enter QC830 at 1B5C.

Entry to QC900 can be from the vary-off neutral which was initiated by QC930 (FIG. 39). It must be remembered that vary-off neutral logically removes a controller 15 and spindle 14 from MSS while allowing it to be physically attached.

QC930 calls a program termed a message handler, and also initiates vary-off neutral. Once the above programs have detected that the DASD read error occured during a destage and that the DSQ in error has been found, and all of the control registers in MSC 17 have been set up as described for restarting the destage for recovery purposes, the offending spindle 14 can be varied off. Off-page connector 24 allows the program sequence to enter QC930 at address 1924, which is a return from sending a message 95. The subsequent instructions 17F4 et seq set up MSC 17 for varying the offending spindle 14 off. The three instruction loop 17EC, 17D8, and 17D4 finish setting up MSC 17 for the vary-off operation. Once the appropriate number of entries have been made, the branch instruction 17EC directs the program to 17DC, which sets the next entry for flowchart step QC830 (FIG. 40), which in turn, exits via 18D0 (FIG.

40) to the JLS function, i.e., calls the vary-off programming. The latter programming is the same as used in the IBM 3830-II Director.

Figure 45:
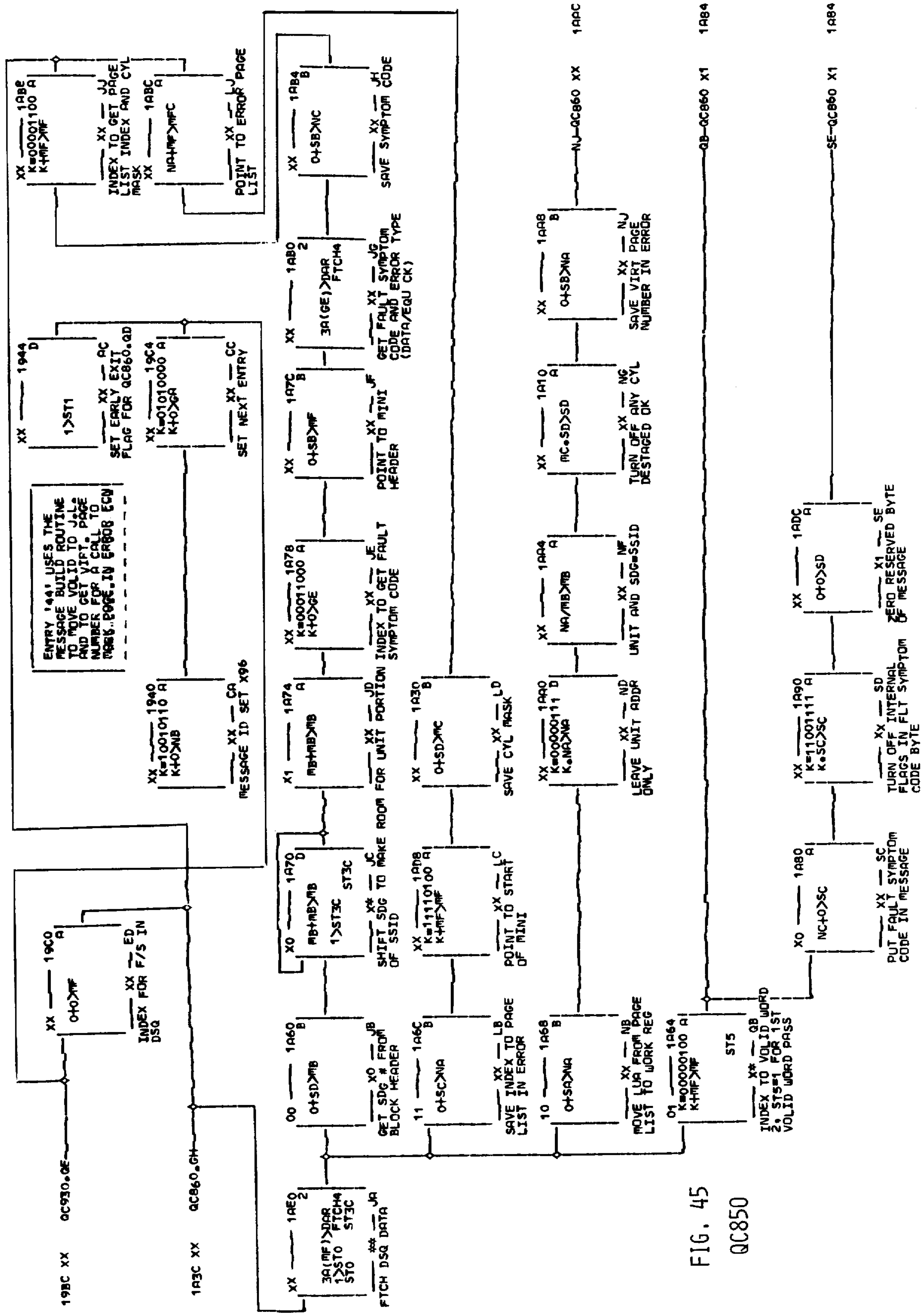

Prior to this time, the DSQ flags have been stored in microprogramming register NA. Entry into QC930 from destage restart which is from QC800 moves the DSQ flags from NA into branch register BR. Both flags are checked at 17F8 (FIG. 39) which determines whether or not a vary-off neutral is to occur. If BR4 =1, it is an equipment check; then, instruction 17E8 and 19BC are executed to enter QC850 (FIG. 45) for sending the message to director 16 for recovering from the equipment check. However, if a data check is detected (BR4 =0), then the next entry is set to destage with error for recovery from that DASD read error (data check). QC830 is entered, as above described, for the vary-off operation.

QC830 flowchart step provides the exit routines in the read and write of the DSQ with respect to DASD spindle 14 stored control tables of MSC 17.

Figure 41:
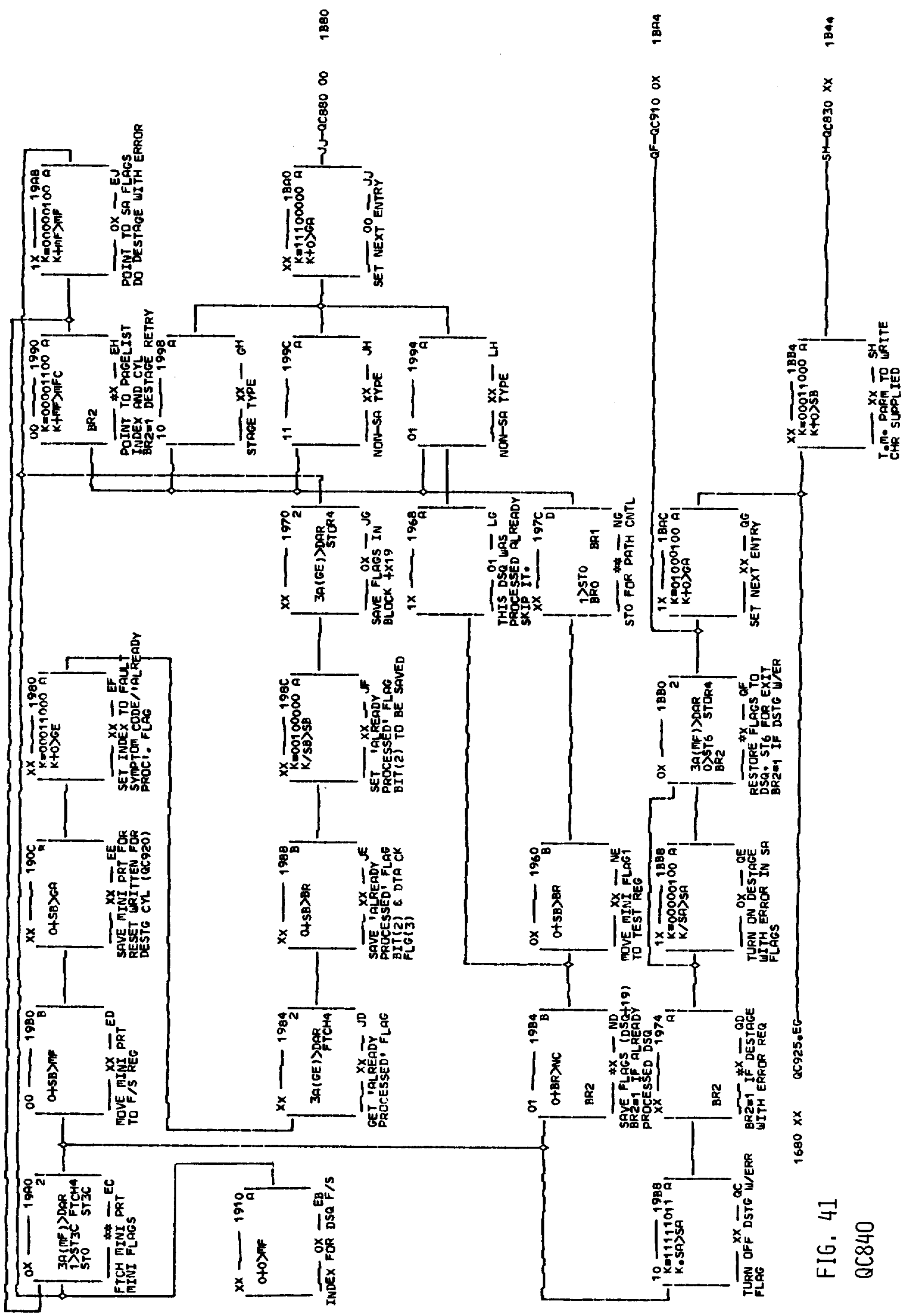

QC830 (FIG. 40) is divided into three sequences. A first portion begins with instruction at 1B18. This first sequence of instructions through 1B40 does program housekeeping functions required after QC820 has found a QCB in error. EXit from this first sequence of instructions is to the second sequence of instructions beginning at 1B44. Entrance at 1B44 also is from QC840 (FIG. 41), which is a part of scanning for the error in DSQ. Finally, the third sequence, beginning with instruction 1B5C, includes entries not only from the first and second sequences of QC830, but also from a plurality of other flowchart steps. This third sequence provides general processing required by the programs for the plurality of exits at 18D0, 18D4, 18D8, and 18DC, which respectively are the job list function and subfunction call, the pasano call, restart call to QC800, and the IOS call via the job list function.

Figure 42:
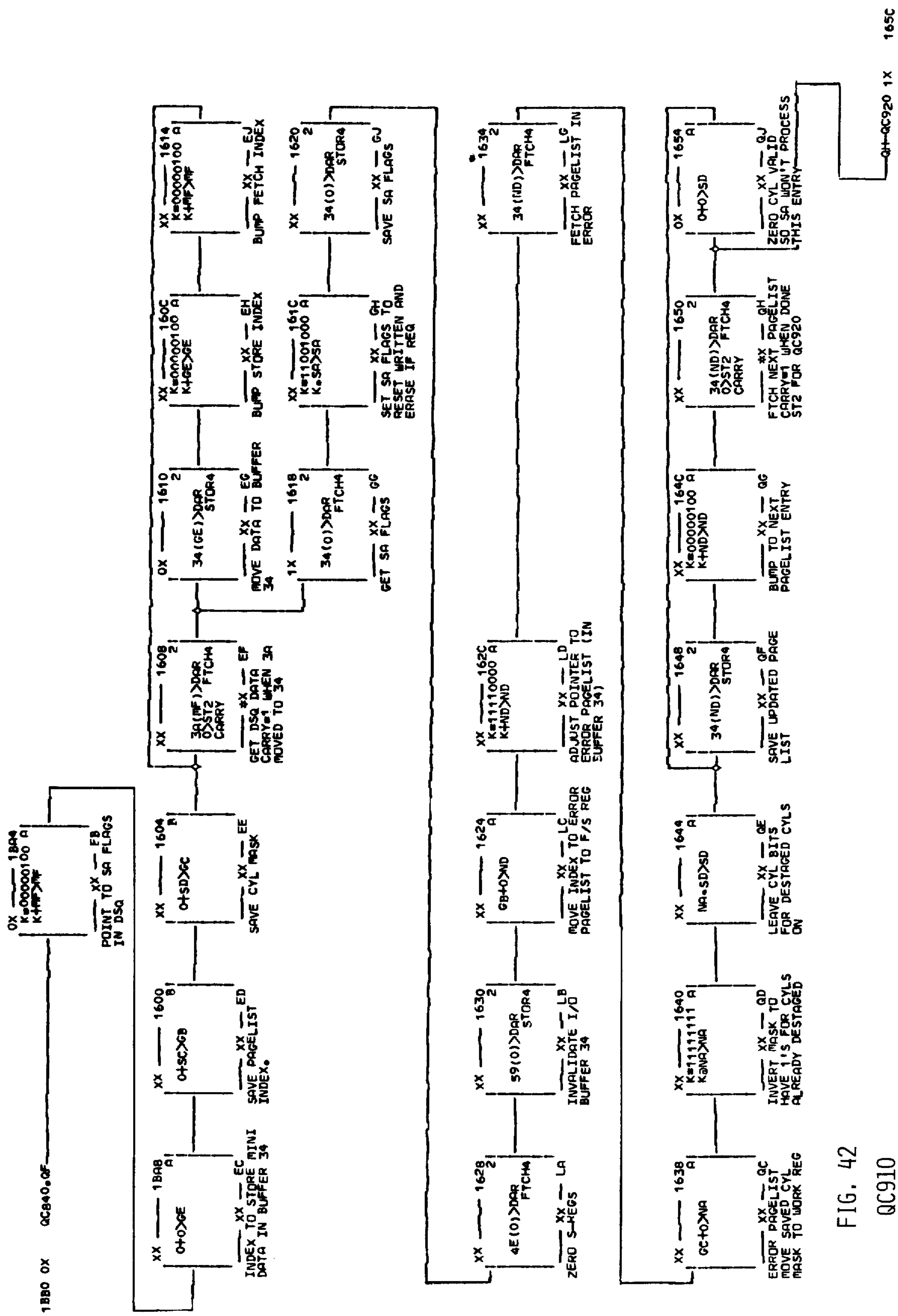

QC840 (FIG. 41) scans for the error DSQ and then the program exits to either build the IORB at QC880 (FIG. 48), build a reset for writing data at QC910 (FIG. 42), or exits the write to DSQ to QC830, supra. An entry from QC925 enables the proram to patch QC925 to QC830 for writing DSQ. Instruction 1B44 only is used in that patch.

Entry to QC840 at 1910 enables the program to index for the DSQ read function and subfunction. Assuming that the DSQ has not been processed, then the instruction sequence, beginning at 19B0, is executed for indexing for the DSQ. Upon completion of processing, the entry branch instruction at 19A0 branches to either 19B4, DSQ processed, or to 19B8 for building the reset write data. Assuming the processing is completed, the program proceeds through 19B4, 1960, thence 1B40, thence to QC880 to build the IORB. If it is a non-SA type, QC880 is also entered.

Figure 48:
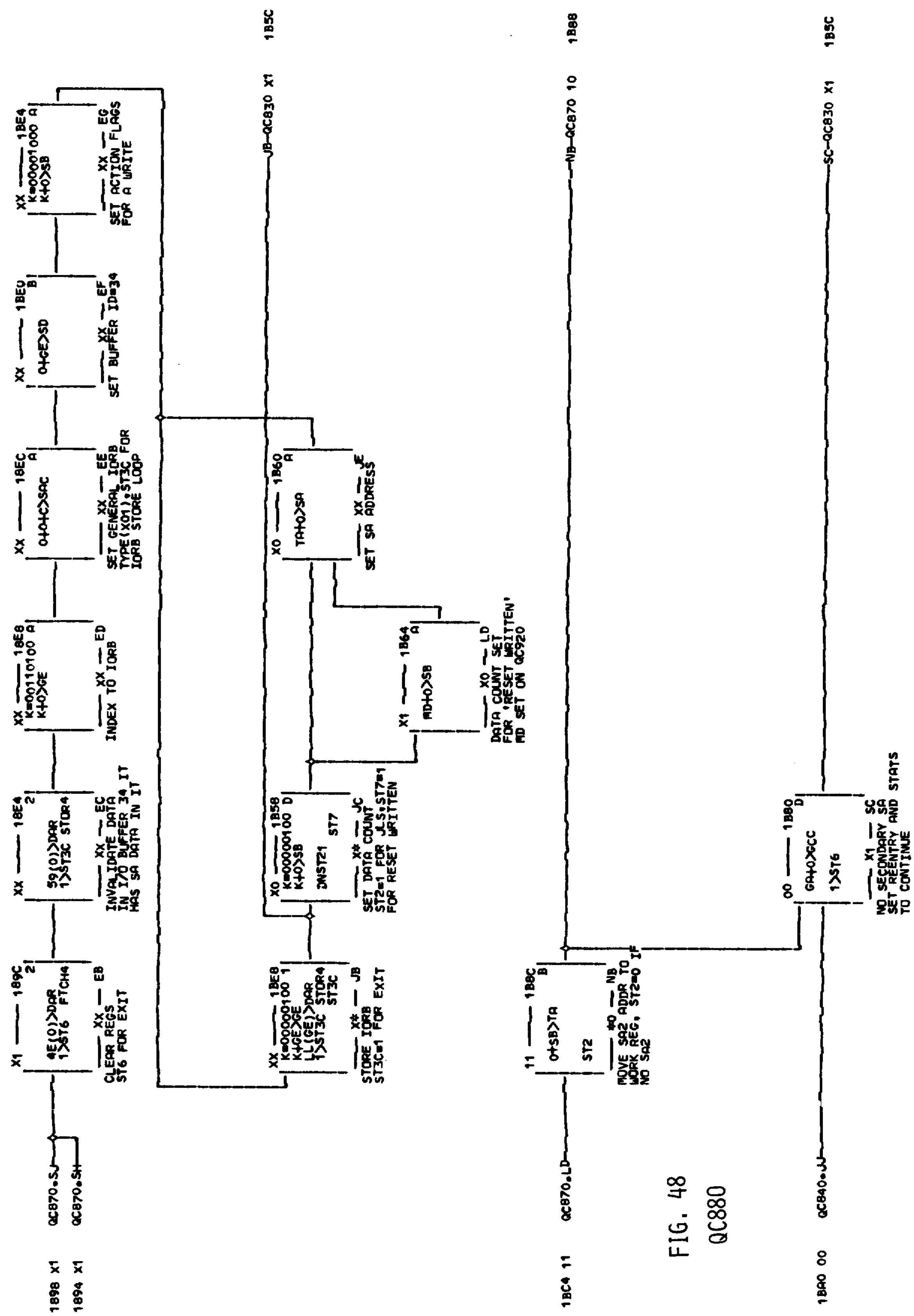

If the DSQ was already processed, the instruction 1968 and 1BA0 direct the program for building the IORB at QC880 (FIG. 48). On the other hand, the destage with error can require that the DSQ be written. In this case, the branch from instruction 1974 is to 19B8 wherein general control of the destage with error flag is turned off. The destage with error flag in director 16 (SA flags) is set at 1BB8 and, then, the QC840 is excited by the instruction 1BB4. This exit goes to QC830 as previously described.

QC910 (FIG. 42), which is only entered from QC840, builds resets for written data in the destage with error process. This action identifies the pages in error to ensure that the director 16 (also abbreviated as SA) will not process data from the page in error. The SA flags received from director 16 are first pointed to in the DSQ. The DSQ moves to the MSC 17 buffer area of its main storage in the small loop beginning with instruction 1610. Upon such data being moved, the branch at 1608 fetches the flags and adjusts same for reset written. Then the buffer is invalidated at 1630 and the error page list pointer is adjusted at 162C (page list is a list of pages in DASD spindles 14 to be staged/destaged). Then, at 1640, the program determines which of the cylinders in a page have been destaged. That is, program tests for which of the cylinders of DASD were destaged without error. This function is achieved by inverting the mask for the page, there being one bit for each of the eight cylinders in each page. A one normally indicated that data has been written in the cylinder. By inverting the mask, the 1's will indicate the cylinders have been destaged. It should be remembered that when a cylinder is destaged and the data has been successfully recorded in MSF, the cylinder mask is altered to reflect a zero indicating that destaging is not required.

Figure 43:
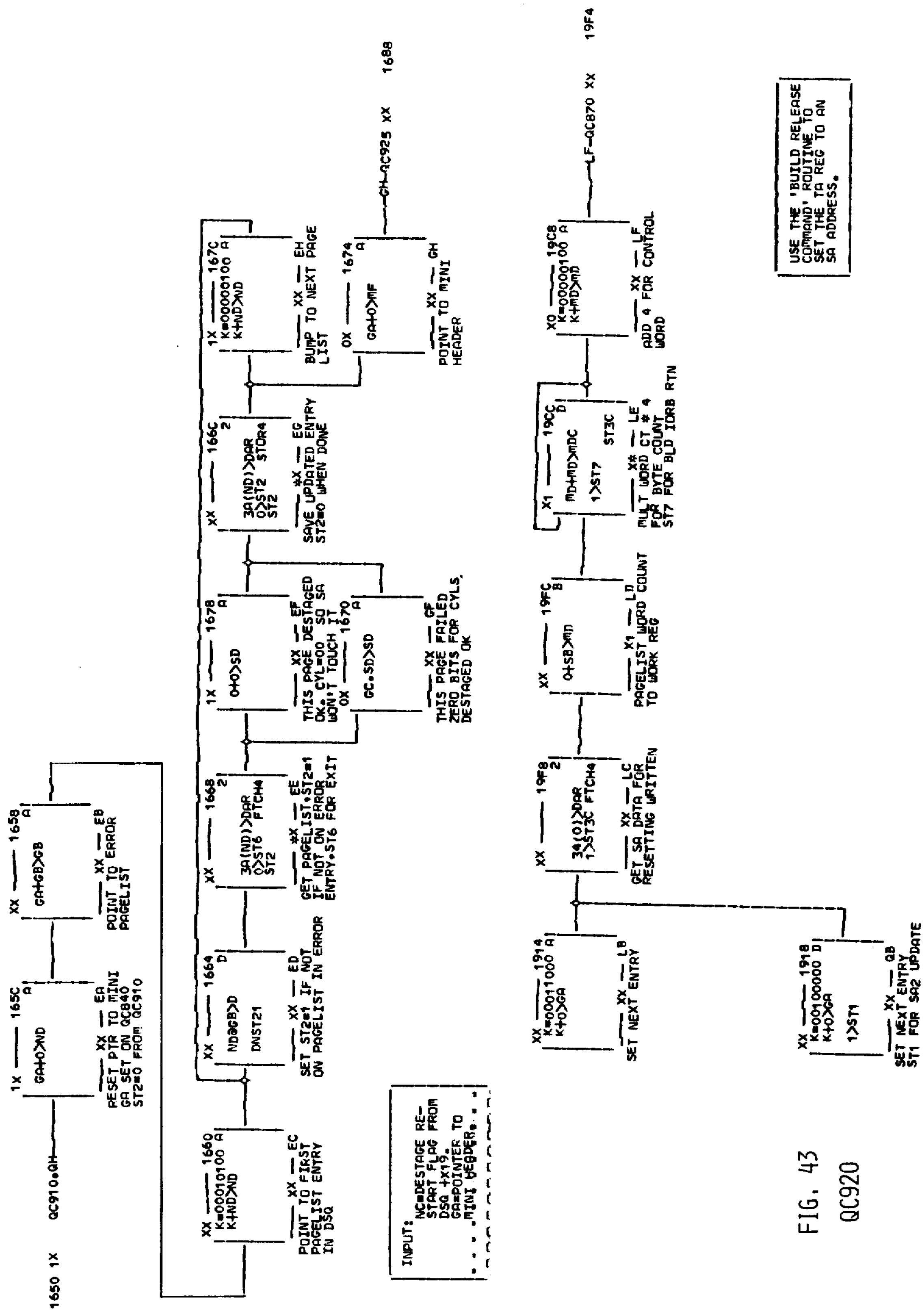

The last instruction loop, beginning at 1648, is for program housekeeping to control the page list entries and accessing. The sole exit from QC910 occurs after the page list processing has been completed; it is to QC920 (FIG. 43) via branch 1650.

QC920 (FIG. 43) follows QC910 to reset cylinder valid bit and reset the written data. Resetting the cylinder valid bit provides an indication to director 16 that the cylinder in spindle 14 does not contain data. That is, when director 16 looks at the cylinder valid map, it appears to director 16 that data from MSF has not been staged to that particular cylinder. In this manner, director 16 will not access the cylinder in error thereby protecting the error condition from being inadvertently accessed by a host 18, 19.

Figure 44:
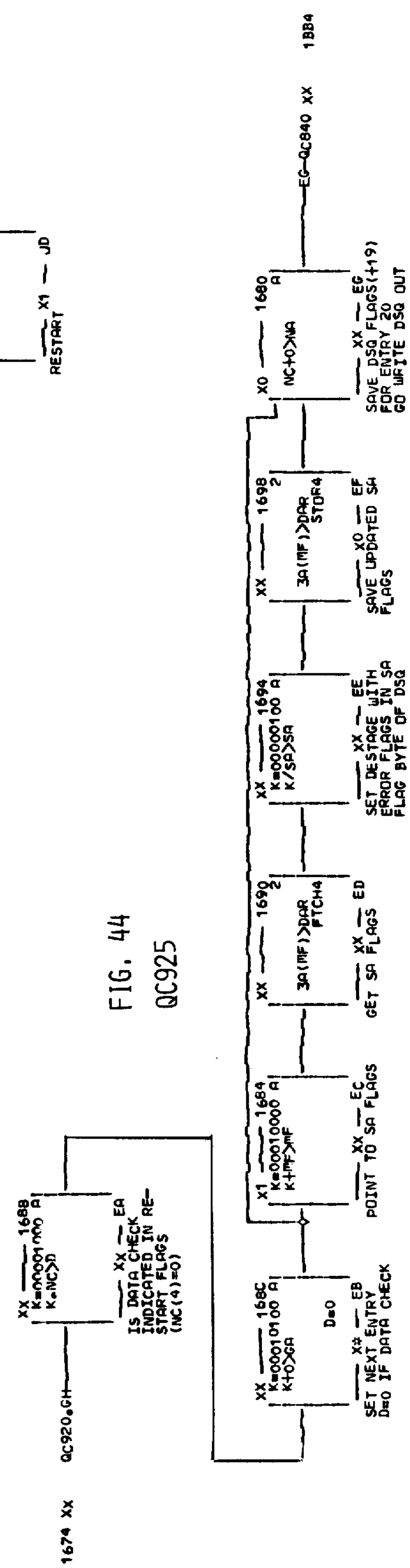

In QC920, microprogramming register NC of the computer circuits has the destage restart flag; while register GA points to the mini header in MSC 17 storage. Preliminary processing portion of QC920, at 165C et seq, determines which cylinders have been destaged without error. At 1674, the program points to the mini header and exits to QC925 (FIG. 44). Flowchart step QC925 merely resets the destage flag and sets same with error flags in director 16 SA flag byte for the DSQ. The program immediately returns to QC840, previously described.

A second portion of QC920 sets the entry for updating the alternate or second director 16 (each spindle 14 may be connected to two directors 16). This is done by obtaining the data for the director 16 (SA data) and then building a command to such director 16 in flowchart step QC870.

Figure 46:
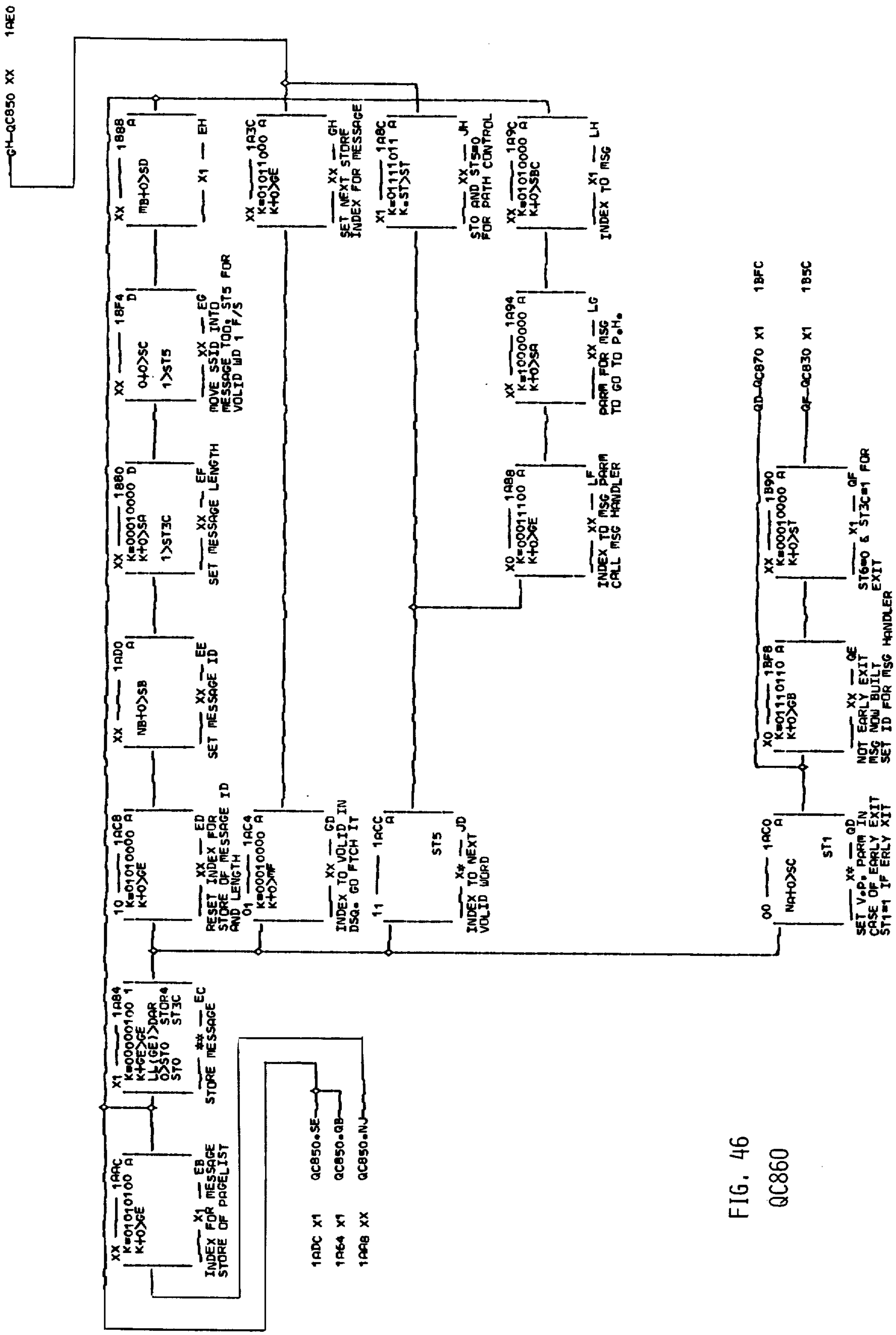
Figure 47:
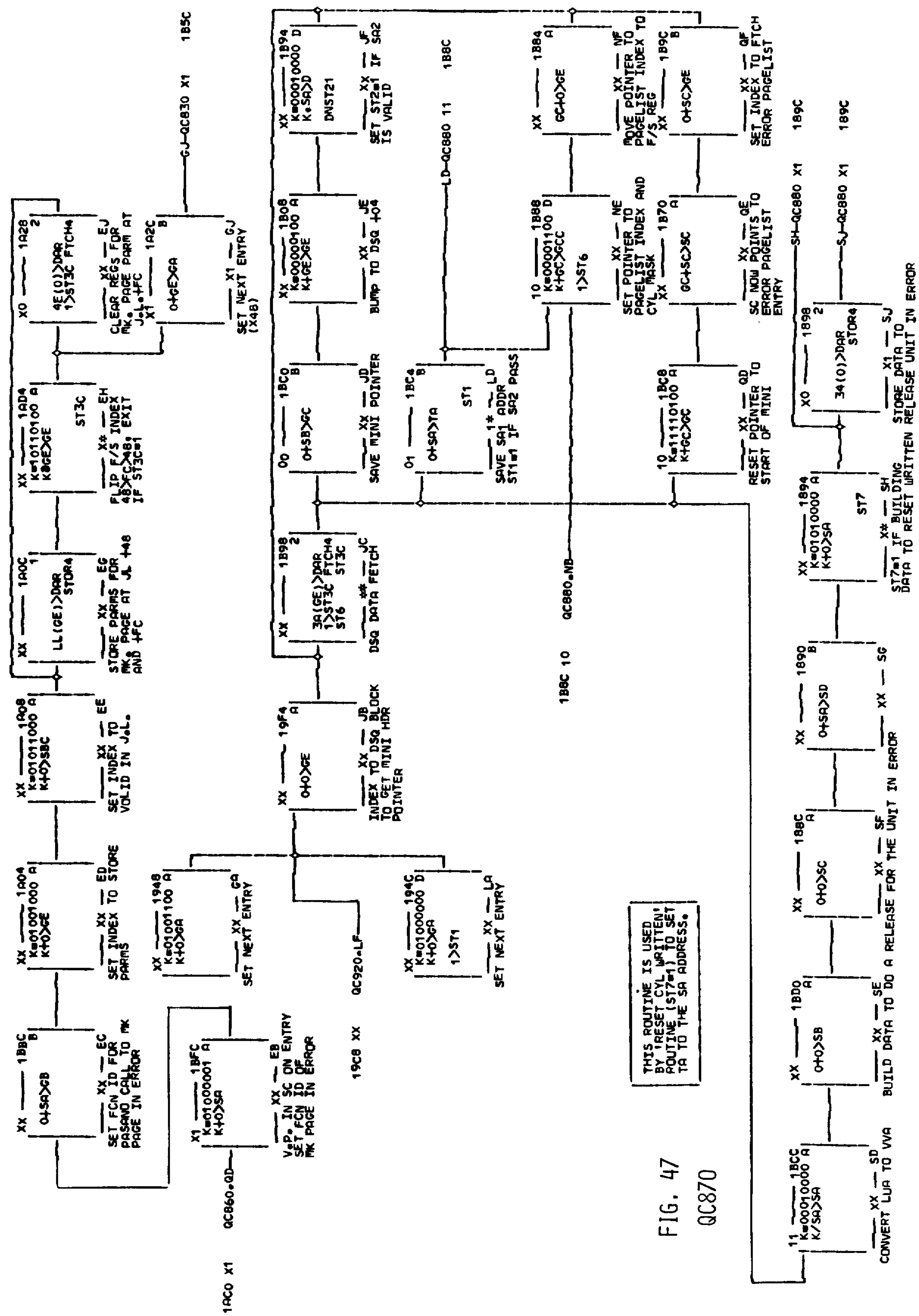

The flowchart steps QC850 (FIG. 45), QC860 (FIG. 46), QC870 (FIG. 47), and QC880 (FIG. 48) all relate to constructing commands and messages in connection with destage restart. Because this is an addressing function, QC850 identifies the SSID of spindle 14 in error and puts the information in message form, and then saved. QC860 takes the information which has been previously assembled in various locations and formats same into a message for transmittal to the receiving unit such as director 16. QC870 has two functions. In MSC 17 control tables, it marks the page in error, i.e., set of eight cylinders containing the DASD read error which occured during a destaging operation. It then builds a release command to the director 16. QC880 build the release IORB for releasing director 16 later in the destage with error functions. The destage with error operation has been completed to a point enabling marking the page error on the offending spindle 14.

Mark Page In Error

Figure 9:
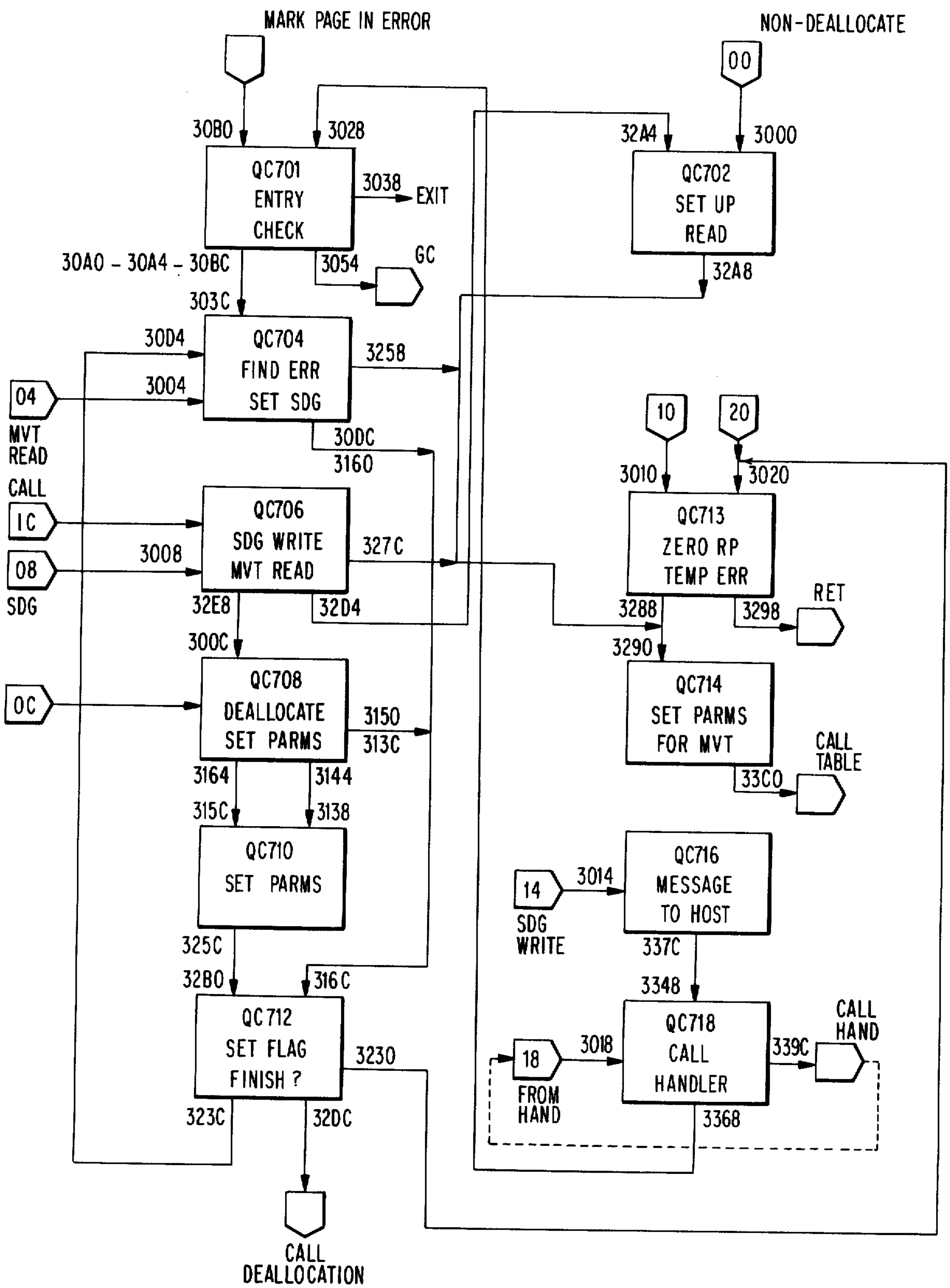
FIG. 9 is a flow diagram of mark page in error microprogram steps.
Figure 10:
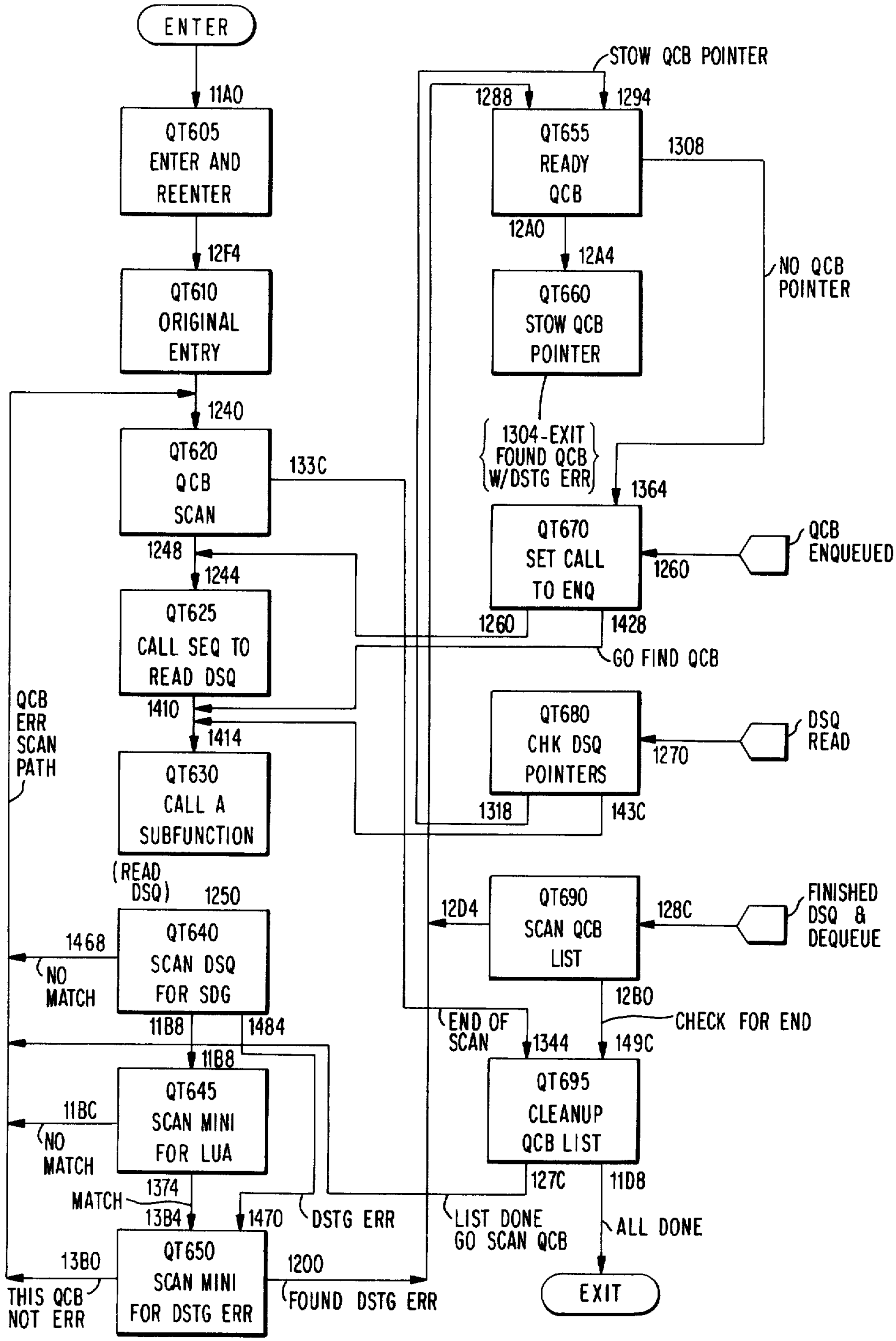
FIG. 10 is a flow diagram of DASD or upper level queue control block restart microprogram steps.

The destage restart having set the control signals in MSS for enabling destaging the data in error, the FIG. 9 illustrated program effects a control in MSS identifying the page having the permanent DASD read error in such a manner that the page will never be allocated again for receiving staged data signals from MSF. The instruction sequence charts are in FIGS. 49 -59. This marking of the DASD page prevents that portion of the spindle 14 pack from being reused. This action facilitates reclaiming the data residing on the damaged page, as well as preventing repeated errors caused by reuse of that portion of spindle 14. The error flag pointing to the page in error, i.e., the marking, is turned off when the pack is varied off and turned back on when the pack is varied back on.

The program has two sets of interface requirements depending on whether or not the MVT entry for the virtual pages to be marked in error are in the MSC 17 buffer at the time the mark page in error program is invoked. If the MVT entry is not in the buffer, then the job list index is looked at to find VOLID. The virtual page to be marked has to be identified. The requirement is that the VOLID must be on a word boundary and the job list at offset FF identifies the caller. A "caller" is a program request for action. On the other hand, if the appropriate MVT entry is already in the MSC 17 buffer, identified as buffer 32, a plurality of pages of the same VV can be marked in error by one program execution. A temporary flag in the MVT entry, bit 3 of the flag device byte, has to be set to a 1 for the pages to be marked in error. After the pages are marked, these bits are set to a 0.

Output of the program depends on one of four sets of action taken by mark page in error. These, in turn, depend on the attributes of the page which is identified as being in error. The first is a real page in a virtual page entry of MVT being a 0. The program assumes that the error occured on a destage scheduled by a clear volume command. A clear volume command is from the host CPU preparatory to varying spindle 14 off-line. Since this process will automatically zero the page in error flag, no action need be taken. In the second instance, the error occurred on a page belonging to data staged in DASD which is not permitted to be destaged; i.e., a host 19 has commanded MSS to bind the volume or the data set on DASD such that it is always accessible. In this instance, mark page in error marks the page in error flag, but the page is not deallocated; i.e., allocation still remains to the bound volume. The third instance occurs when there is an inactive page not belonging to a bound volume or for a bound volume which has been demounted; i.e., the host CPU has said to MSS: Take the data and put it in MSF. In this instance, the page in error flag is set, and the real page identifier in the MVT entry is zeroed. Inactive page count is then decremented. In the fourth instance, the error occurs in an active page that is not bound to DASD. In this instance, the page in error flag is set, the real page entry in MVT is zeroed, the page is deallocated from assignment to force any active cylinders off DASD, and the program decrements the inactive page count by 1. The decrementing of inactive pages means that the page being marked in error is not active; hence, when it is made inactive, the page count would be incremented to keep an accurate count. Marking the page requires that the inactive page count de decremented.

In some instances, a page may be detected as being in error by a host without the error being detected by MSS. In this instance, the director 16 identifies the page error to MSC. The microprogram registers used in this program are MA containing the virtual page in error identification, MB containing the real page in error identification, MD identifying the virtual page index location in the MVT, and MF containing the constant OC. Upon termination of the program, the contents of MA, MB, and MD are invalidated. The ST register assignments include bit 1 indicating deallocation required, bit 2 indicating destage with error, bit 3 looking for multiple errors, bit 5 indicating MVT write is required, bit 6 indicating 0 real page entry in MVT, and bit 7 indicating a loop control.

The program instruction sequence details for effecting the above-described functions of FIG. 9 flowchart sheets QC701-QC718 are shown in FIGS. 49-59, one figure per FIG. 9 flowchart step as hereinafter set forth.

Figure 49:
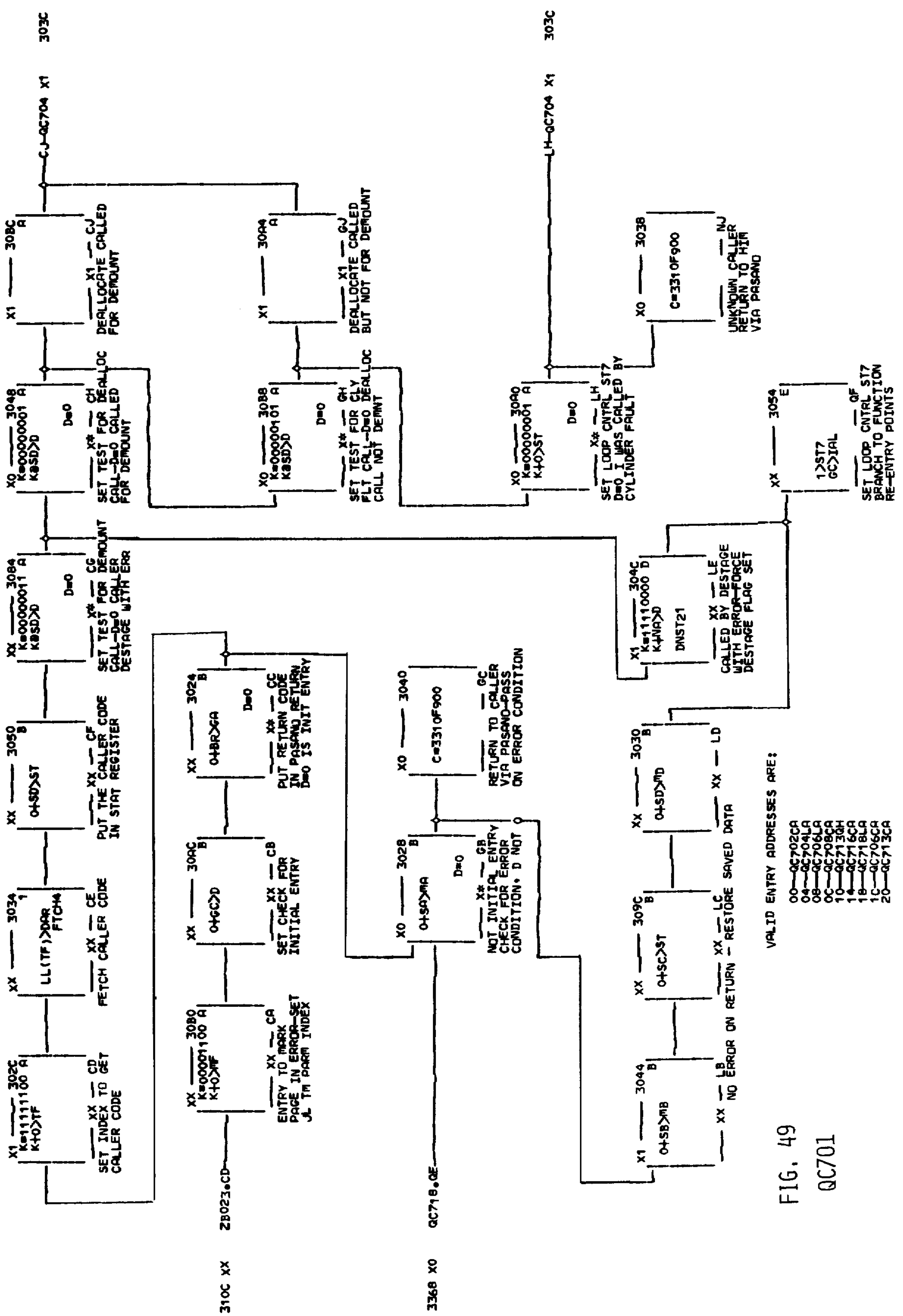
Figure 50:
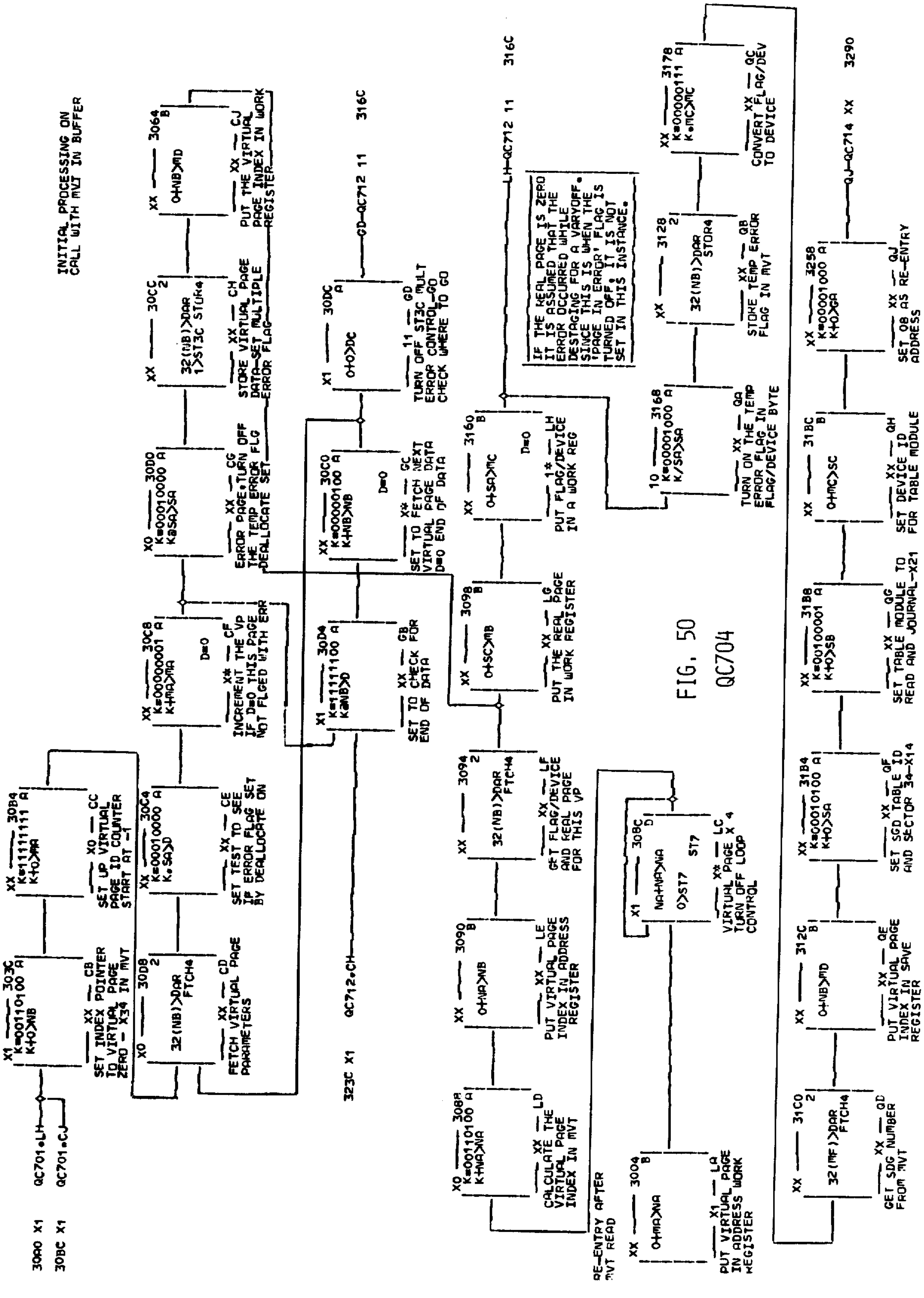
Figure 51:
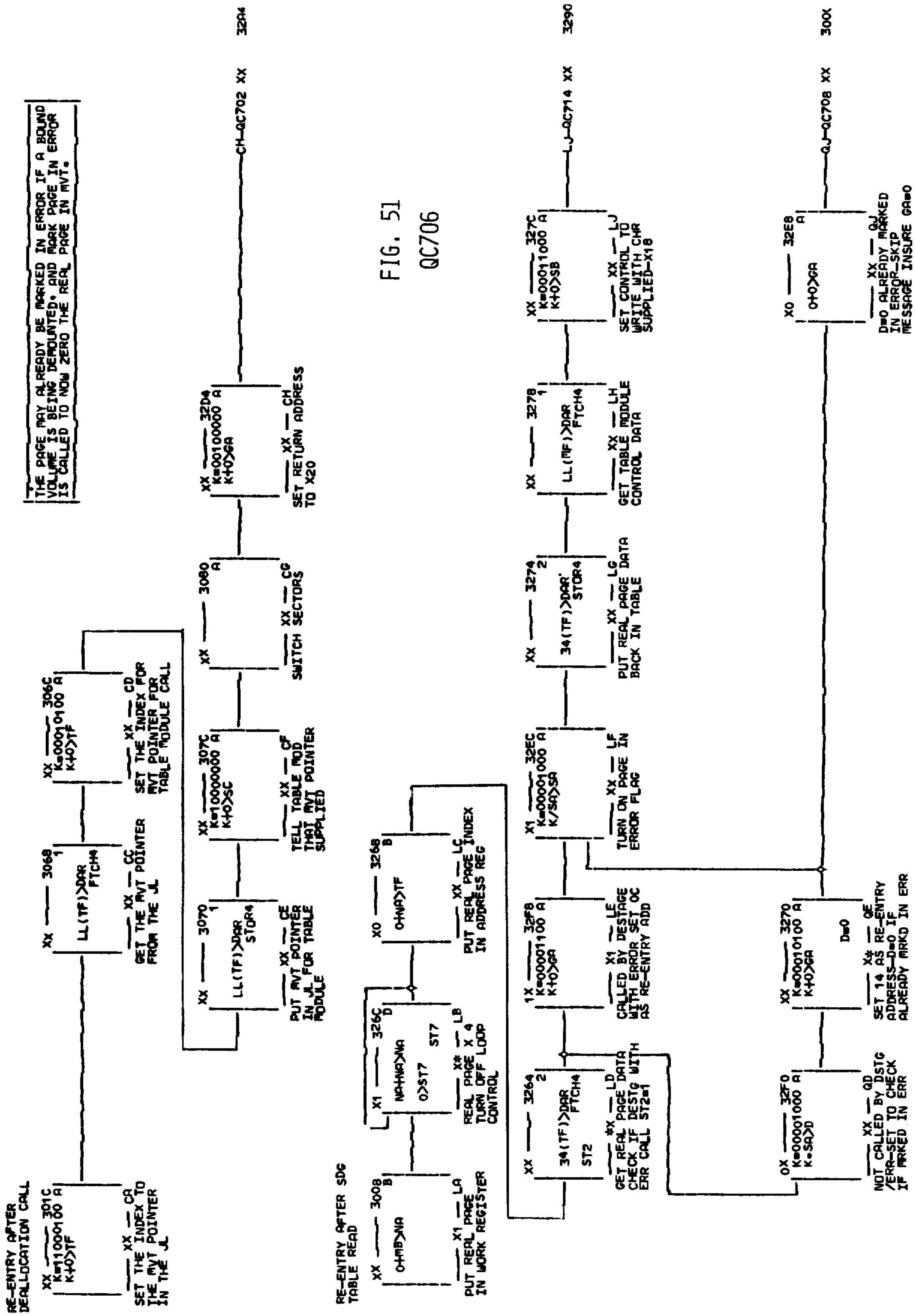
Figure 52:
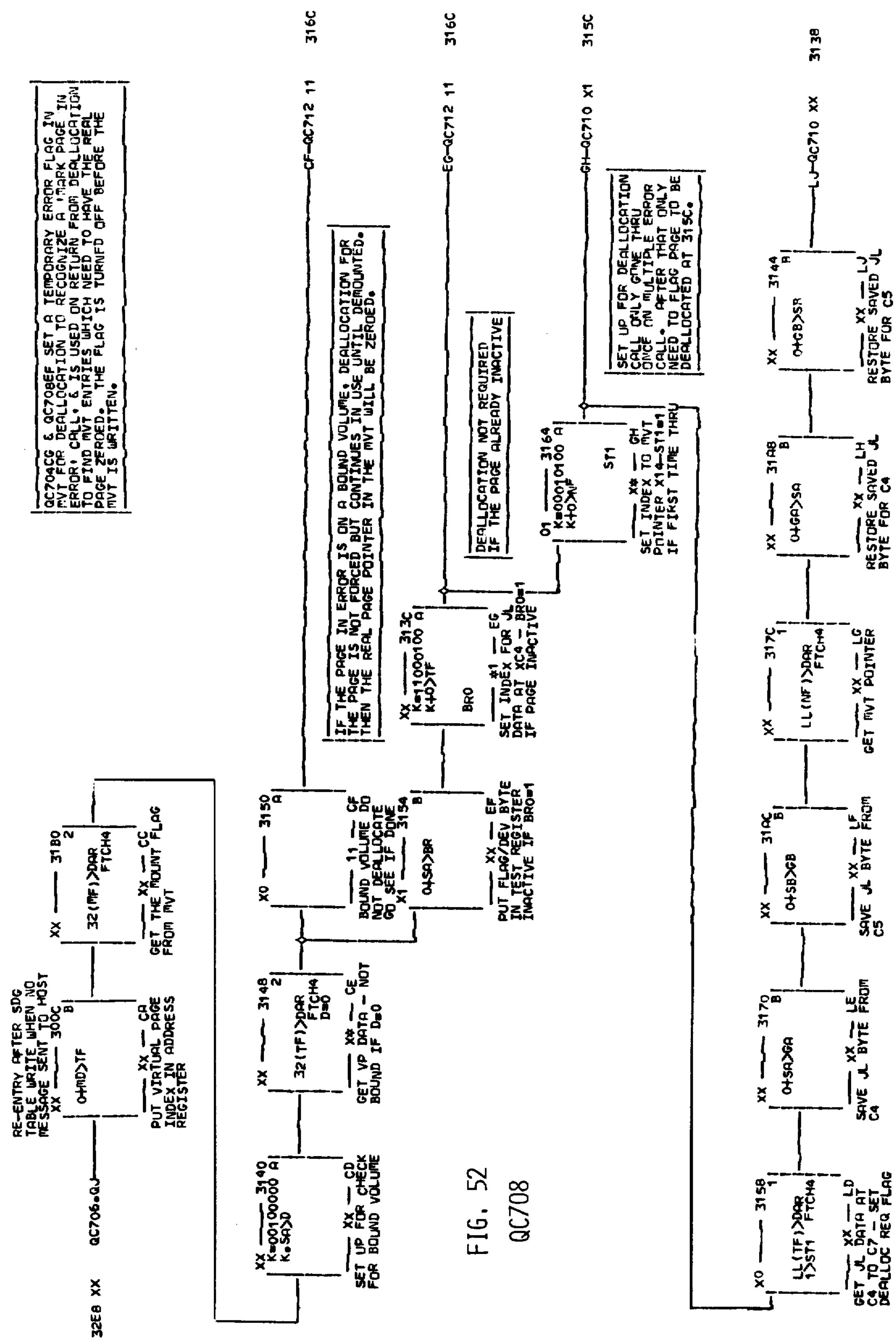
Figure 55:
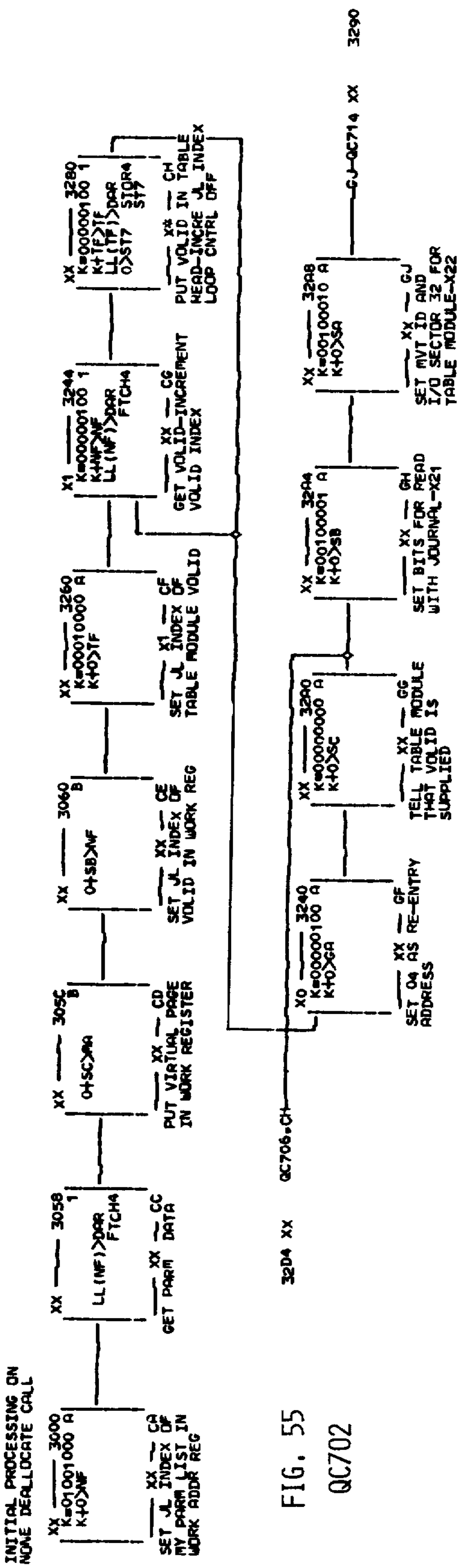
Figure 53:
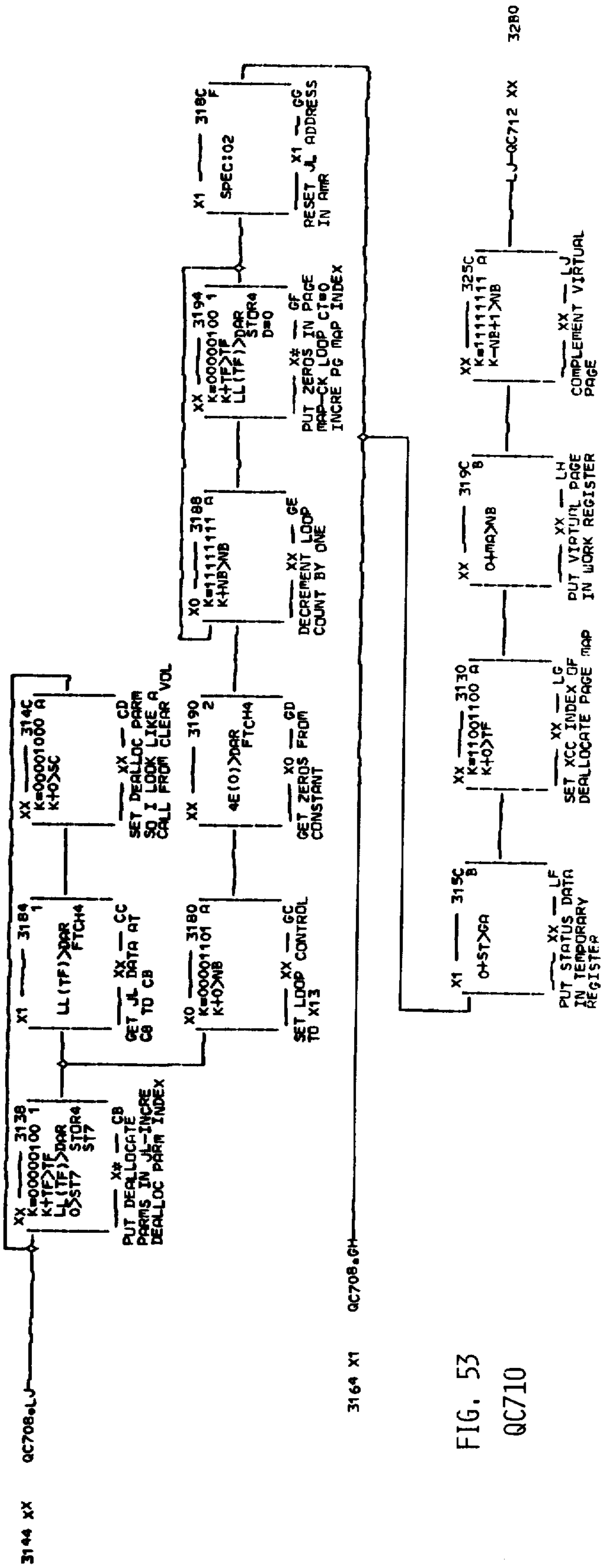
Figure 54:
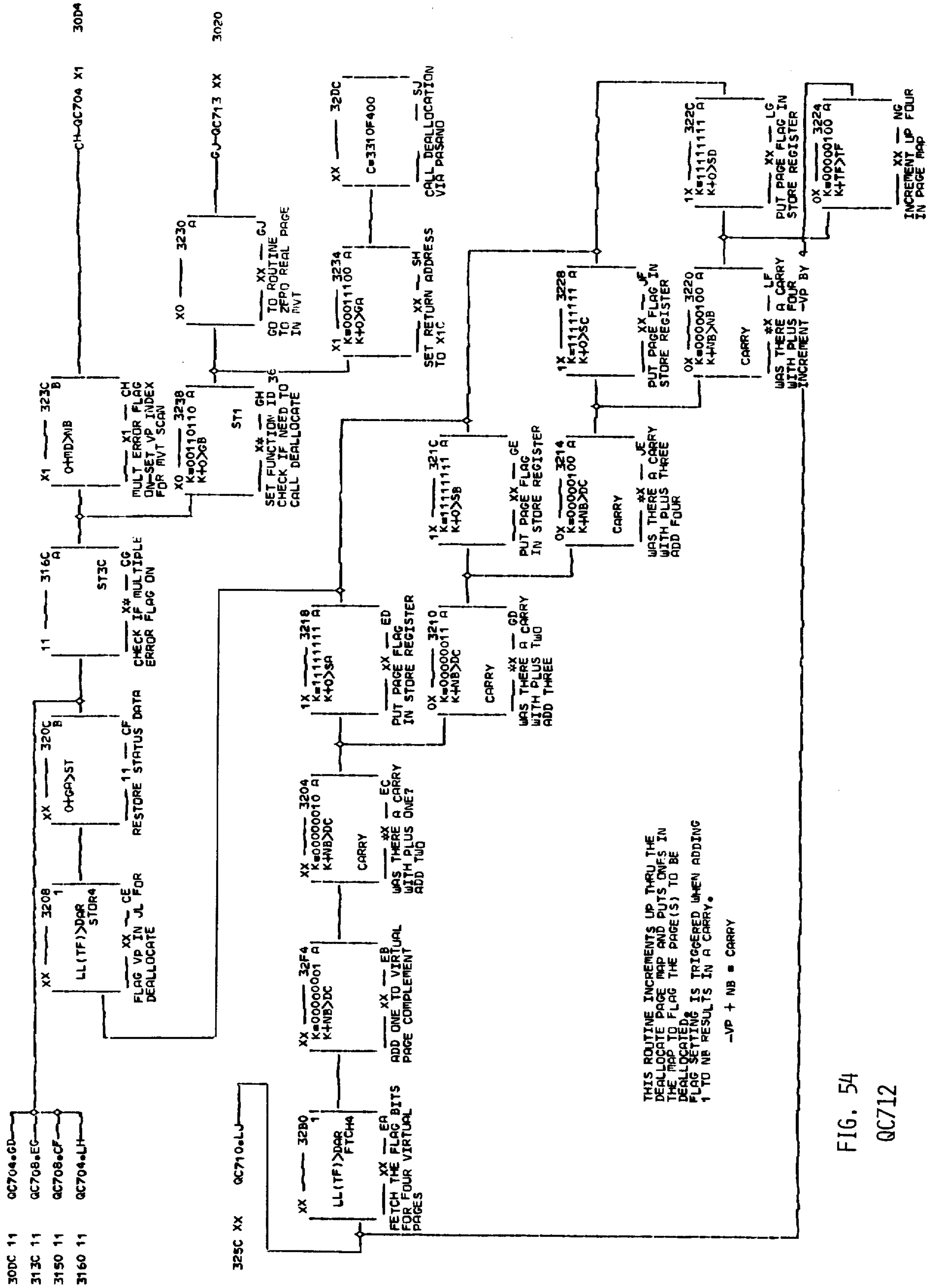
Figure 56:
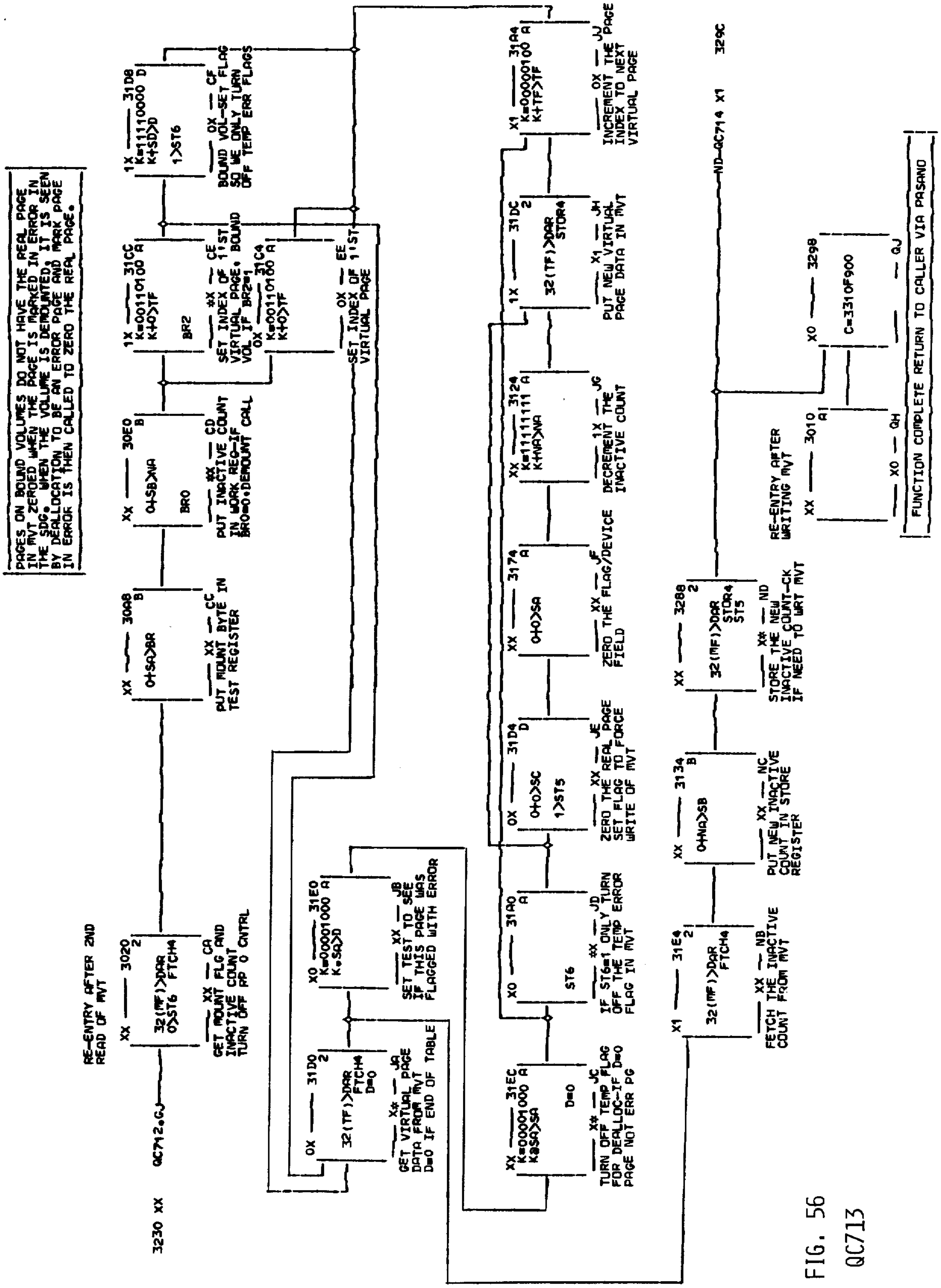
Figure 57:
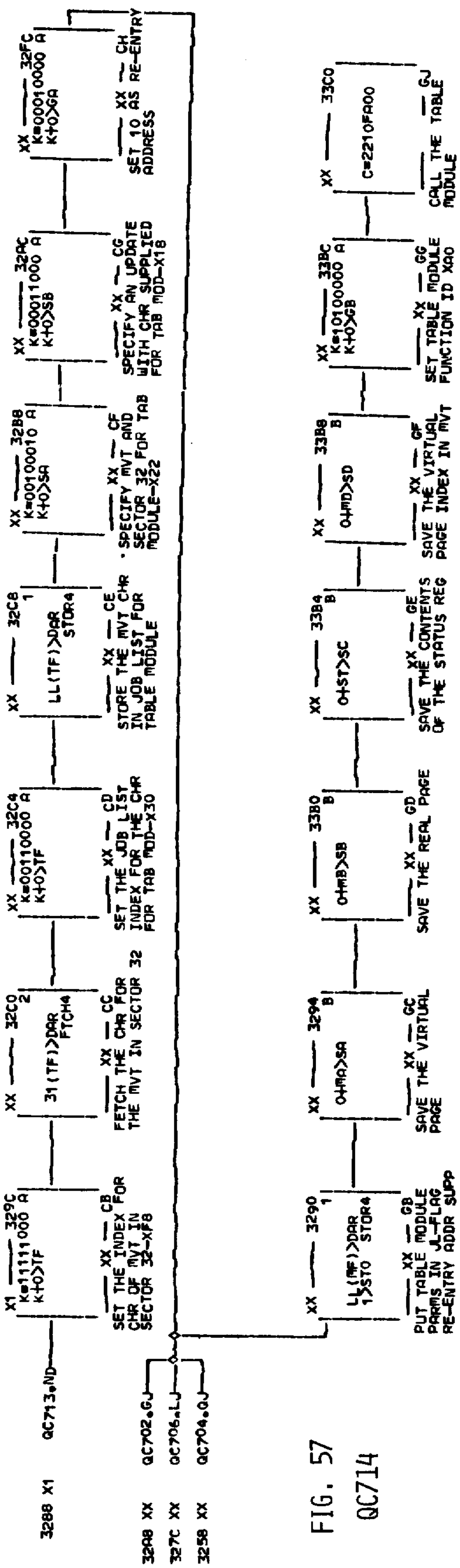

FIG. 49 shows QC701 which performs preliminary program functions incident to program entry.

QC704 (FIG. 50) finds the page with error and identifies the controller 15 to which the spindle in error 14 is connected. A read operation is set up.

QC706 (FIG. 51) sets the page in error flag in the SDG entry and prepares for writing in the SDG tables while reading the MVT.

QC702 (FIG. 52) entered from QC706 (FIG. 51), as well as from non-deallocate entry at 3000, sets up MSC to read the MVT table. In the constructed embodiment, the MVT table is stored in DASD accessible to MSC 17 via a director 16 and controller 15.

QC708 (FIG. 53) is also entered from QC706 (FIG. 51), as well as off-page entry 0C. This step verifies whether or not there is a deallocation request generated by the previous programs. If so, deallocation parameters are set up in the program control signals. Notes indicate other functions of interest. QC710 (FIG. 54) is merely a continuation of QC708.

From QC710, after the parameters have been set, QC712 (FIG. 56) is executing for setting the flags of the virtual page for deallocation and then verifying whether or not the program is finished. From QC712 (FIG. 55), there can be a deallocation of the page in error, i.e., move the status of the page from an active status to inactive and then marking it in error for making it unavailable to any host 18, 19. QC712 can also return to QC704 (FIG. 50) for finding an error if the program is not yet finished.

Also, QC713 (FIG. 56) is entered for zeroing the real page and turning off the temporary error flag. "Zeroing the real page" means the entry in MVT is zeroed to indicate that it is not available. Details of these functions are clearly set forth in the figure.

QC714 (FIG. 57) is entered from QC713 (FIG. 56) for executing a first portion which indexes the cylinder-head-record in error and then enters a second portion which is also independently enterable from QC702, QC706, and QC704. The second portion sets the parameters for writing in the MVT. It should be remembered that the MVT is stored in DASD under control of MSC 17. Exit is to a return calling a so-called "table module" which enables writing signals in the tables of MSC 17, as well as updating the tables in directors 16. The MSC 17 tables can be in registers of DASD spindles 14. QC716 (FIG. 58) merely establishes and transfers a message to a host 19 or primary host 18. This function is generally well known but is still detailed in FIG. 58.

From QC716, the only exit is to QC718 (FIG. 59) which calls the message handler and handles the return from the message handler, the message handler being a separate program in MSC 17 of the type commonly found in CPU's necessary for transferring messages over an I/O channel to another computer. By combining FIG. 9 with FIGS. 49–59, the entire program functions become apparent.

DASD QCB Restart

Figure 65:
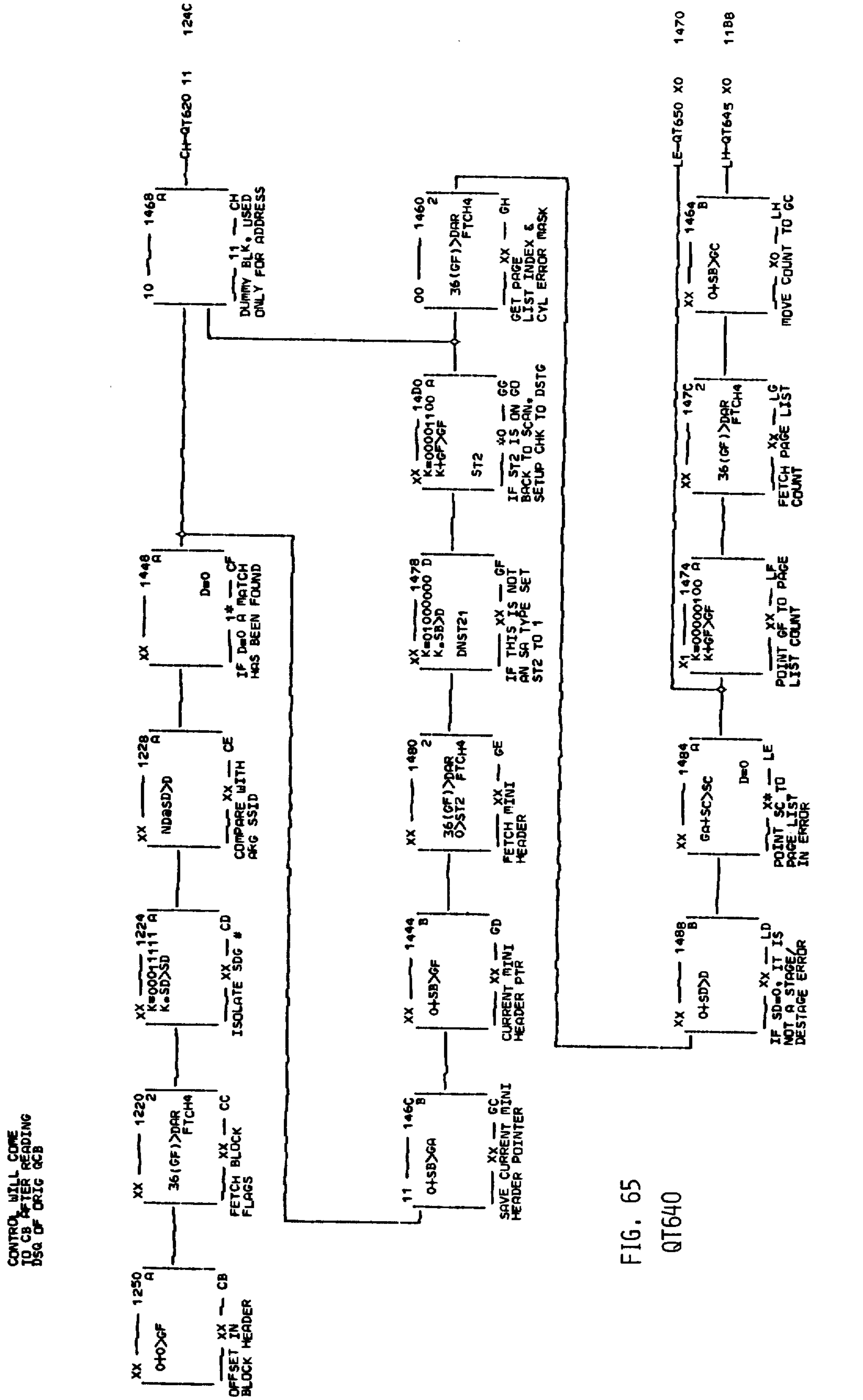
Figure 70:
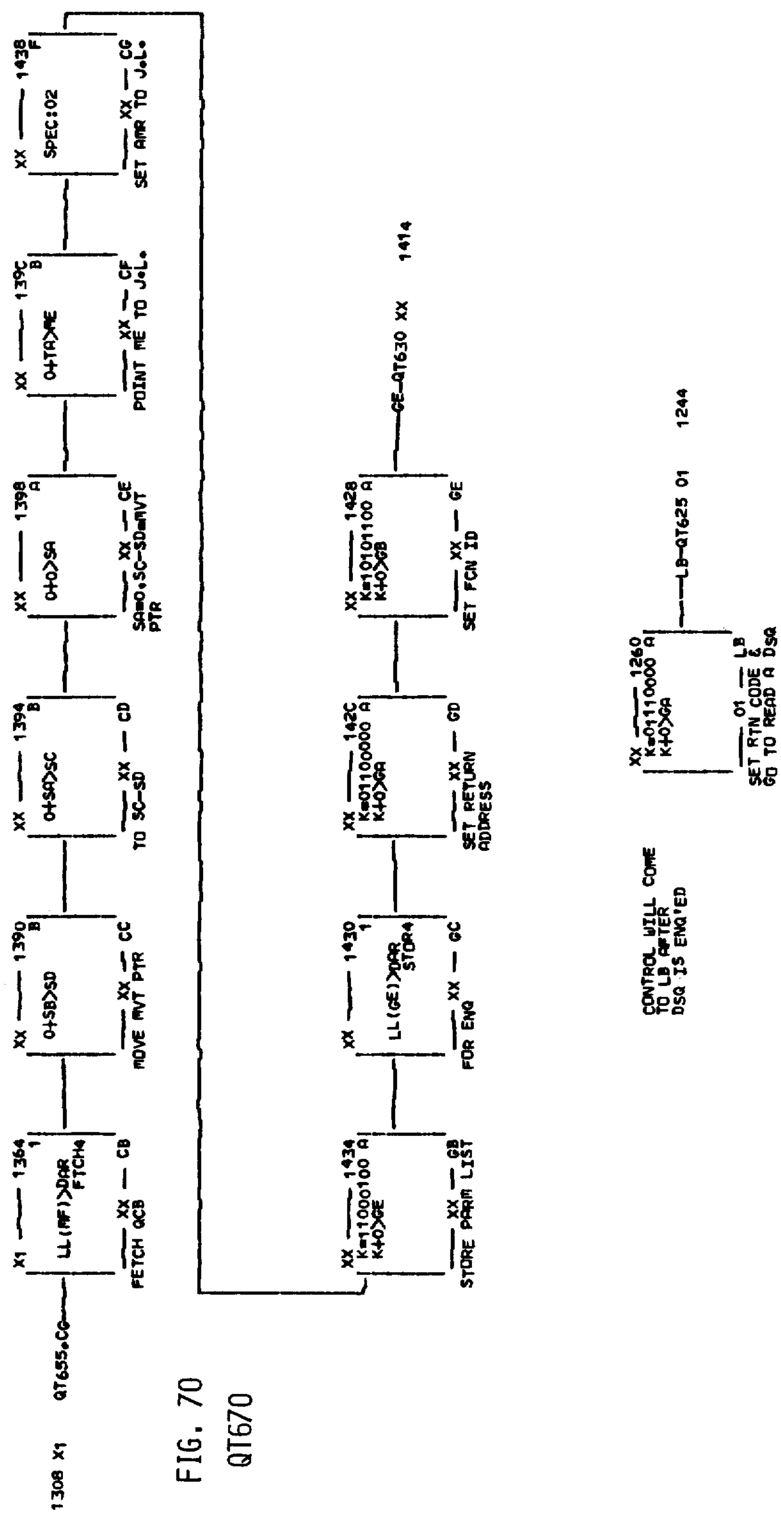
Figure 71:
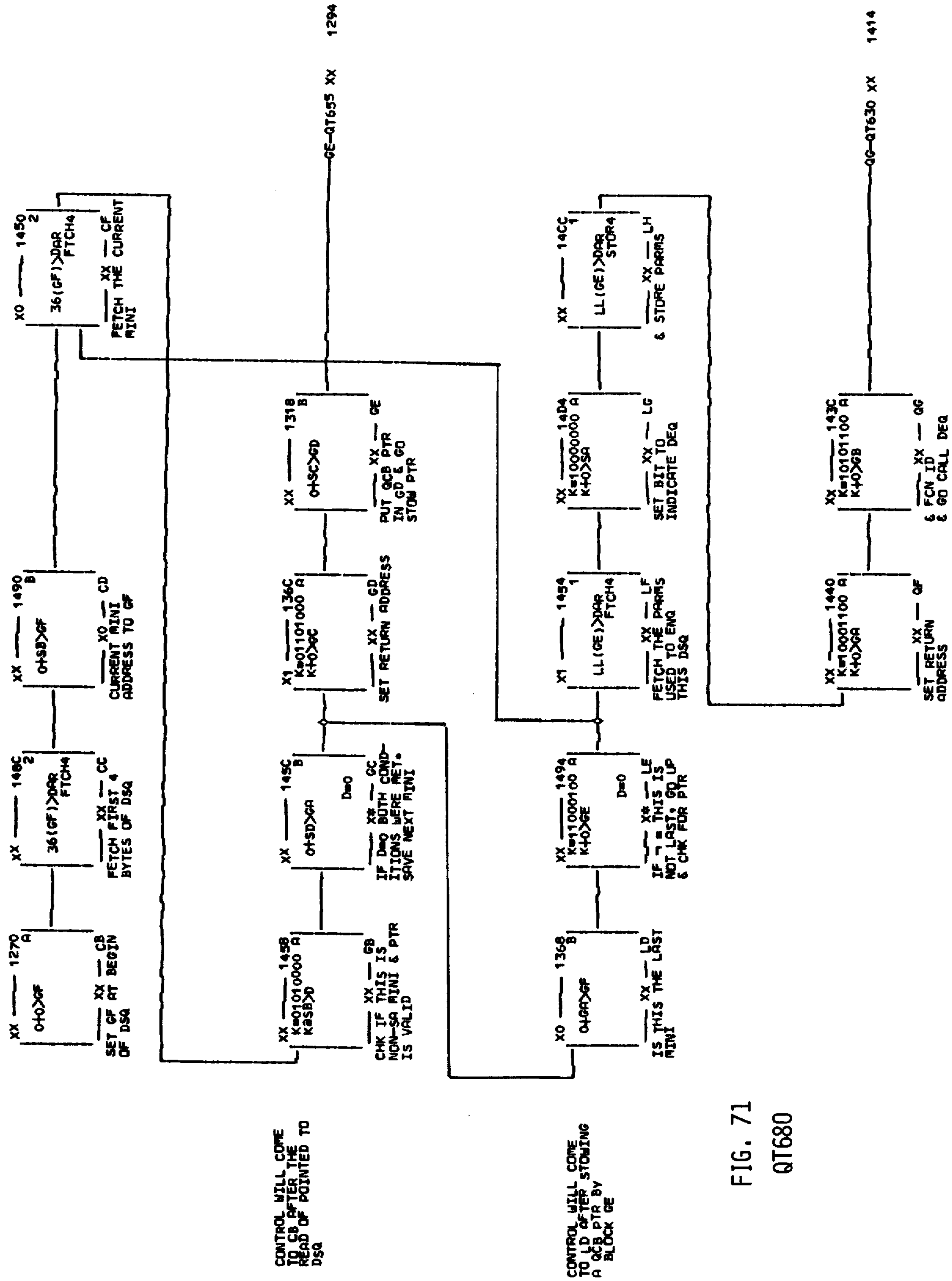
Figure 72:
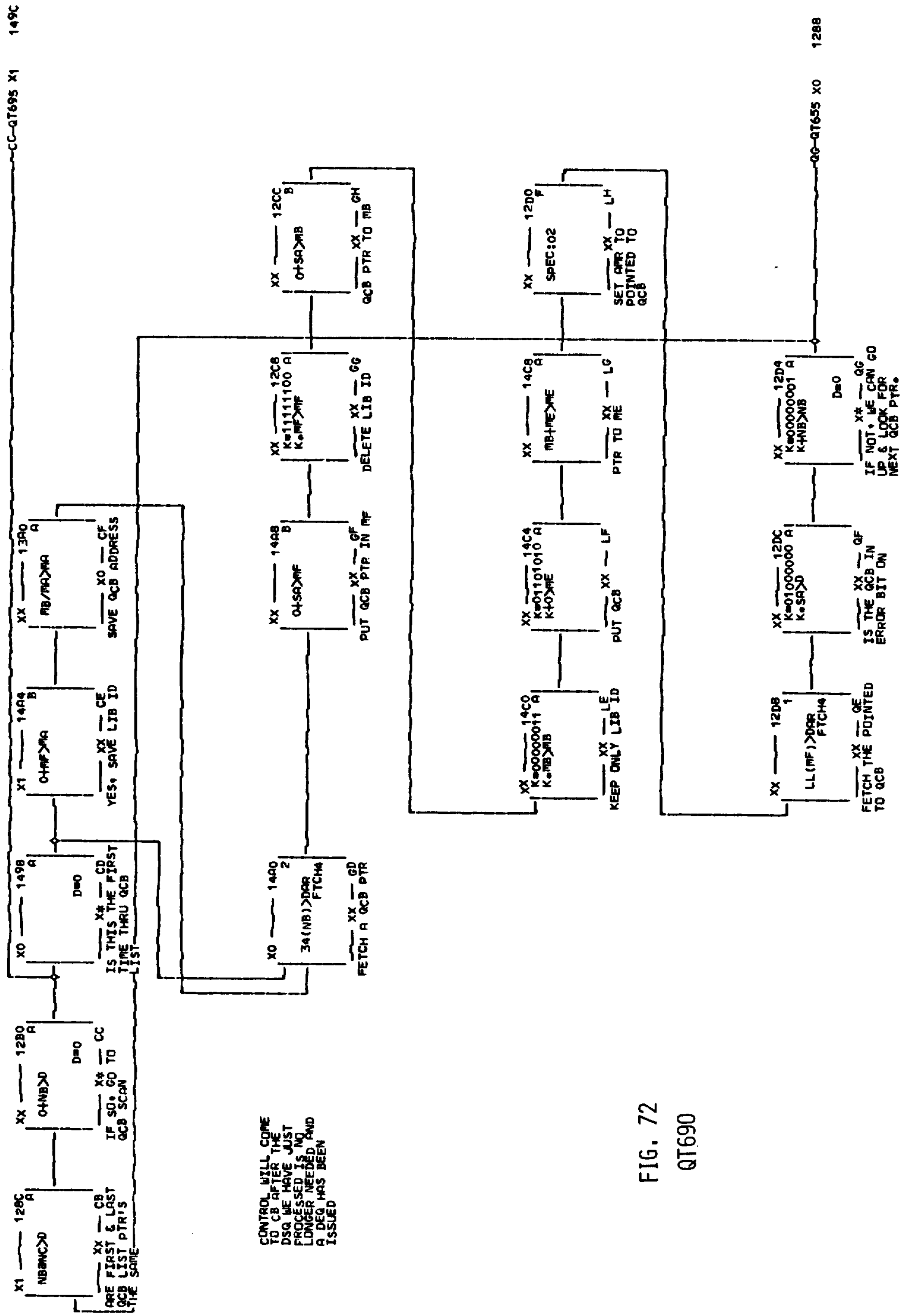

This program (flowchart of FIG. 10) sets up a queue control block QCB of DASD for restarting the destaging for completing the destage with an error function of MSS. The previous programs pass to this program the SSID of the DASD spindle 14 creating the error such that the present program scans the queue control blocks looking for a given QCB that is marked in error, identified as being a DASD error and having a dependency counter not valid. Once a QCB has the three criteria set forth above, the program resets the marked in error bit to 0, makes the DASD error byte all 0's, tracks all chained QCB's and marks each available for execution. The chained entry table consists of pointers pointing to the next entry in the chain and is a well-known programming technique. Entries to this program (FIG. 10) include an original entry at QT610 (FIG. 61) from QC605 (FIG. 60), a return from reading the QCB DSQ at QT640 (FIG. 65), return from an MVT access enqueue into QT670 (FIG. 70), return from reading a pointed-to DSQ at QT680 (FIG. 71), and return from an MVT access dequeue at QT690 (FIG. 72). Some of the special microprogramming register assignments include register MA for identifying the MSF (MSS may have plural MSF units) to which the destaged data is to go, MB for the second byte of such identification, MD has the saved QCB address, ME has the AMR information, MF has the QCB address, NA contains the SSID unit number (DASD), NB identifies the first entry in the QCB list, NC identifies the last entry in the QCB list, ND identifies the SSID controller 15 number, TA contains a code which has the saved ME, ST is a general status usage, and BR has scan loop control and work to do indicators.

Figure 60:
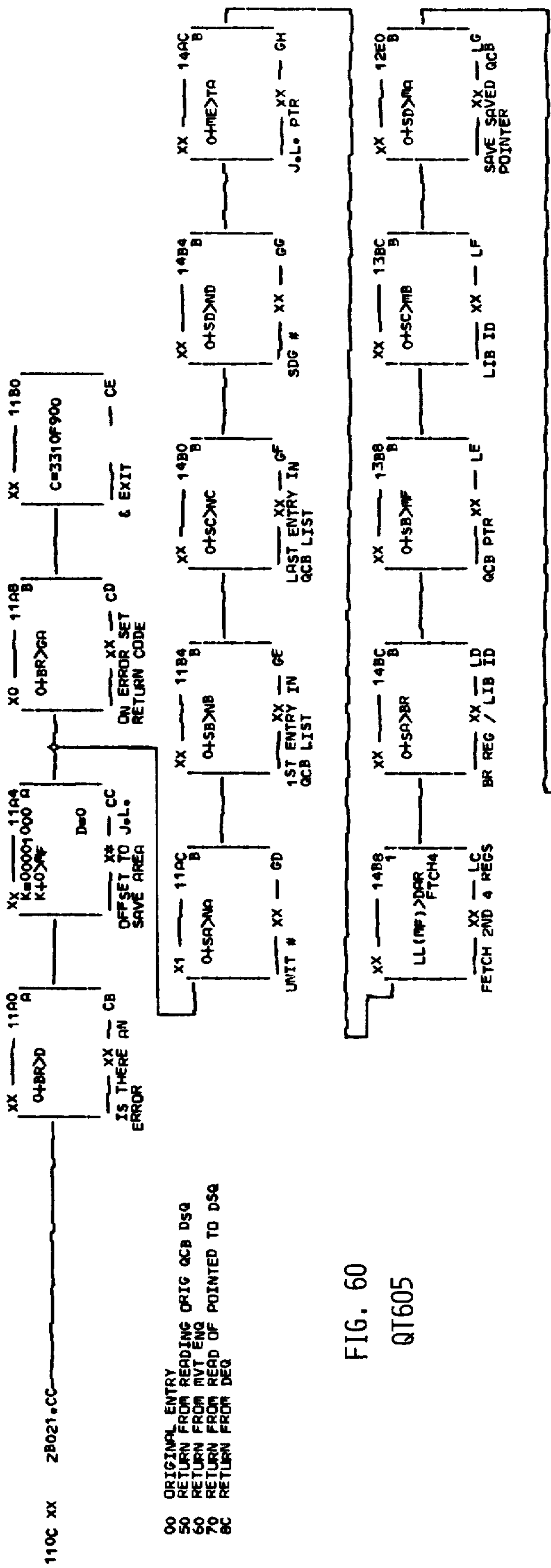
Figure 61:
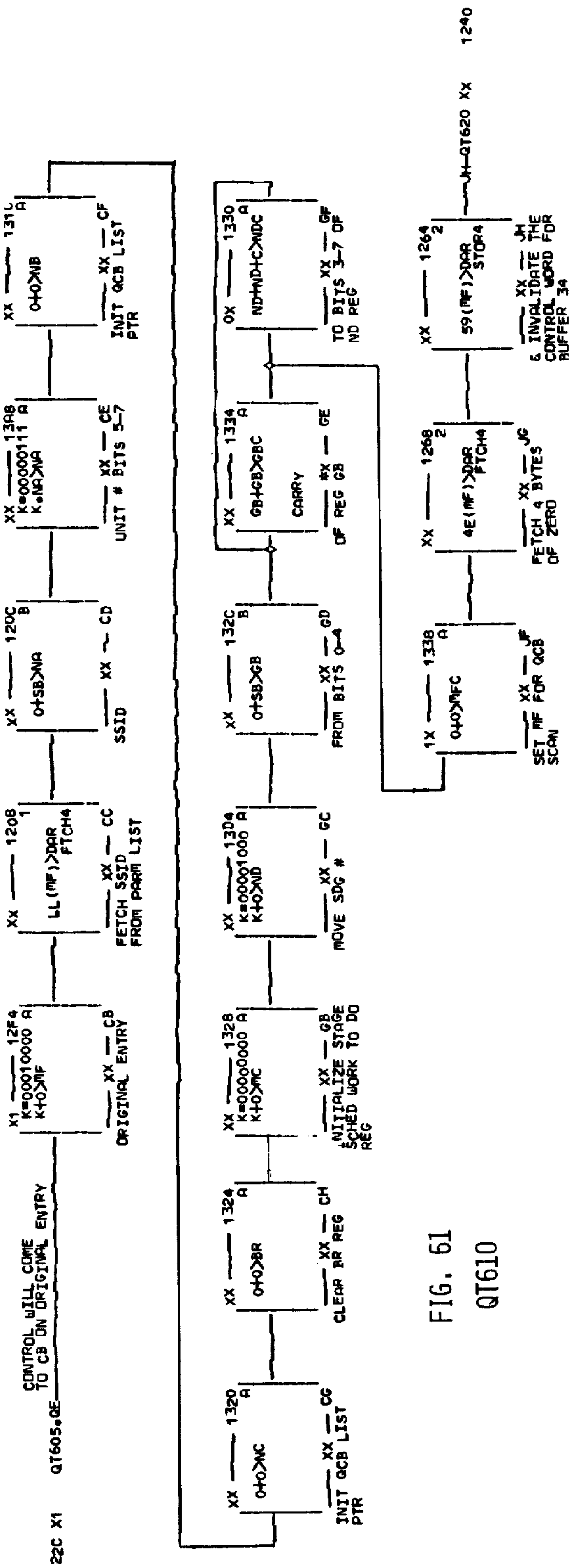

QT605 (FIG. 60) flowchart block controls the entry and re-entry to the program. This flowchart block performs QCB list control and fetches pointers, etc., for program execution. The exit includes branching to entry addresses as indicated in FIG. 60.

Figure 62:
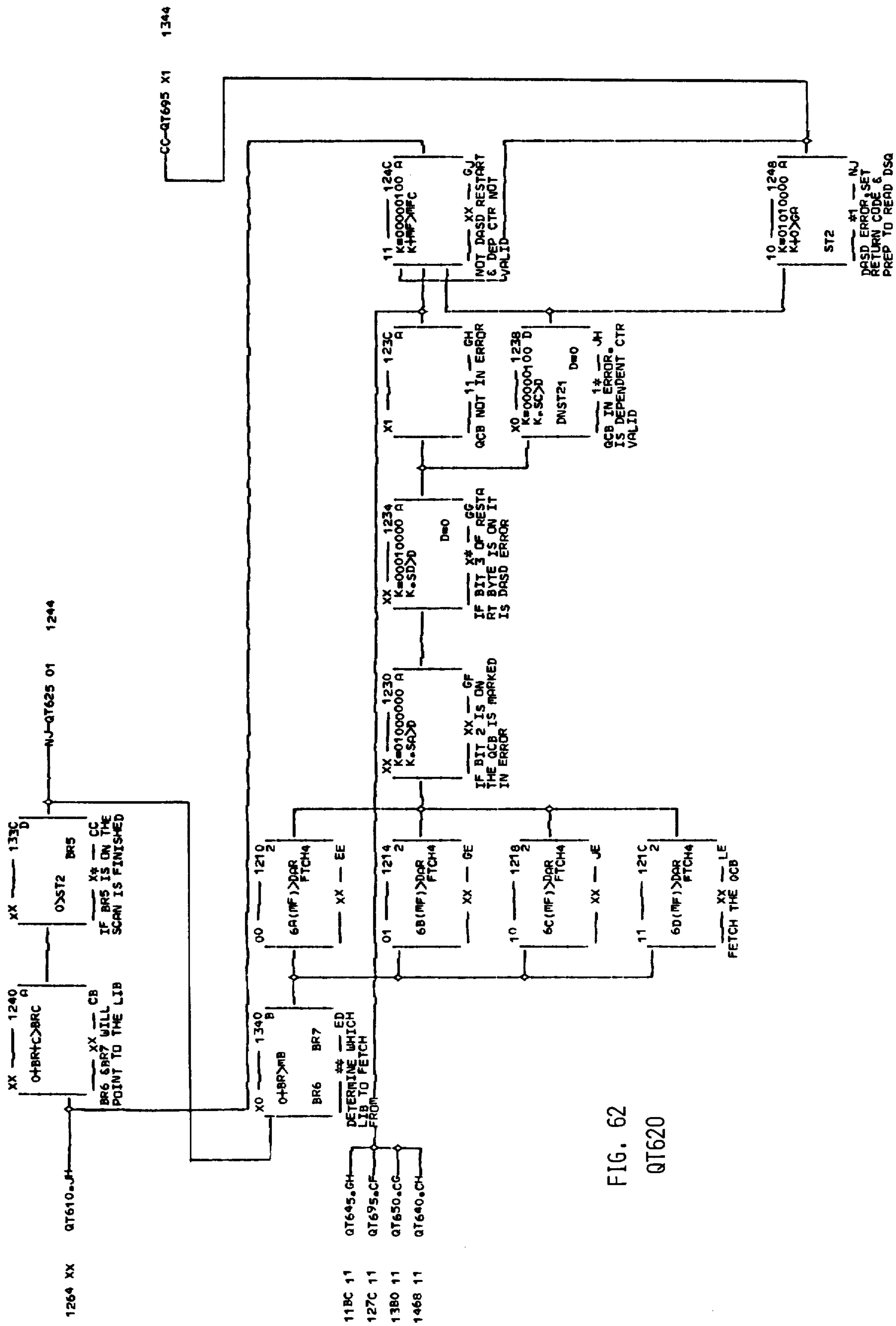

The original entry block QT610 (FIG. 61) includes fetching SSID and other initializing information necessary for restarting the destage with error. The only exit is to QT620 (FIG. 62) for the QCB error scan. The program when executing in the QCB ERP scan path is seeking the QCB which identifies a DASD destaging read error.

Figure 63:
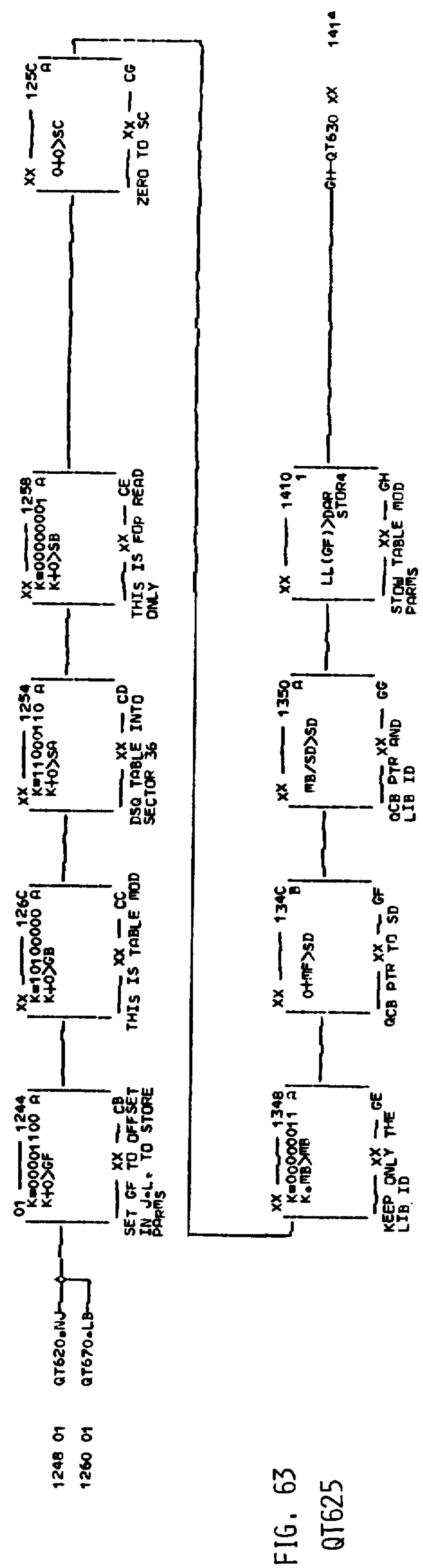
Figure 58:
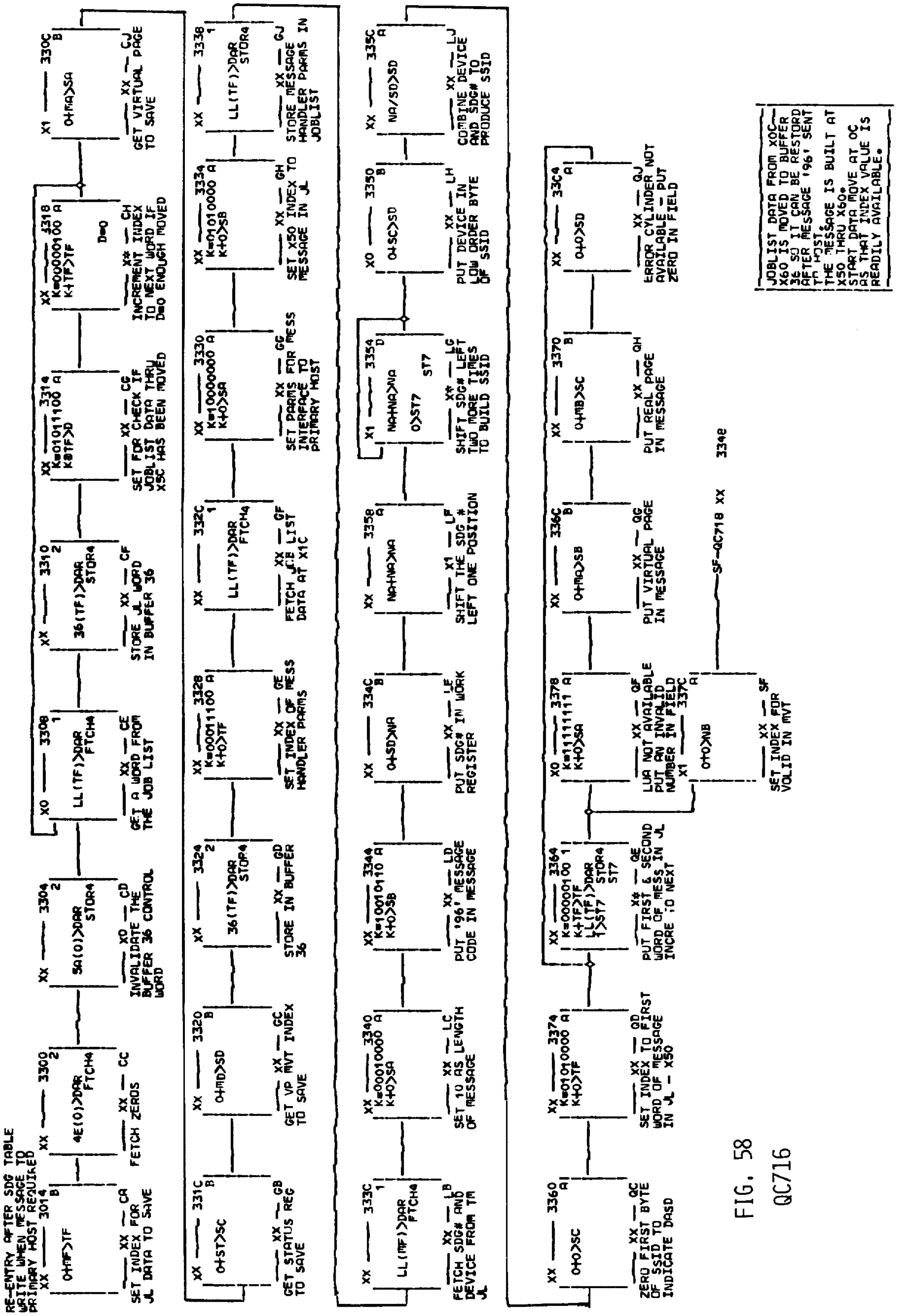
Figure 59:
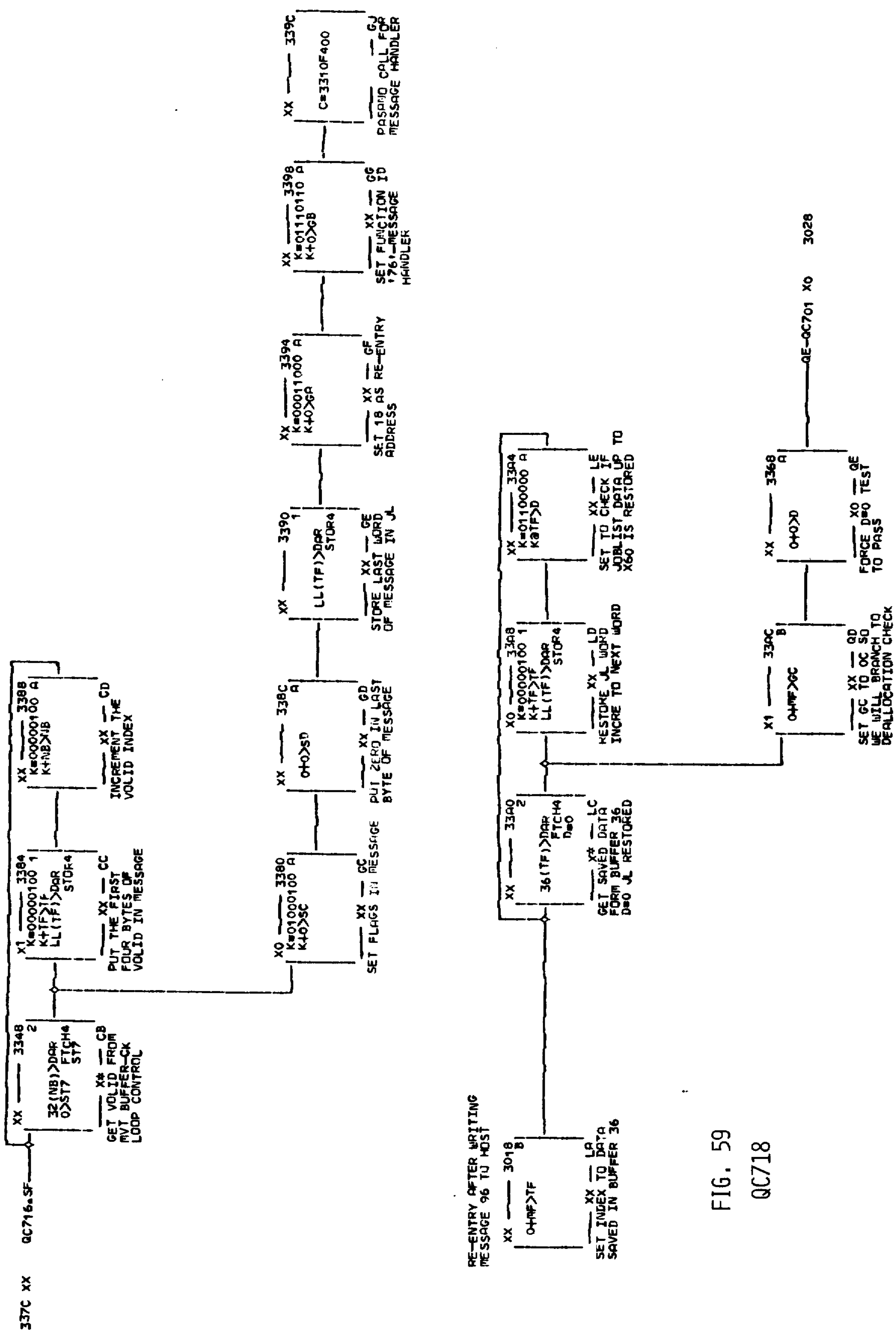
Figure 64:
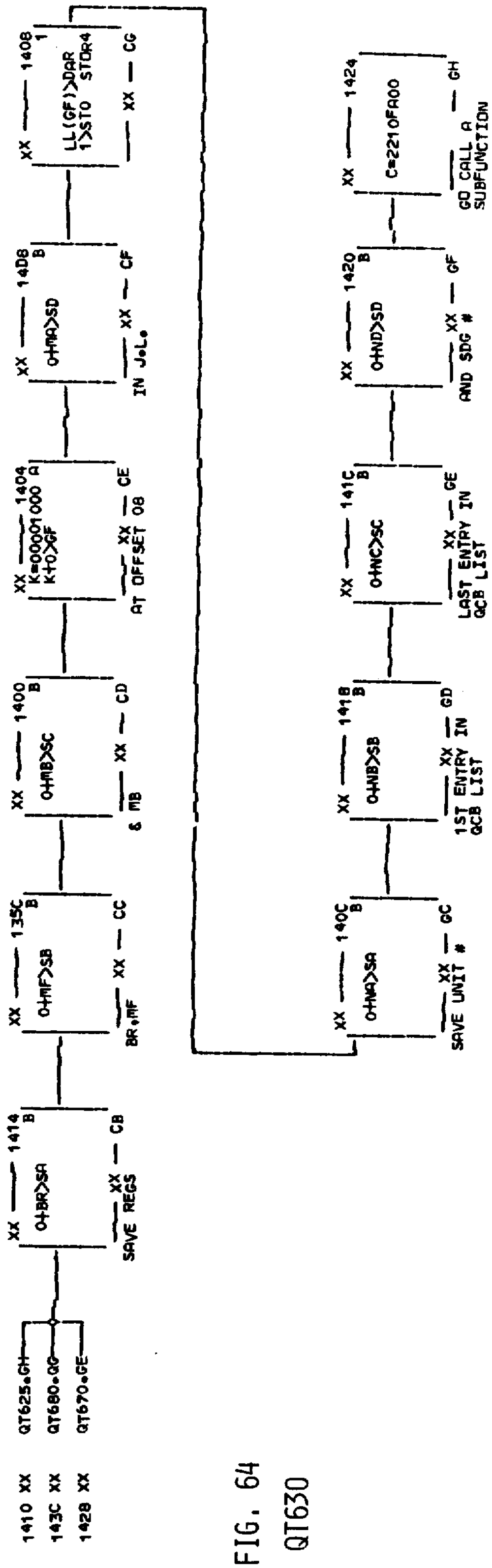

QT625 (FIG. 63) and QT630 (FIG. 64) cooperate to call a subfunction for reading a DSQ. QT630 is also entered from other flowchart steps, as will become apparent. Upon exiting QT630, MSC starts a subfunction to perform a DASD-related operation such as reading the DSQ as commanded by QT625, recording on DASD, etc. Such operations are well known as input/output operations of a programmed processor.

Re-entry into the program after the QT630 called subfunction is to QT640 (FIG. 65) from the scheduler of MSC 17. In destage with error, QT640 scans the DSQ acquired from DASD spindle 14 for the appropriate address (SDG) of a controller 15. The combination of the controller 15 and DASD spindles 14 is called a "staging drive group," with the address being signified by SDG.

Figure 66:
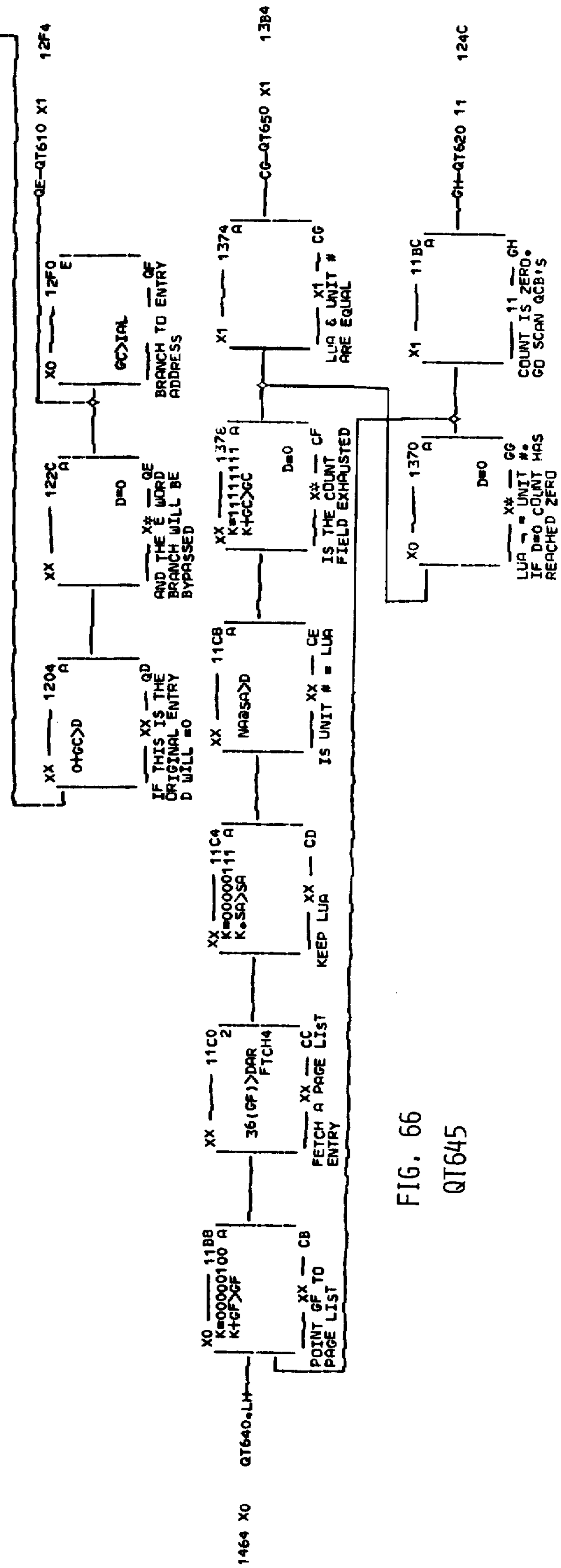

QT645 (FIG. 66) is entered only from QT640. QT645 scans the mini header (referenced above) or the appropriate logical unit address (LUA). That is, the virtual addressing for spindle 14 must be matched with that requested. If there is no match, the scan continues by re-entering QT620 which requires a second execution of the subfunction called by QT630, supra.

Figure 67:
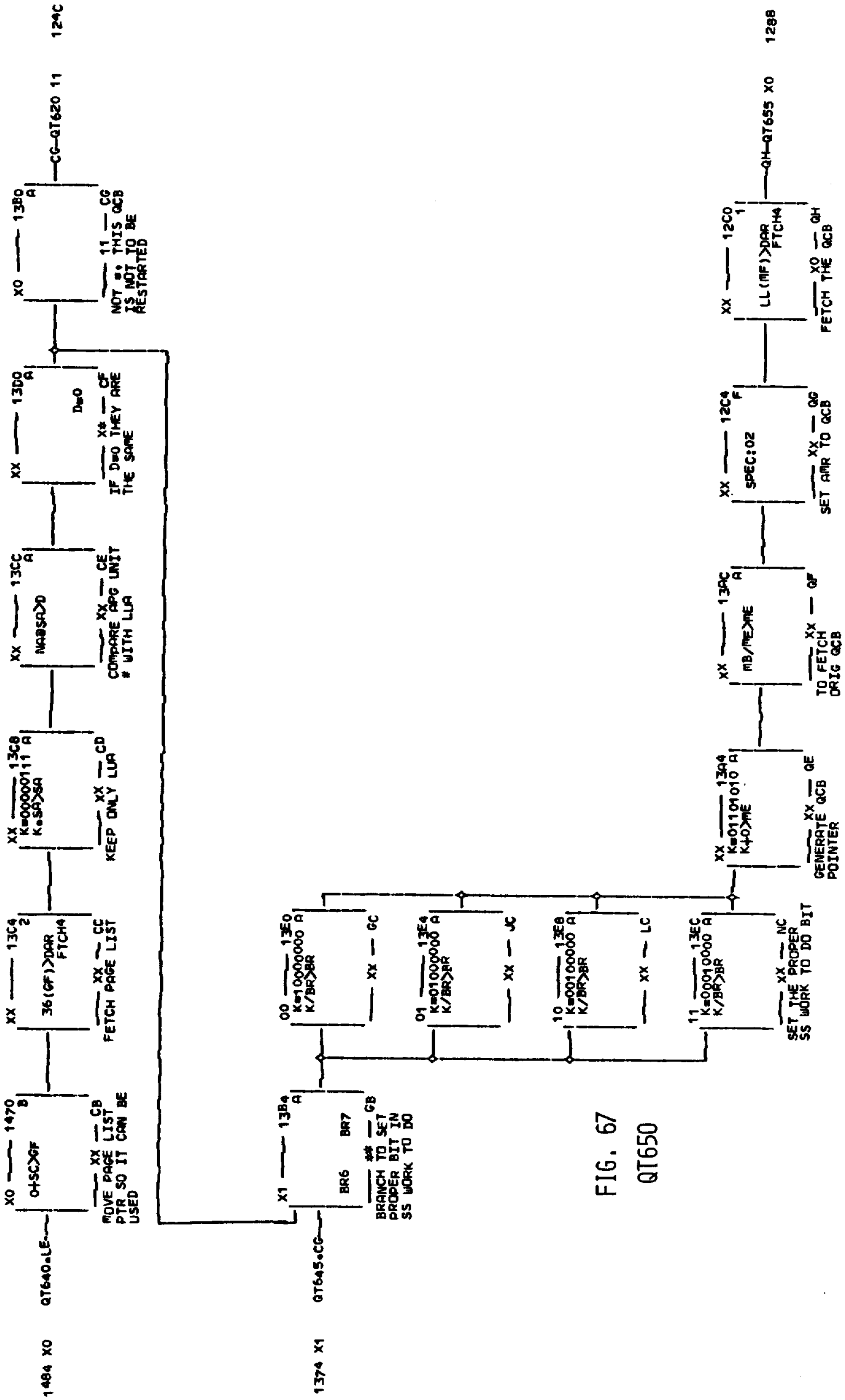
Figures 68, 69:
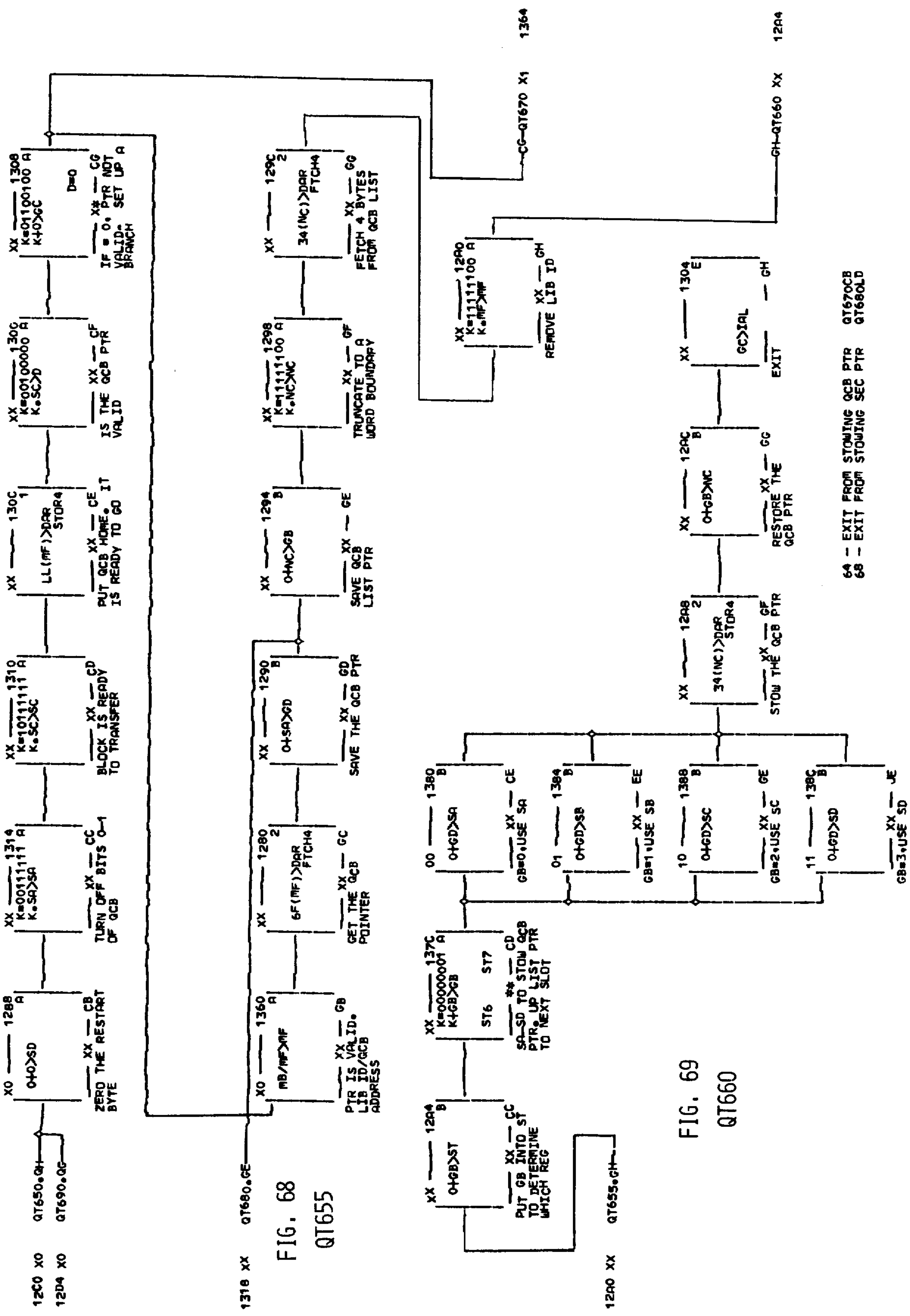

If there is a match, i.e., the appropriate LUA has been found, QT650 (FIG. 67) then scans the acquired mini header for the destaging DASD read error indication. If the QCB has no destaging error indication, QT620 is entered again. If a destaging error is found in a given QCB, QT650 is exited by the instruction at 12C0 for entering QT655 (FIG. 68).

QT655 reads the QCB for initiating the DASD destage with error. If there is no QCB pointer, QT670 (FIG. 70) is entered for calling an enqueue. Otherwise, QT655 is exited to QT660 (FIG. 69) which stores the QCB pointer.

After the DSQ has been read, such as initiated by QT630, QT680 (FIG. 71) checks the DSQ pointers. If a pointer is found, QT655, (FIG. 68) is entered for storing the pointer. If a pointer is not found, QT630 is entered for calling a subfunction to again read a DSQ from a DASD spindle 14.

QT690 (FIG. 72) scans the fetched QCB list for another QCB to be fetched.

Figure 73:
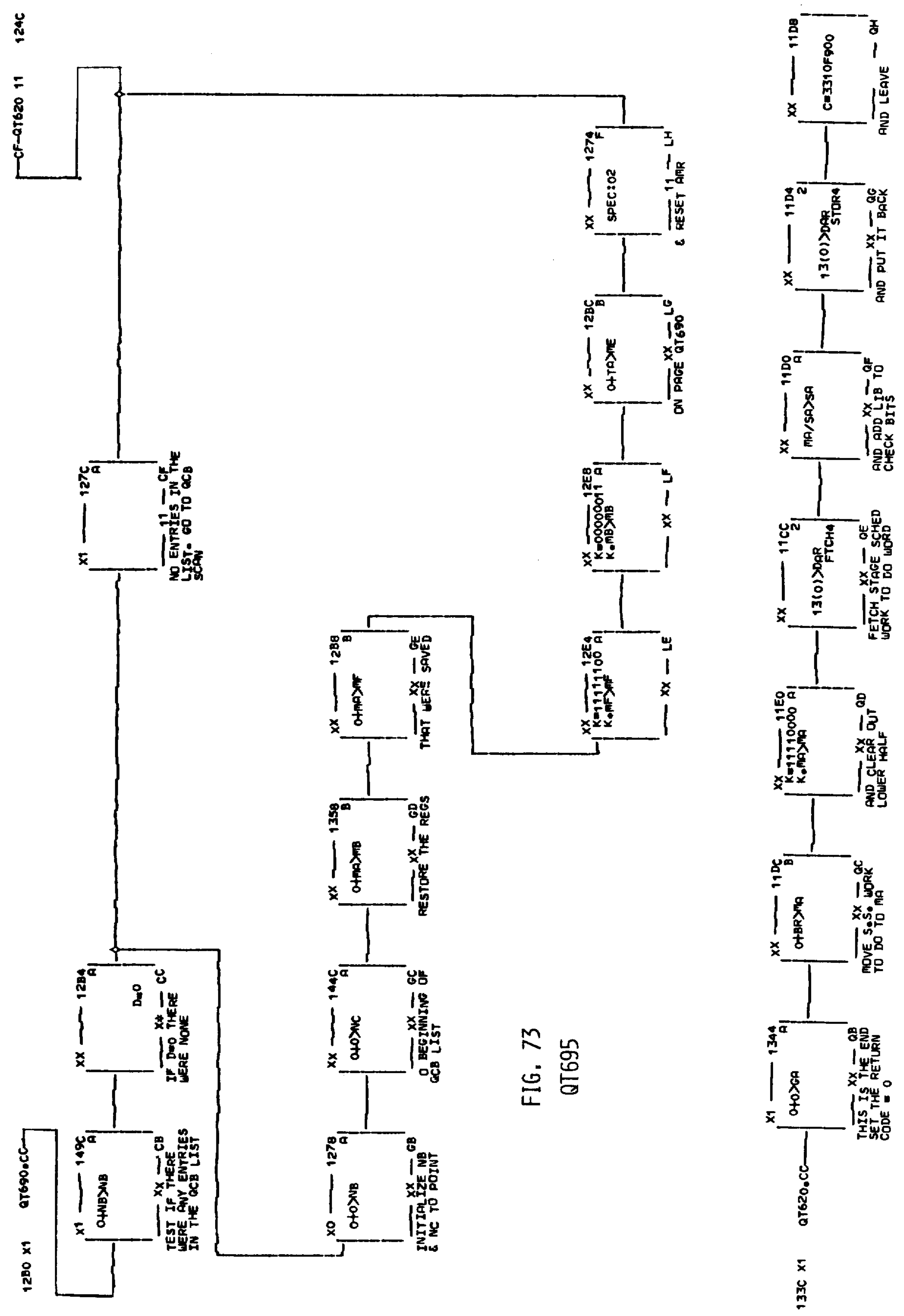

Finally, QT695 (FIG. 73) adjusts the QCB list to ensure the scan has been completed. One exit is to QT620 (FIG. 62) for scanning the last QCB, while the other exit is a finish or all-done which returns the programming to the scheduler of MSC 17. After the MSC 17 scheduler has been entered, the actual destaging or movement of data signals from DASD with the error proceeds using programs and apparatus in conjunction with the IBM equipment mentioned above.

A Partial Hardware Embodiment

Figure 11:
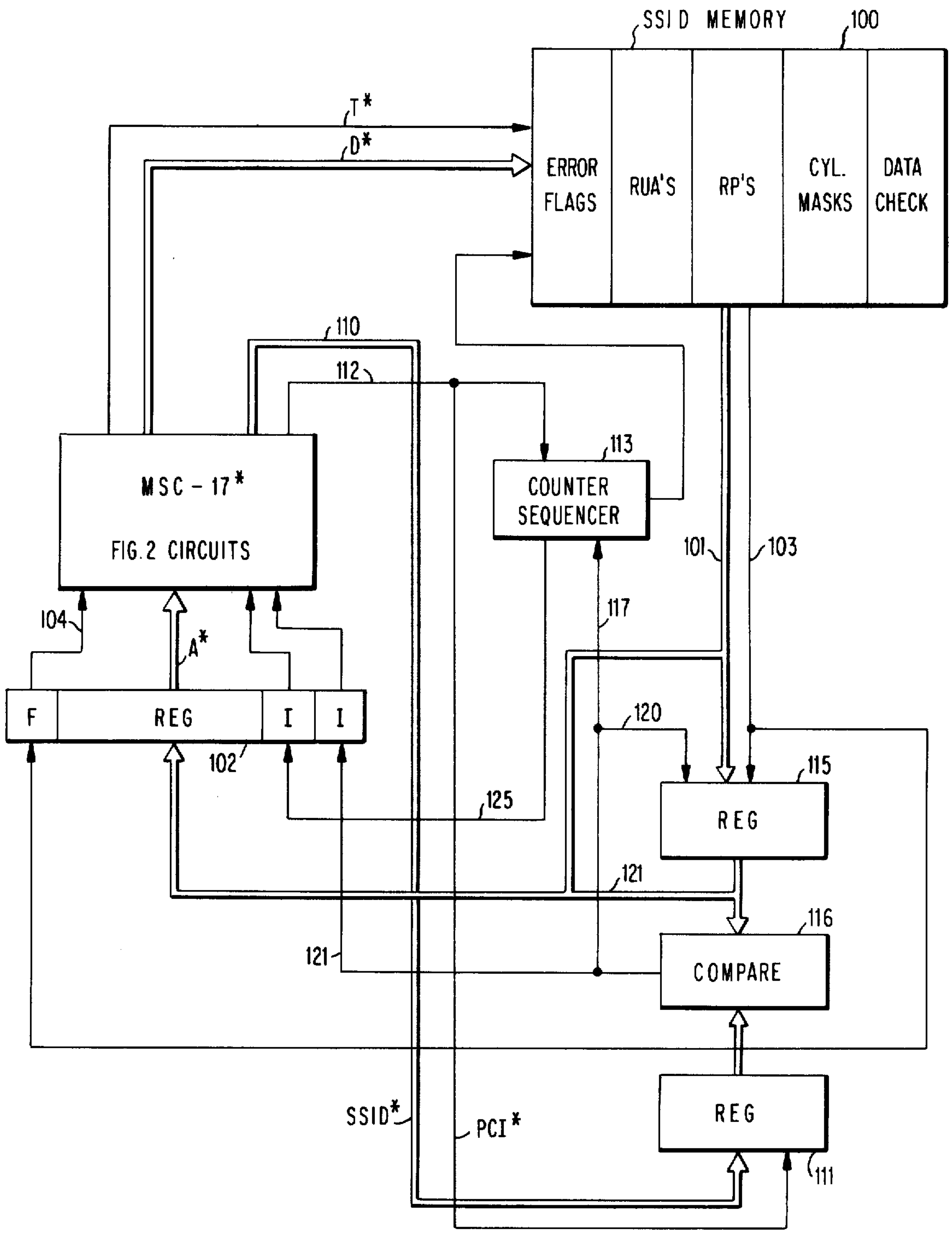
FIG. 11 is a diagrammatic showing of an alternate embodiment of the invention.

FIG. 11 illustrates a speed-up of certain functions of the present invention when additional hardware circuits are added to the FIG. 2 illustrated MSC 17 circuits. The description of FIG. 11 is coordinated with that of FIG. 5 such that the interaction of the added hardware with certain ones of the above-described microprograms will become apparent. In FIG. 5, steps 50, 52, and 53 are assumed to have been executed as above described; that is, a destaging DASD read error has been detected and recorded that the CHR has been saved. Also, the QCB cleanup functions and the freeing of the ASQ have been achieved in step 54. To enable a destage, restart, using the FIG. 11 illustrated circuits, as SSID memory 100 is attached to the MSC 17 and accessed as shown in FIG. 11. The D-bus of FIG. 2 includes AND circuits (not shown) connecting it to the D*-bus, together with a tag line T* which indicates write or read. The D-bus will normally contain memory addresses for the SSID memory 100. Such memory addresses constitute the SSID assigned to given RUA's. Once a memory address has been captured in SSID memory 100, subsquent transfers are data signals to be recorded in the SSID memory.

Such memory signals include error flags; i.e., the given SSID has an error during destage—there is one register in memory 100 for each DASD spindle 14. Also in each register, the signal content includes the address code RUA and lists of real pages which have had a data check, provided the data check flag in that register is set to the active condition. Additionally, the well-known cylinder masks are stored in each of the registers. Memory 100 enables MSC 17 to compare the SSID with the RUA such that when the primary host 18 refers to a DASD spindle 14 by the SSID, it merely reads memory 100 to obtain the RUA for accessing same via director 16. Read-out of memory 100 is over cable 101, together with the read-out tag signal on line 103 to buffer register 102. When register 102 is filled from memory 100, bit F sends a flag or interrupt signal over line 104 interrupting MSC 17 to receive signals on the A-bus via cable A* from register 102. In FIG. 11, MSC 17* indicates that the FIG. 2 illustrated circuits have been modified to receive additional signals over the A-bus while supplying additional signals over the D*-bus and over cable 110, later described.

So far, memory 100 appears to MSC 17* as an external memory. In destage restart, SSID having an error flag with either a data check or no data check (equipment checks) must be found. To this end, a set of signals is supplied over cable 110 indicating the RUA to be searched for. Inserted into register 11 in response to a received PCI, MSC 17* supplies a PCI* signal over line 112 which inserts the RUA in register 111 in preparation for a search compare from memory 100. Simultaneously, the signal on line 112 activates counter sequencer 113 to scan all registers in memory 100 in a known manner. As counter sequencer 113 scans memory 100, a sequence of RUA's is supplied over cable 101 to be inserted into register 115. Each insertion into register 115 causes a compare in circuit 116 with the signal contents of register 111. With no compare, a signal on line 117 goes to counter sequencer 113, incrementing same to the next SSID number of memory 100, resulting in the next RUA to be read out. This occurs until a successful compare is detected by circuit 116, at which time the signal on line 117 stops counter sequencer 113 and simultaneously supplies an activating signal over line 120 to register 115. This line 120 signal activates register 115 to supply the signal contents of the SSID register over cable 121 to register 102 for insertion into MSC 17*. Counter sequence 113 now contains the SSID number of the error-causing DASD spindle 14. In this regard, SSID memory 100 supplies the SSID number along with the other signals to register 115 such that MSC 17* receives both SSID and the RUA for the device in question. At this point in time, DASD QCB restart or mark page in error flowchart can be entered as appropriate. Note that without a data error, mark page in error is omitted; and DASD QCB restart is entered correctly. Note that the PCI from the DASD spindle 14 initiates the action for recovering from the destaging error.

In the event counter sequencer 113 sequences through all of the registers of memory 100, a scan complete signal supplied over line 125 sets a first I bit of register 102. This supplies the interruption signal to MSC 17* indicating no error was found. Similarly, when a successfull compare 116 is detected, the signal on line 121 sets a second I bit of register 102 signifying that a successful comparison has found an SSID error entry enabling mark page in error or DASD QCB restart to be effected.

From the above description, it is seen that the registers, compare, and counter of FIG. 11 replace a portion of the destage restart function 55. It should be noted that the messages to the primary host 18, forwarded as described with respect to FIG. 8, are still under program control and that the FIG. 11 illustrated circuits speed up the scan for finding the spindle in error after a PCI has indicated a DASD pack has been swapped and that destage with error can ensue.

While the invention has been particularly shown and described with reference to a preferred embodiment thereof, it will be understood by those skilled in the art that various changes in form and detail may be made therein without departing from the spirit and scope of the invention.

What is claimed is:

1. The method of error control for a storage apparatus having a plurality of storage levels, including the steps of:

detecting a predetermined number of errors in a given portion of an upper one of said storage levels during a data movement to a lower storage level;

indicating data signals stored in said lower storage level associatiable with said given portion as signals having data errors;

moving said data signals in error irrespective of said errors from said upper storage level to said lower storage level associatiable with said upper storage level; and maintaining said data signals in said upper storage level and inhibiting data access to said given portion of said upper storage level for preserving same for diagnostic analysis.

2. The method set forth in claim 1 including the steps of:

memorizing that an error was detected in said upper level portion;

upon detecting an additional error in said upper level portion checking for said memorized error; and upon finding such memorized error, moving said data signals in error to said lower storage level portion.

3. The method set forth in claim 1 wherein said upper storage level has a plurality of independent storage units, each unit having a plurality of said portions, removable storage media on said units capable of being inserted on any of said units, one of said media having said given portion being on a first one of said storage units, further including the steps of:

upon detecting said error a first time in said given portion moving said one of said media to a second one of said units, reading signals from said given portion, if error free erasing said memorization; and upon detecting an error in said given portion, moving said signals in error to said lower storage level.

4. The method set forth in claim 3 wherein a plurality of data processing hosts are connected to said storage apparatus, including the steps of:

designating one of said hosts as a primary host; and sending status signals indicating said errors and data signal movements only to said primary host irrespective of said other hosts being connected to said storage apparatus.

5. A program-controlled data storage apparatus having a first lower storage level having a multiplicity of addressable first storage locations, a given plurality of said first storage locations addressable as a unit to constitute a given portion of said first level, a second upper storage level having a plurality of greater than said given plurality of said addressable storage locations, volumes of said second addressable storage locations being on movable media which are interchangeably locatable within said second upper level, programmable control means, means for connecting to a plurality of host programmable units including a primary host programmable unit;

means having a program memory portion and memory means containing recorded control signals indicating associatable data signals in said portions including associating said given portions of said first and second storage levels;

computer means in said programmable control means responsive to signals from said program memory portion to perform predetermined functions;

signal transfer means for exchanging signals between said levels and responsive to said recorded control signals via a computer program in said programmable control means to exchange signals between said given portions;

bistable means indicating that said signal exchange between said given portions is signal transfer to said first given portion from said second given portion;

the improvement including the combination:

error means in said second storage level to detect errors therein including errors relatable to said given portion of said second storage level;

a destage with error program stored in said program memory portion signifying to said computer to execute predetermined functions whenever an upper level error is detected;

said destage with error program comprising instruction word indicia in said program memory portion representing data storage apparatus operations for:

a. upon detecting an error, saving the address of said given portion of said second upper level with an indication that such error occurred during movement of data signals from said second level to said first level (FIG. 6);

b. sending status signals to said primary host indicating errors and error locations only to said primary host and adjusting storage apparatus operation to prevent host access to said given portion of said second level (FIG. 7);

c. detecting whether or not detected error being processed is the first or second occurrence, if first occurrence, effecting a reconfiguration by moving one of said volumes having said given portion in error to another location within said second upper storage level, and if a second occurrence, initiating a data movement from said second storage level to said first storage level (FIG. 8);

d. upon completion of said reconfiguration, initiating a destage with error sending status signals thereof to said primary host and making said given portion of said second storage level inaccessible to said hosts (FIGS. 8 and 9); and e. initiating moving said data signals from said given portion of said second storage level to said first storage level with said errors.

6. The method of error control in a storage apparatus having a programmed storage control unit, an upper storage level having a plurality of addressable storage locations, a lower storage level having a multiplicity of addressable storage locations, means in each level for addressing said storage locations, means for transferring data signals stored in predetermined ones of said upper level addressable locations to predetermined ones of said lower level addressable storage locations, the improved method including the steps of:

monitoring data signal transfers from said upper level to said level for detecting errors in said upper level occurring during such a transfer;

indicating an error condition in said upper level detected during such a data signal transfer;

stopping the transfer of data signals;

signifying said predetermined addressable storage locations of said upper level as being unavailable for data storage operations requested by apparatus external to said storage apparatus; and transferring data signals with any errors from said predetermined addressable storage locations to said predetermined addressable storage locations of said lower level.

7. A data storage apparatus having an upper storage level consisting of a plurality of independent storage units, each of said independent storage units having a removable storage medium affixed thereon, each said storage medium capable of being operated upon by any of said independent storage units, control means for accessing addressable portions of each said record media including addressing said units in accordance with address indicia associatable with said record media, a lower storage level having a plurality of addressable locations for containing data signals wherein a given addressable portion of said upper storage level is selectively associatable with a corresponding given portion of said lower storage level, a programmable control means operatively connected to both said storage levels for controlling and operating same including assigning relationships between addressable portions in said second level with addressable portions in said first level, external connection means for connecting the storage apparatus to a plurality of hosts including a primary host and for exchanging data signals with said host independent of each and every other host, means in said storage apparatus for exchanging signals between said levels under control of said programmable means, means in said programmable means for receiving address indicia from each of said hosts in an independent manner and translating said independently received addresses to physical addresses of said second storage level, said physical addresses being defined as RP, the improvement including the method having the steps of:

monitoring data signal transfers from said upper storage level to said lower storage level for detecting errors in said upper storage level occurring during such a transfer;

memorizing a detected error;

stopping the transfer of data signals and supplying status signals to said primary host indicating that such internal transfer of data signals has been stopped;

checking for a previously memorized error signal associatable with a transfer of signals from a given one of said portions of said upper storage level to a corresponding given portion in said lower storage level;

upon detecting coincidence of previously memorized error signal, signifying same to said primary host, making said given portion of said upper storage level inaccessible for data operations to any of said hosts and then moving data signals irrespective of error conditions from said given one portion of said upper storage level to the corresponding given portion of said second storage level;

upon detecting no previous memorized error condition, interchanging a given one of said record media having said given one portion with a second one of said record media; and reinitiating movement of data signals from said given one portion of said upper storage level and monitoring such transfer for an error, if no error is detected, erasing said memorized error signal.

8. A data storage apparatus having a lower storage level with a multiplicity of addressable storage locations, an upper storage level with a plurality of addressable storage locations, data signal moving means for selectively exchanging data signals between respective given addressed portions of said storage levels, control means maintaining signal records of where data signals are stored in said storage levels including said given portions, the improvement including in combination;

means monitoring operation of said upper storage level and capable of indicating errors in said given portion of said second level;

means for counting said errors; indicator means responsive to said counting means for indicating data signals in said given portion of said lower level as containing data errors;

means responsive to said counting means to supply a first indication that less than a given number of errors have been counted;

vary-off means responsive to said first indication to indicate that a manual storage apparatus reconfiguration is to be effected;

reinitiate means responsive to a storage apparatus reconfiguration indicated by said vary-off means to reinitiate said moving means;

error control means responsive to said reinitiate means and said monitoring means indicating no errors to erase said error count;

means responsive to said reinitiate means and said monitoring means indicating an error to advance said counting means;

threshold means responsive to said counting means reaching said given number to actuate said indicating means; and destage with error means responsive to said threshold means to actuate said data signal moving means to move data signals with errors to said given portion of said lower storage level.

9. Data storage apparatus set forth in claim 8 further including in combination;

demark means responsive to said threshold means to indicate said given portion of said upper storage level as not available for data signal storage while maintaining storage of said data signals in error therein.

10. Data storage apparatus set forth in claim 9 further including data director means for connecting said upper storage level to a plurality of host units for exchanging data signals therebetween based solely on an address field unique to each host;

table means for converting said host address space to real address space of said second level; and means in said monitoring means for erasing said table means with respect to said given portion of said upper storage level for making data signals therein unavailable to any of said host units.

11. A program-controlled data storage apparatus having a first lower storage level having a multiplicity of addressable first storage locations, a given plurality of said first storage locations addressable as a unit to constitute a given portion of said first level, a second upper storage level having a plurality of greater than said given plurality of second addressable storage locations, said given plurality of said second addressable storage locations programmable control;

means having a program memory portion and memory means containing recorded control signals indicating data signals in said given portions are associatable;

computer means in said programmable control means responsive to signals therefrom to perform predetermined functions;

signal transfer means for exchanging signals between said levels and responsive to said recorded control signals via a computer program in said programmable control means to exchange signals between said given portions;

bistable means indicating that said signal exchange between said given portions is signal transfer to said first and given portion from said second level given portion;

the improvement including the combination:

error means in said second storage level to detect errors therein including errors relatable to said given portions of said second storage level;

a destage with error program stored in said program memory portion signifying to said computer to execute predetermined functions whenever an upper level error is detected, said computer being responsive to said destage with error program to:

a. upon detecting an error, saving the address of said given portion of said second upper level with an indication that such error occurred during movement of data signals from said second level to said first level (FIG. 6);

b. sending status signals to said primary host indicating errors and error locations only to said primary host and adjusting storage apparatus operation to prevent host access to said given portion of said second level (FIG. 7);

c. detecting whether or not detected error being processed is the first or second occurrence, if first occurrence, effecting a reconfiguration by moving one of said volumes having said given portion in error to another location within said second upper storage level, and if a second occurrence, initiating a data movement from said second storage level to said first storage level (FIG. 8);

d. upon completion of said reconfiguration, initiating a destage with error sending status signals thereof said primary host and making said given portion of said second storage level inaccessible to said hosts (FIGS. 8 and 9); and e. initiating moving said data signals from said given portion of said second storage level to said first storage level with said errors.

* * * * *